(12) United States Patent
Saebi

(10) Patent No.: US 6,721,684 B1
(45) Date of Patent: Apr. 13, 2004

(54) METHOD OF MANUFACTURING AND ANALYZING A COMPOSITE BUILDING

(76) Inventor: Nasser Saebi, 18231 N. 66th La., Glendale, AZ (US) 85308

( * ) Notice: Subject to any disclaimer, the term of this patent is extended or adjusted under 35 U.S.C. 154(b) by 60 days.

(21) Appl. No.: 10/132,915

(22) Filed: Apr. 26, 2002

Related U.S. Application Data

(60) Provisional application No. 60/340,974, filed on Nov. 29, 2001, and provisional application No. 60/287,240, filed on Apr. 26, 2001.

(51) Int. Cl.[7] ............................................... G06F 11/30
(52) U.S. Cl. ............................................... 702/183; 703/7
(58) Field of Search ........................ 52/741.1; 702/183; 703/2, 6, 7

(56) References Cited

U.S. PATENT DOCUMENTS

| | | | | |
|---|---|---|---|---|
| 4,532,745 A | * | 8/1985 | Kinard | 52/251 |
| 5,419,200 A | * | 5/1995 | Burns et al. | 73/760 |
| 5,921,046 A | * | 7/1999 | Hammond, Jr. | 52/564 |
| 5,956,500 A | * | 9/1999 | Shimmell | 703/7 |
| 6,205,728 B1 | * | 3/2001 | Sutelan | 52/309.7 |
| 6,305,142 B1 | * | 10/2001 | Brisson et al. | 52/742.14 |

OTHER PUBLICATIONS

Fathi–Torbaghan, M; Kern, H; Janczak, J; "AI in Material Design—An Expert System for Construction of Composite Material"; 10th Annual International Phoenix Conference on Computers and Communications Proceedings; Mar. 27–30, 1991; pp 828–834.*

* cited by examiner

*Primary Examiner*—John Barlow
*Assistant Examiner*—Douglas N Washburn
(74) *Attorney, Agent, or Firm*—Albert W. Davis, Jr.

(57) ABSTRACT

A method of constructing a building comprises the use of plastic foam pieces to form the building shape. The inner and outer surfaces of the foam are coated with glass fiber reinforced concrete to form a composite building. The invention discloses how to perform a finite element analysis using a computer on the composite building. Such an analysis allows this non-traditional building to be analyzed and permitted for construction by local building authorities.

4 Claims, 98 Drawing Sheets

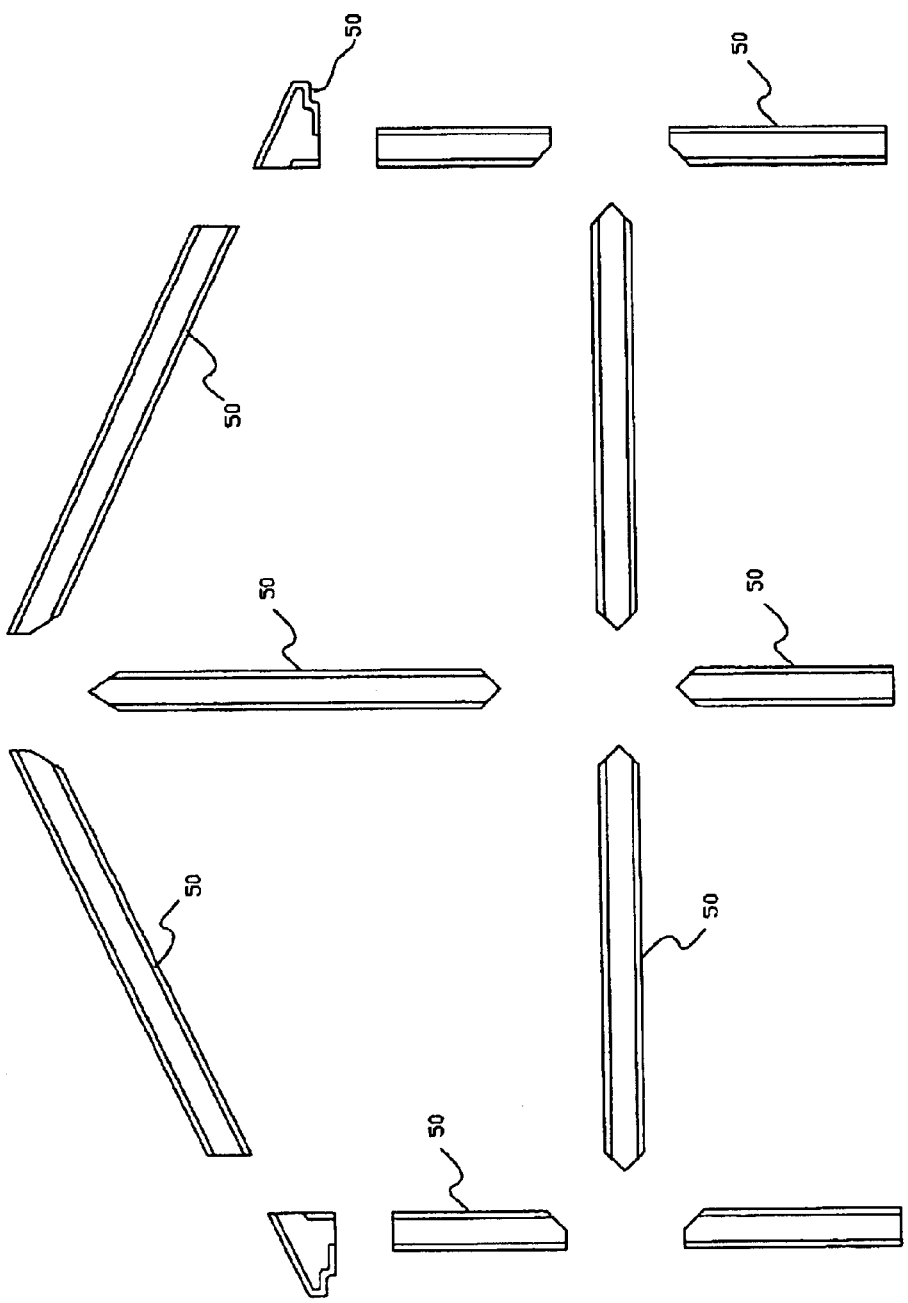

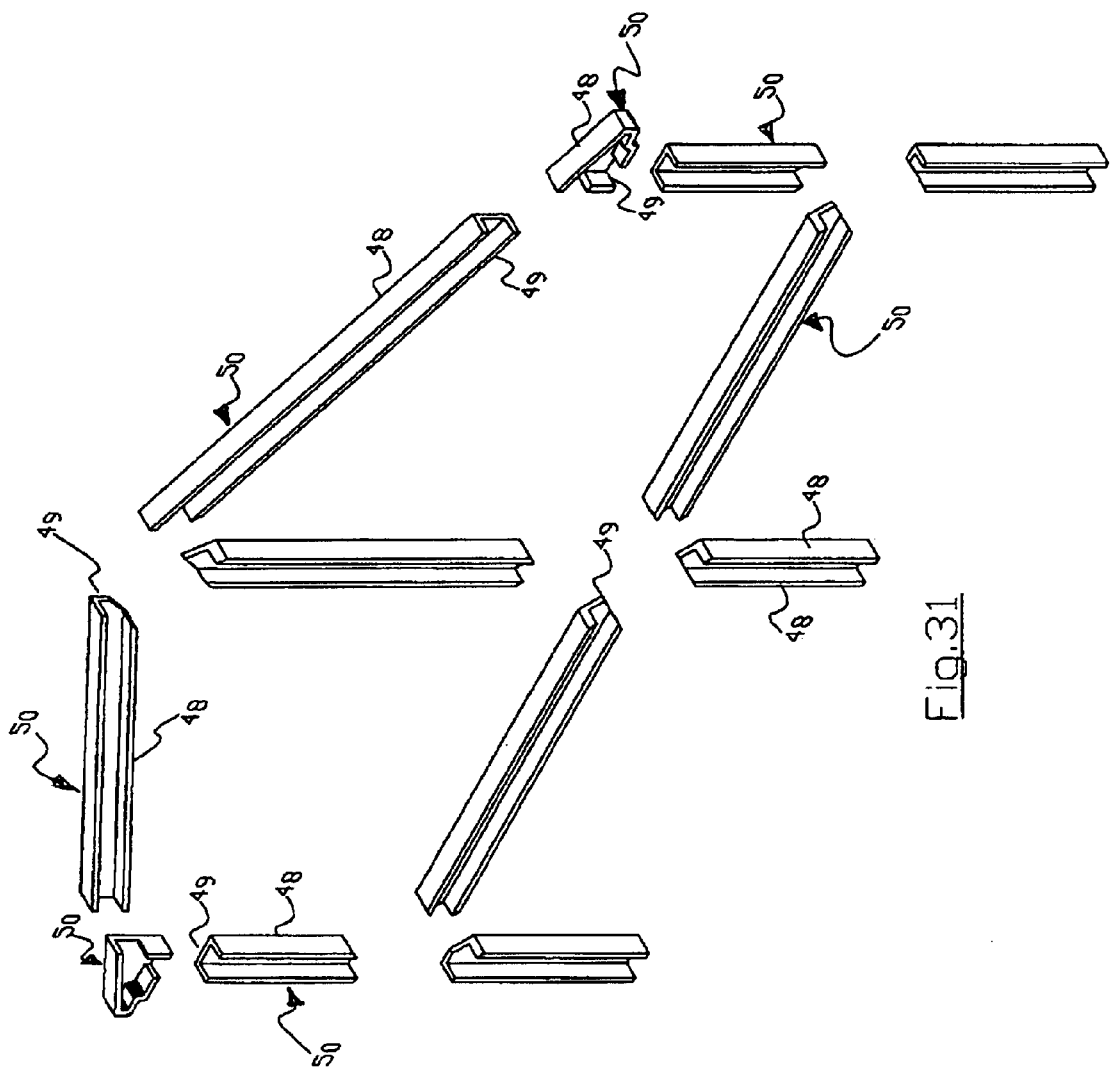

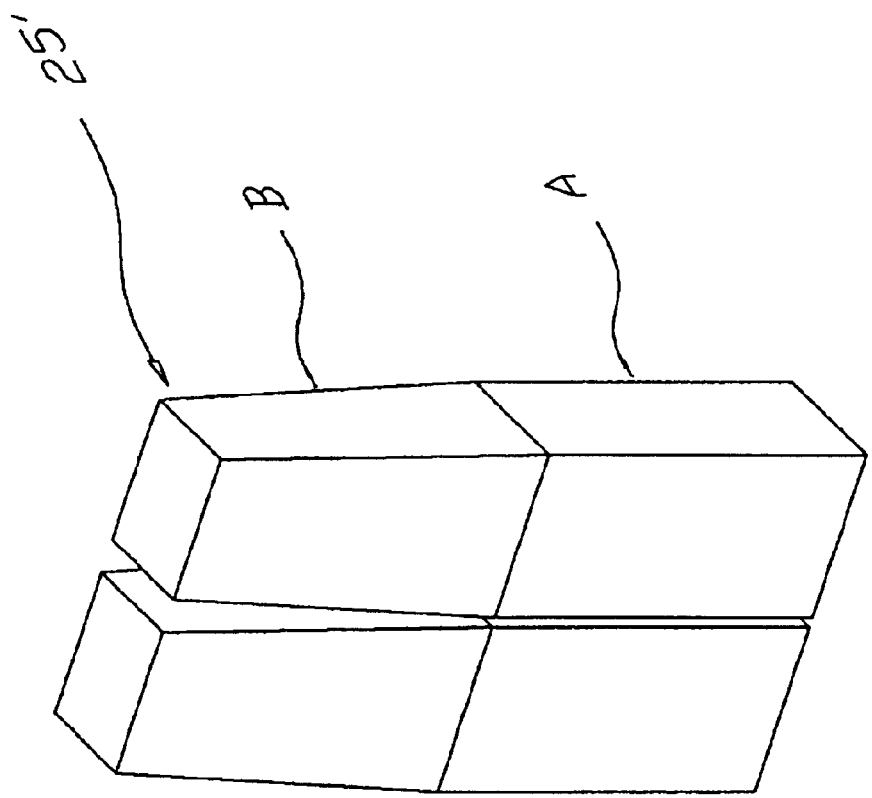

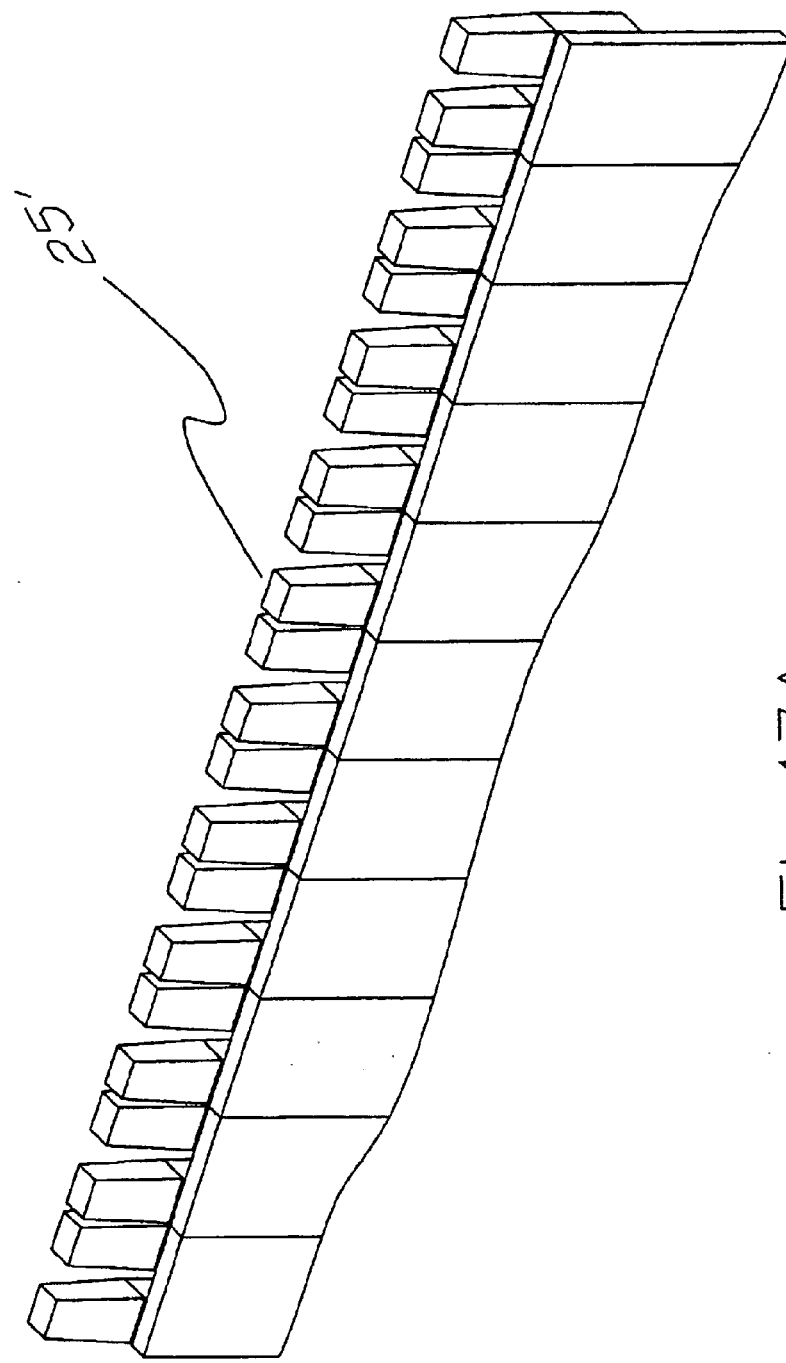

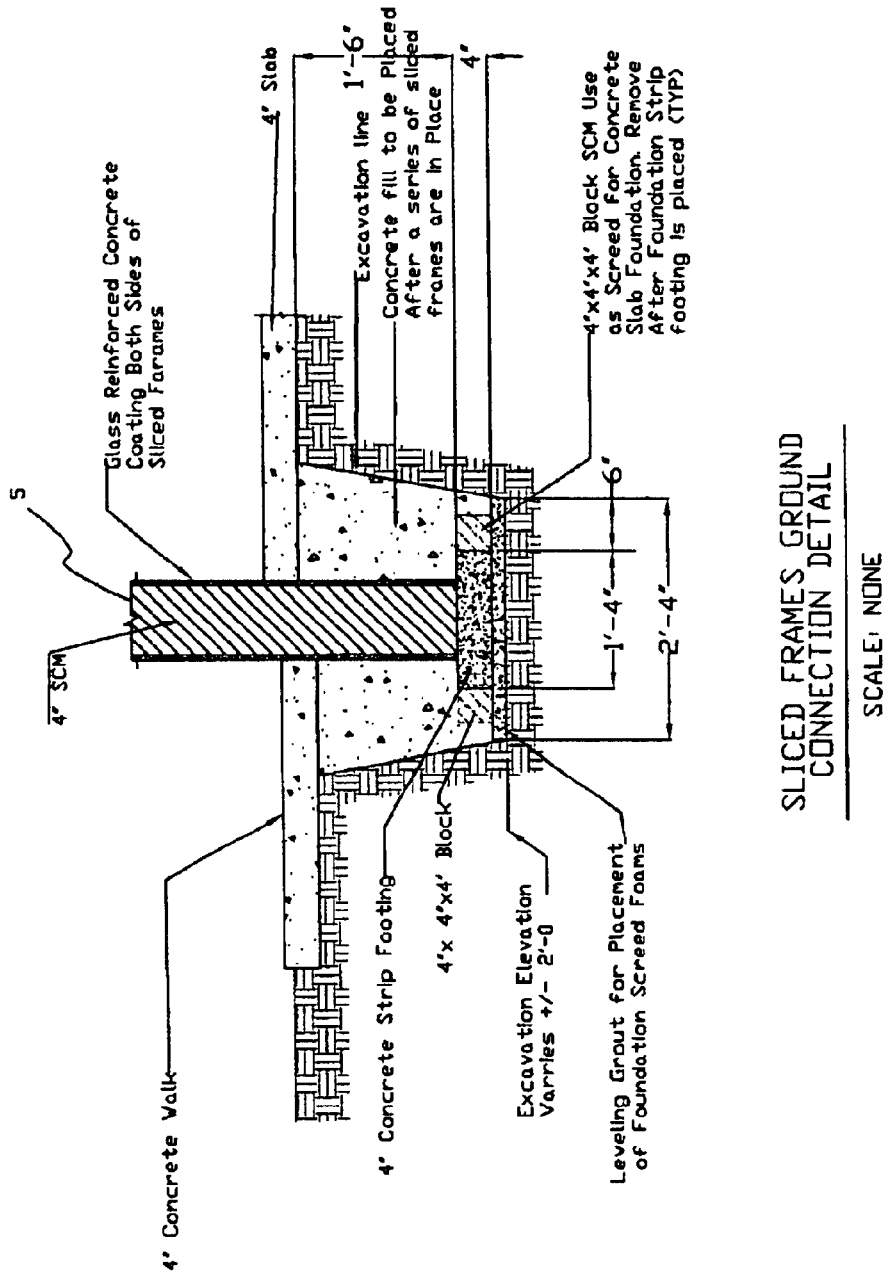
Fig. 48 — SLICED FRAMES GROUND CONNECTION DETAIL
SCALE: NONE

Nodal Forces
Wind and Snow, (lbs/node)

| Load Area | Area, In2 | # of Nodes | F/Node | Window | Window Nodes | F/Nodes | Case |
|---|---|---|---|---|---|---|---|
| West wall | 78,630 | 2019 | 6.76 | 955.08 | 20 | 8.29 | 2 & 4 |
| Enterance Left | 3,802 | 92 | 7.17 | | | | |
| Garge Lower | 36,314 | 738 | 8.54 | 672 | 16 | 7.29 | 2 & 4 |
| Garage Roof | 12,351 | 979 | 2.19 | | | | 2 & 4 |
| Snow Garage Roof | 81,846 | 1903 | 8.96 | | | | 3 |
| Snow Garage Roof | 81,846 | 1903 | 6.72 | | | | 4 |
| Snow Main Roof | 235,000 | 5275 | 9.28 | | | | 3 |
| Snow Main Roof | 235,000 | 5275 | 6.96 | | | | 4 |
| Single LL | | | 300 | | | | 6 |

Fig.94

METHOD OF MANUFACTURING AND ANALYZING A COMPOSITE BUILDING

This application is related to U.S. patent regular applications Ser. No. 09/563,142 filed May 2, 2000 now U.S. Pat. No. 6,308,490 granted Oct. 30, 2001 and Ser. No. 09/563,241 filed May 1, 2000 and is a continuation—in—part of provisional applications Ser. Nos. 60/287,240 filed Apr. 26, 2001 and 60/340,974 filed Nov. 29, 2001.

In as far as possible, the disclosures of these applications are incorporated by reference in this application.

BACKGROUND OF THE INVENTION

The idea of a building formed of a composite of foam coated with concrete or cement started over fifty years ago. The fact that such buildings are not in wide use is not because they are inferior structures to houses built from wood. Their scarcity is due to the fact that any new way of manufacturing buildings confronts the problem of proving to the various government organizations that such a house or building can meet the code requirements. This proof is not easily or inexpensively done. Further, each different design of house would be required to have a similar proof to be acceptable.

Many of the designs for foam-concrete composite buildings have not been cost effective. Other designs have not been able to span very large distances thereby severely limiting the size of their rooms.

These problems and others have been caused by the inability of the designers to analyze the strength of the composite buildings. Most conventional buildings, which have three components (structural framing, interior sheathing and exterior sheathing), fit into a simple mathematical format and can be analyzed by classical mathematical methods. Buildings using composite construction materials are complex to analyze and can not be solved classically.

BRIEF SUMMARY OF THE INVENTION

The invention discloses how to analyze a building manufactured from a foam-concrete composite.

The invention also discloses structural designs discovered by the analysis to be of great strength and low mass.

Since the strength of these buildings can now be analyzed, the following objects can now be provided:

It is an object of the invention to provide low cost housing with an acceptable appearance.

It is an object to provide a method of manufacture requiring less skill in the work force.

It is another object of the invention to produce houses that use easily assembled materials.

It is an object of the invention to provide a building that has a high insulation value to lower the energy consumption of the house.

It is a further object to provide a building that is better able to withstand the forces of an earthquake, and other forces of nature at an affordable price.

It is another object of the invention to provide a method of proving the strength of a composite structure to the government organizations requiring approval.

BRIEF DESCRIPTION OF THE DRAWINGS

FIG. 30 is an exploded frontal view of the pieces which make another embodiment of a two story slice.

FIG. 31 is a perspective view of FIG. 30.

FIGS. 47 and 47A are perspective views of a modified dowel.

FIG. 48 is a cross-sectional view of a portion of a slice positioned on a footing.

Figure 57:
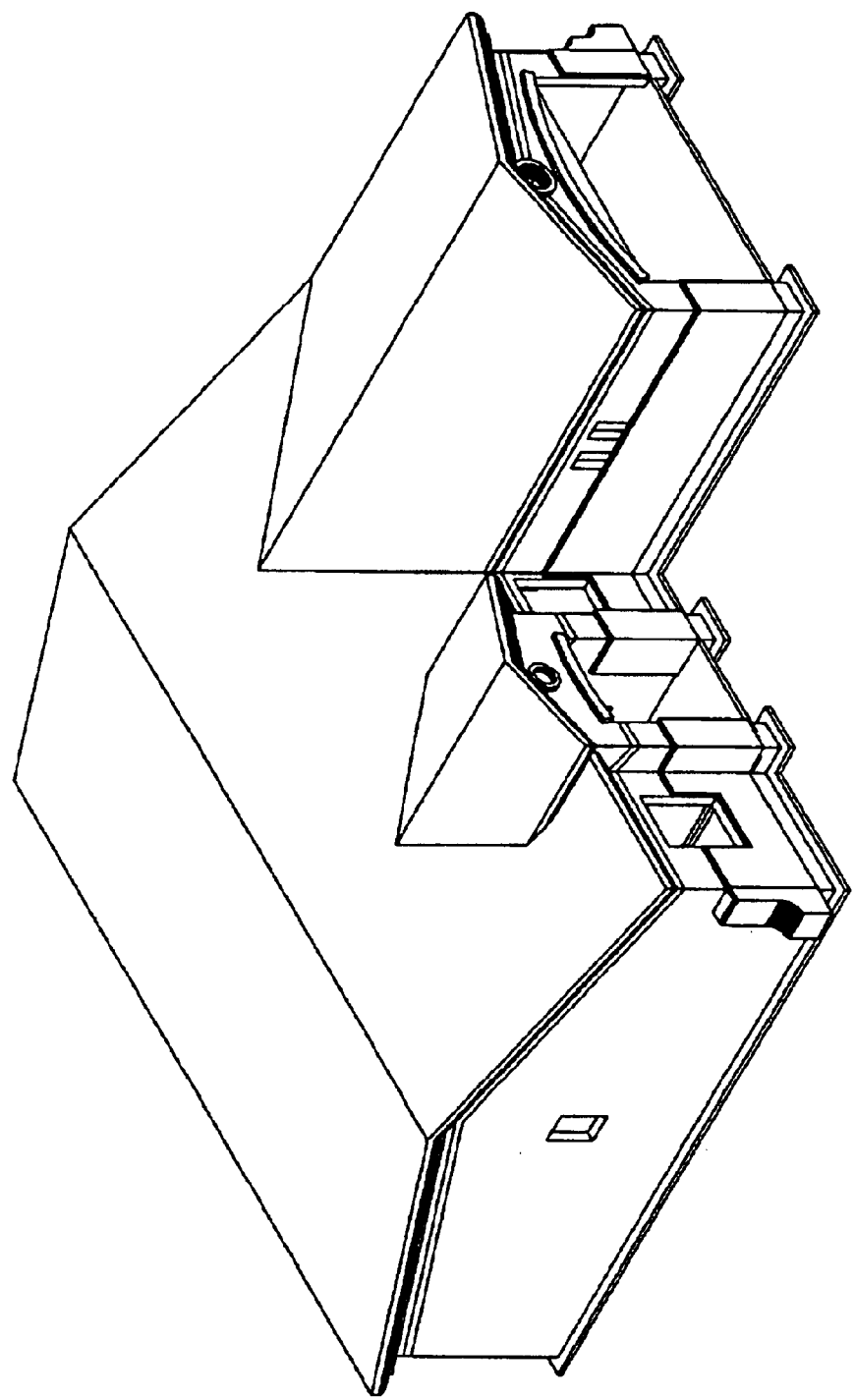
FIG. 57 is a perspective view of another embodiment of an EPS composite one story building (after GFRC coating).

Table of FIG. 94 shows the Nodal forces calculated by hand and applied to the FEA model of the building of FIG. 57 for structural analysis.

Figure 95:
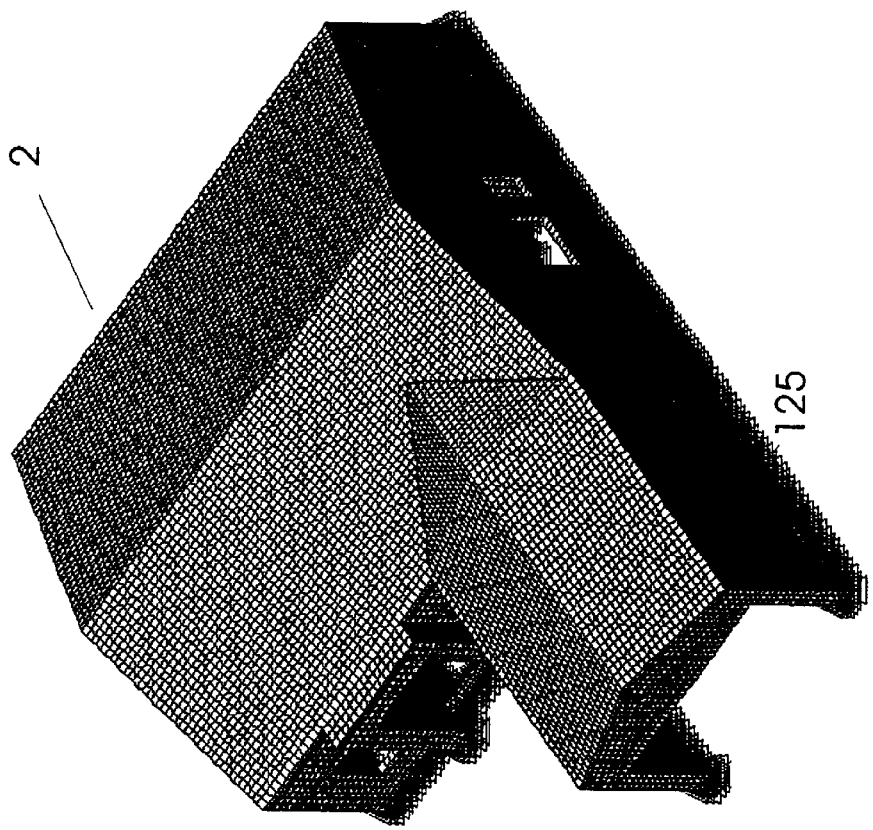

FIG. 95 shows the base constrains of the building at Ground level to top of the foundation footing for the building of FIG. 57.

Figure 96:
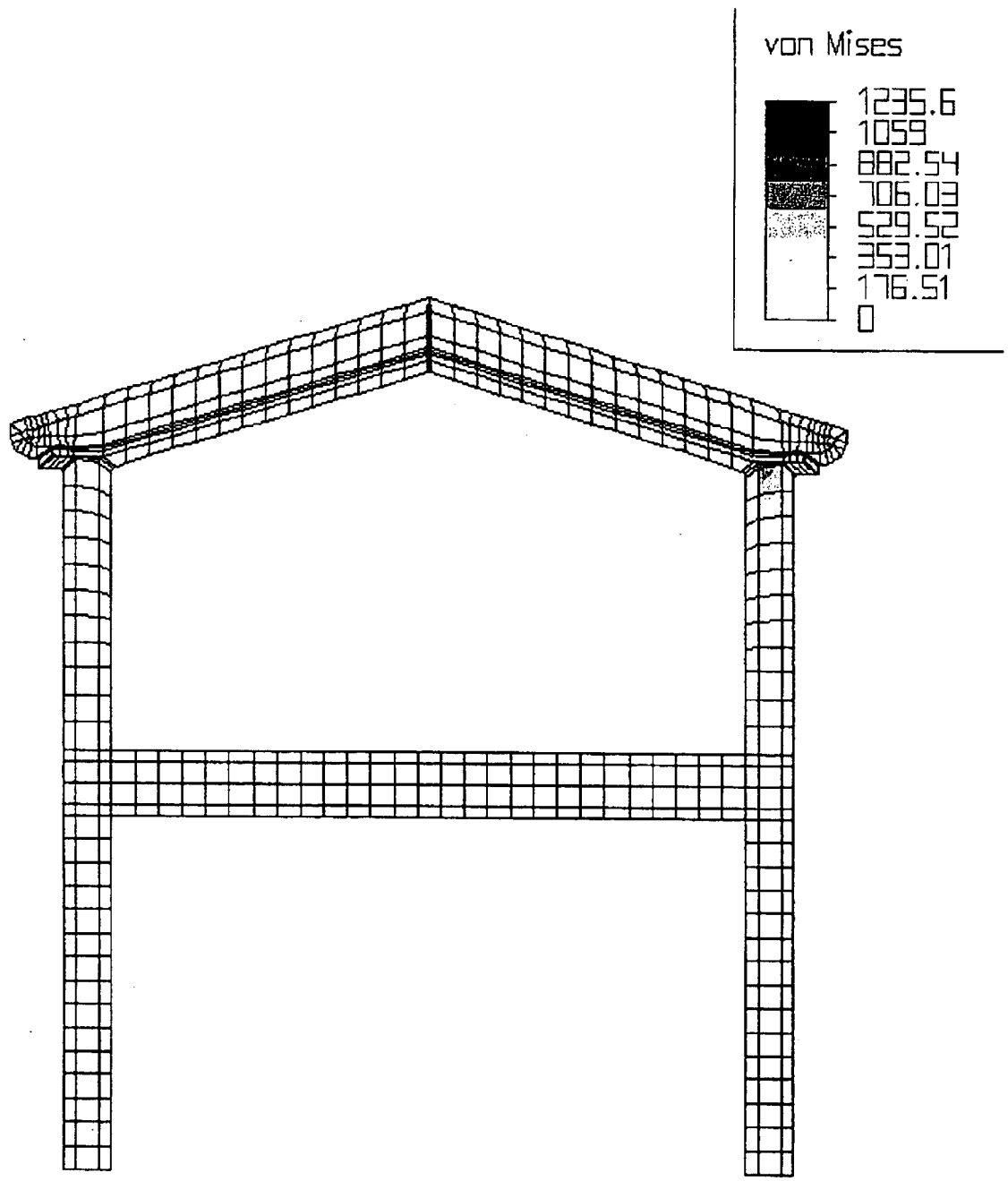

FIG. 96 shows the results of stress analysis for combination of Gravity Dead Load, 100 mph wind Load and snow with intensity of 30 psf on the embodiment of a 24 inch slice frame cut from a typical two story composite building.

Figure 97:
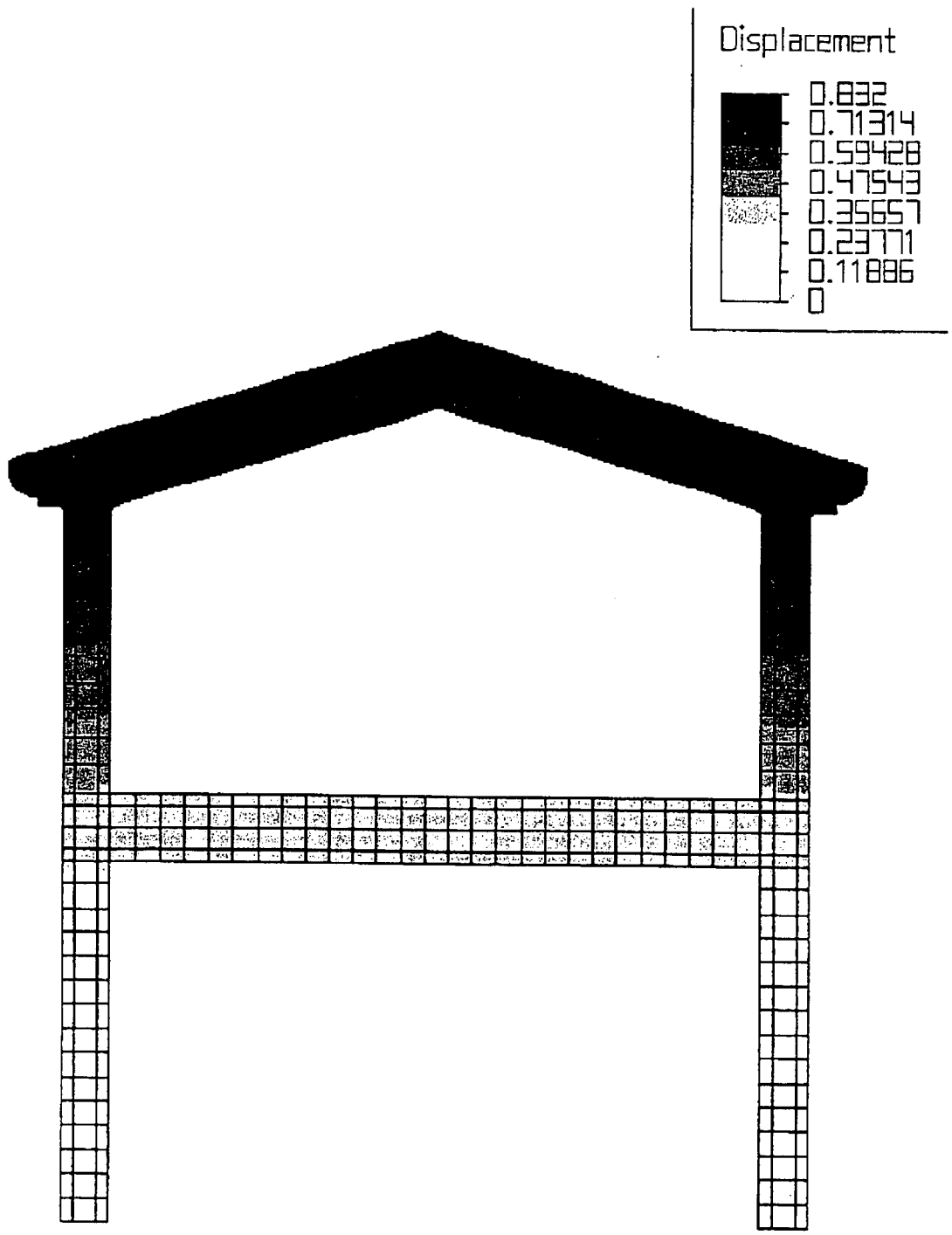

FIG. 97 shows the results of Displacement analysis for combination of Gravity Dead Load, 100 mph wind Load and snow with intensity of 30 psf on the embodiment of a 24 inch slice frame cut from a typical two story composite building.

DETAILED DESCRIPTION OF THE INVENTION

The manufacture or construction of the inventive building starts with the creation of a 3-Dimensional; "solid" model of the building in a computer assisted drafting (CAD) program in a computer. Suitable CAD programs are AutoCAD™, ProE™, Solid Works™, Inventor™, etc. The building is then sliced in parallel, usually vertical planes. These planes can correspond to various thicknesses of the slices, preferably of a size to be manhandled.

These slices of the building are then created by using foam, such as, expanded polystyrene (EPS). The foam elements that make up a slice can be cut from commercially available sizes of foam, such as slabs of 1 to 36 inches thick and 4 feet×8 feet or 4 feet×8 feet. The cutting can be performed by hand, machine or computer assisted manufacturing (CAM) program and a computer driven machine. The foam can be cut by hot wire or other suitable cutting process. The slice can be made by cutting elements which are then glued or otherwise joined together to form the slice.

The slices are then joined by adhesive to other slices to form the foam core of the building walls. It may be necessary to spray/coat at least a portion of the slice with a material that will increase the strength of the slice to allow the slice to be moved without breaking. In this case, some or all of the non-abutting surfaces of the sides of the slice can be coated with a strengthening coat, such as glass fiber reinforced concrete (GFRC). Surfaces such as those indicated by C can be coated to strengthen the pieces forming the slice.

When multiple slices are joined, they become heavy. Therefore, it may be desirable to place the slice or slices in their final position on concrete footings before they become too heavy to move easily. The footing can be a standard footing. The foam pieces are adhered to the footing by using a layer of concrete to join the foam to the footing while also leveling the foam. The walls of the home are assembled by gluing cut foam pieces together.

The slices or sections are coated with adhesive on the abutting sides before being placed into position and joined to the previously positioned slice or section. A suitable adhesive would be either 3M™ FASTBOND™ Contact adhesive 30-NF or 2000-NF. The adhesive can be sprayed, rolled or applied to walls in any other way. The foam building or portions thereof can be sprayed with a coating to increase the stability of the building when desired. That is, after a few slices are in position and joined, a coating of glass fiber reinforced concrete (GFRC) can be added to the exposed surfaces of the joined slices. Alternatively, the coating can be added when the foam structure is fully in place.

The GFRC coating can be sprayed on the foam or applied in other ways. It can be reworked until it sets. A coating of 3/16 inches thickness is usually adequate; however, a coating of varying thickness may be desirable. A suitable range for the coating can be 2/16 to 8/16 inches. More information concerning the GFRC coating and spray equipment can be obtained from the PRECAST/PRESTRESSED CONCRETE INSTITUTE of Chicago, Ill. As an example of the proportions, the coating would be made by mixing 3–5% Cem-FIL™ fibers (glass fibers) from the VEROTEX COMPANY into a 1:1, cement: sand and water matrix and other additives.

Figure 1:
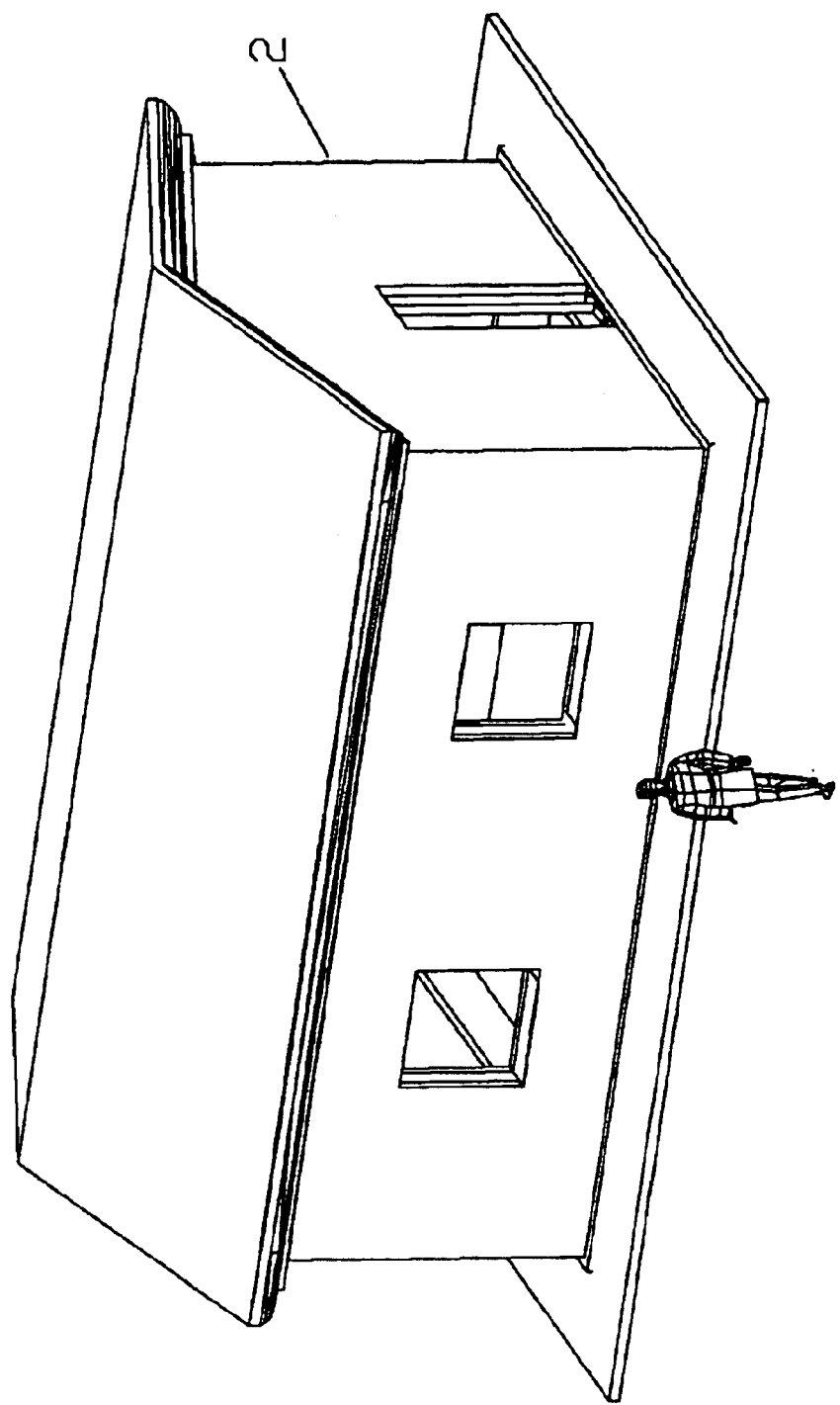
FIG. 1 is a perspective view of one embodiment of the inventive building.

FIG. 1 shows a perspective view of the habitable building 2 of the invention as it would be before windows and doors are installed.

Figure 2:
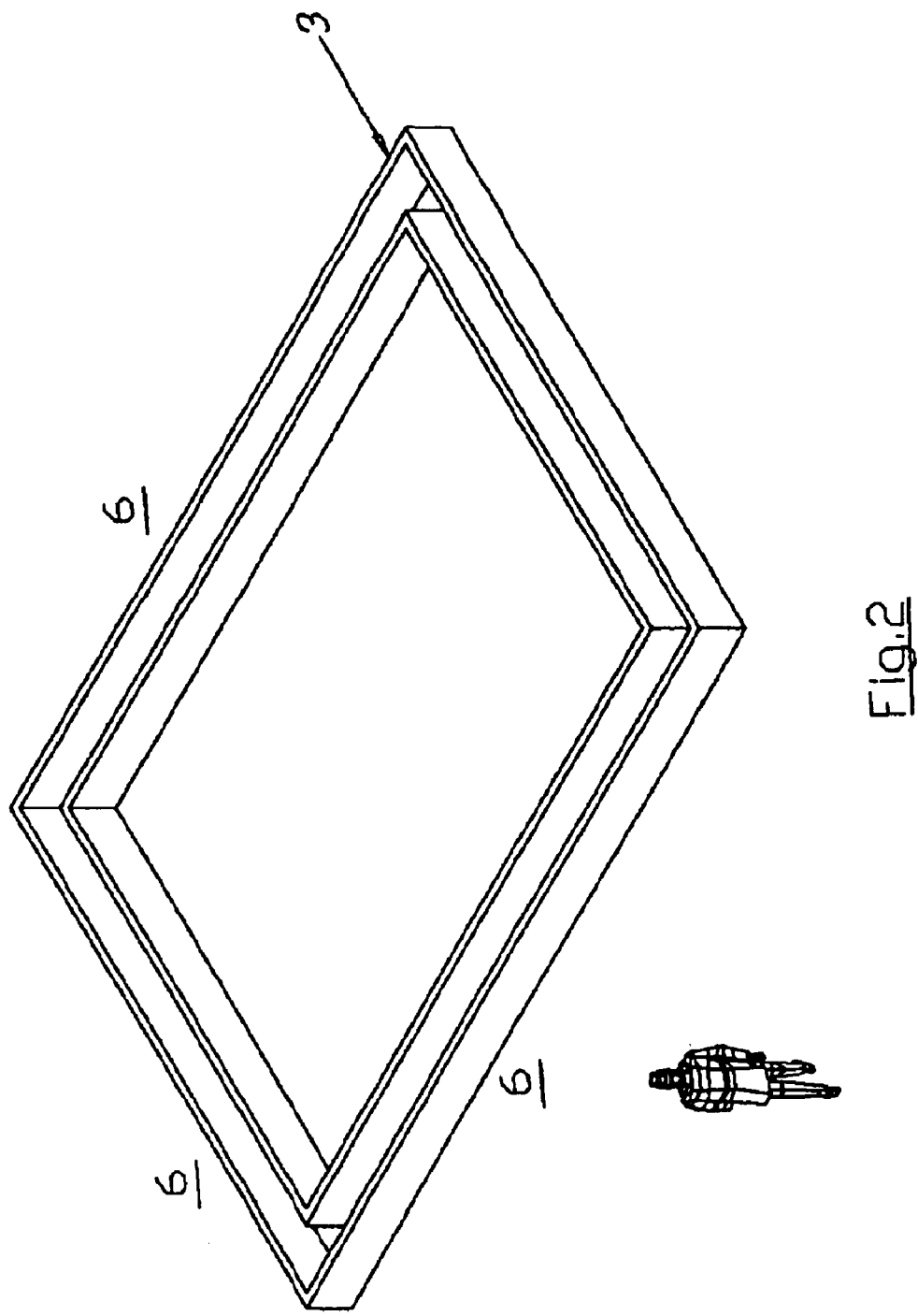
FIG. 2 is a perspective view of the footings.

FIG. 2 shows a perspective view of the concrete foundation or footing 3 for the walls of the building.

Figure 3:
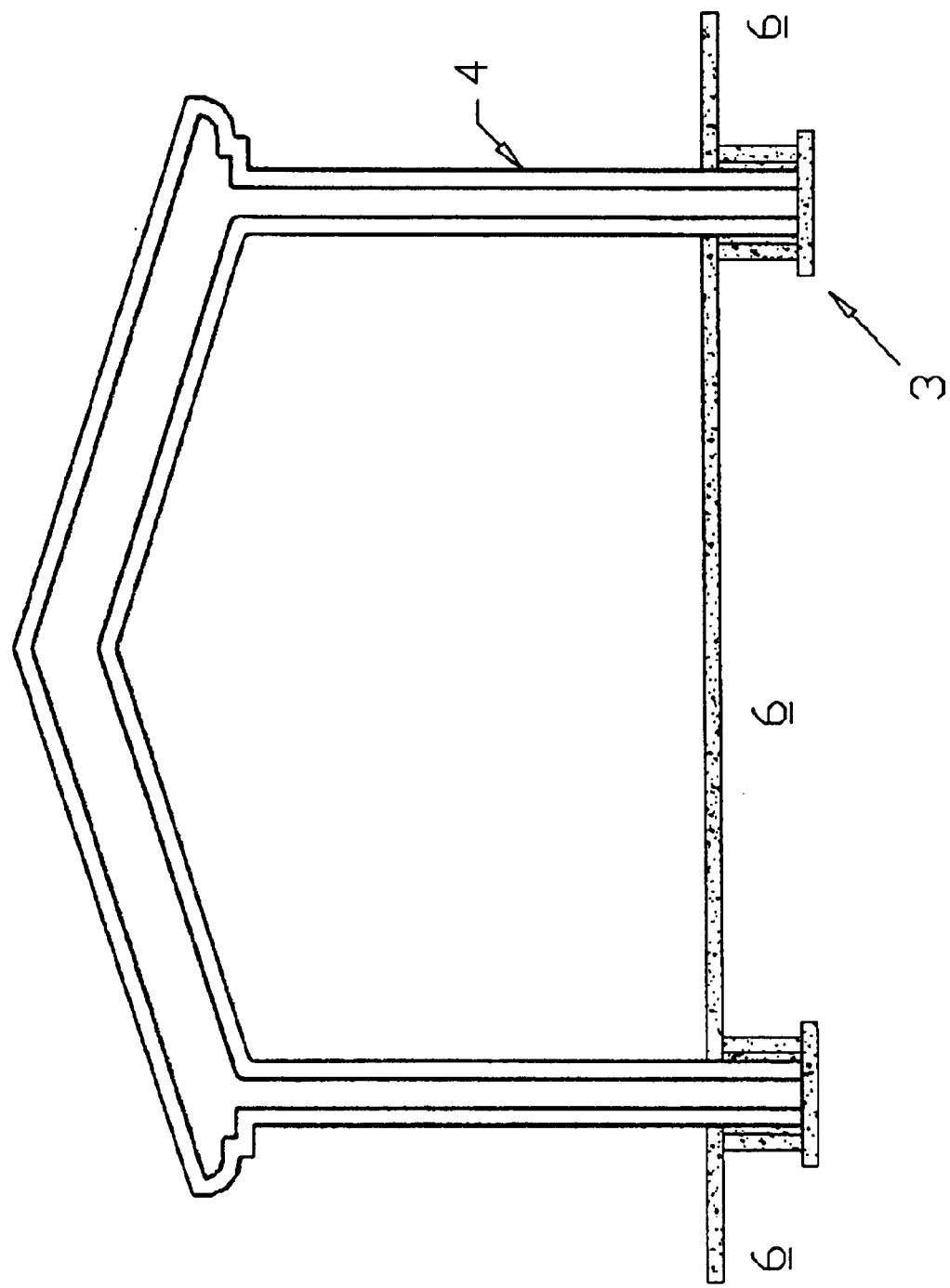
FIG. 3 is a side view of a slice or portion of the building.

FIG. 3 shows a slice 4 of the building positioned on the concrete foundation 3. The slice 4 is made from pieces of foam 5 which are cut from larger foam as described previously. The pieces of foam 5 are shown in FIGS. 4–7. In FIG. 3, the foam pieces 5 have been coated with GFRC (Glass Fiber Reinforced Concrete) 7 after they were joined by adhesives. The slice 4 is coated with GFRC 7 to add strength to the slice. The GFRC coating 7 is a formulation of cement/concrete, glass fibers and other ingredients. Thus, it is also a reinforced cement coating. The slice 4 can be made in a factory and shipped to the building site; it can be made at the site from pieces shipped there; it can be initially coated after being positioned on the foundation, or it can be partially made in a factory and finished at the building site. The footing 3 is created by digging a trench and creating a level concrete surface in the trench. Using forms, sidewalls can be added to the footing. The slice 4 is adhered to the bottom of the footing by using grout or concrete. The grout can help level the slice. Where sidewalls are added to the footing, grout is also added between the footing sidewalls and the slice.

Figure 4:
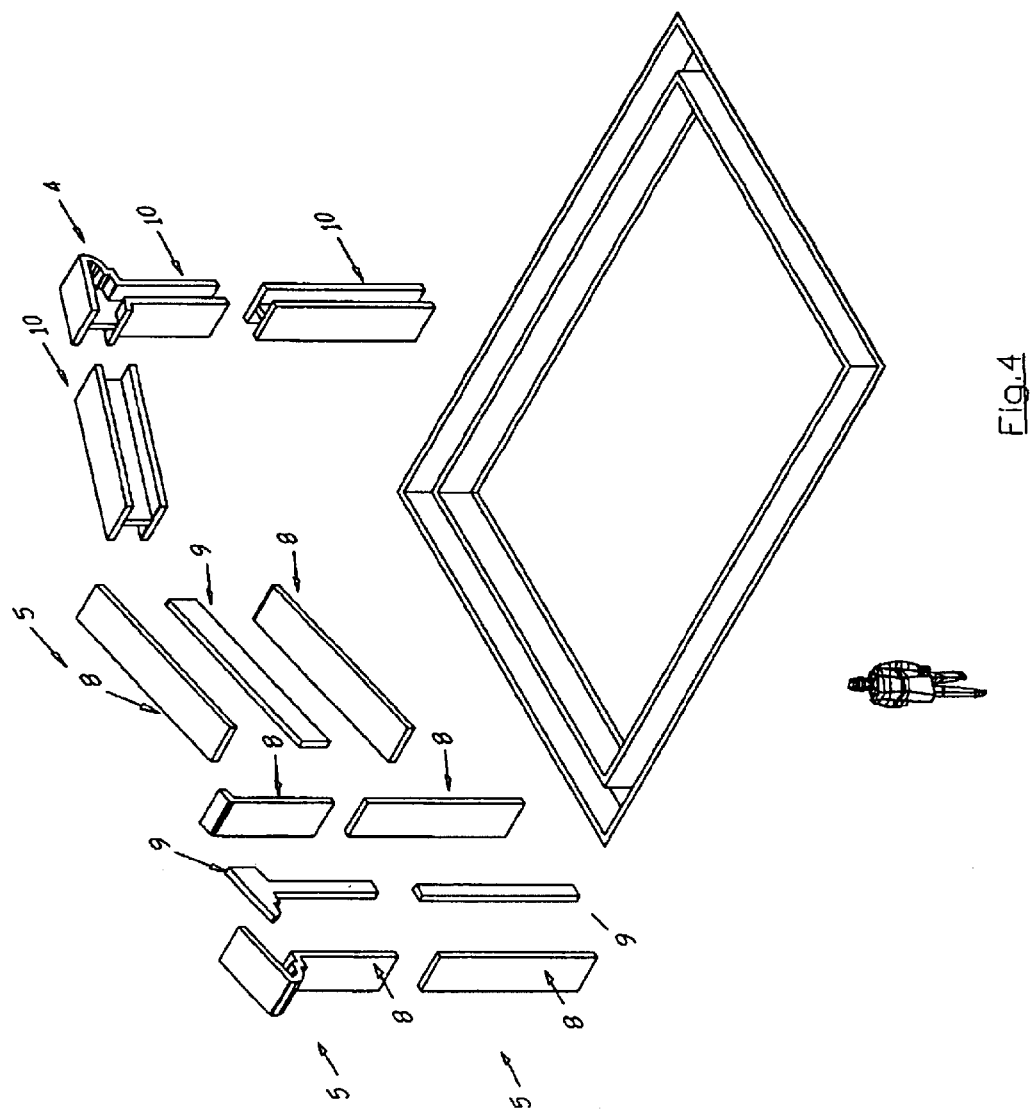
FIG. 4 is an exploded perspective view of the slice of FIG. 3.

FIG. 4 shows the pieces of foam 5 that make up the slice 4 in an exploded arrangement. The slice 4 can be any size in width. A 2-foot width would be acceptable. A thin section makes the weight of the slice more easily handled. The slice 4 is formed as an I-beam 10 in cross-section. The I-beam is formed by flanges 8 and web 9. The figure shows the pieces partially assembled on the right side. The slice 4 is made exceptionally strong by the use of an I-beam configuration. The foam pieces 5 are joined together by the use of adhesives previously disclosed. The I-beam is formed by web 9 and flanges 8.

Figure 5:
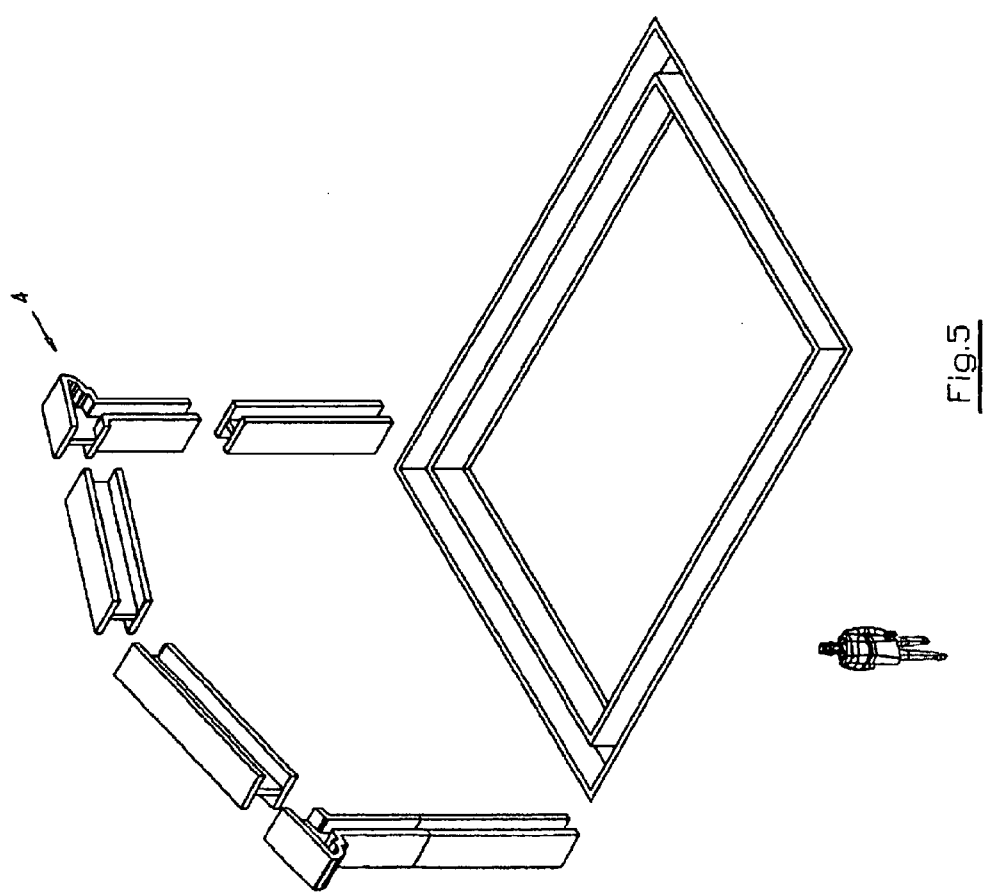
FIGS. 5–7 are sequentially assembled perspective views of the slice of FIG. 4.
Figure 6:
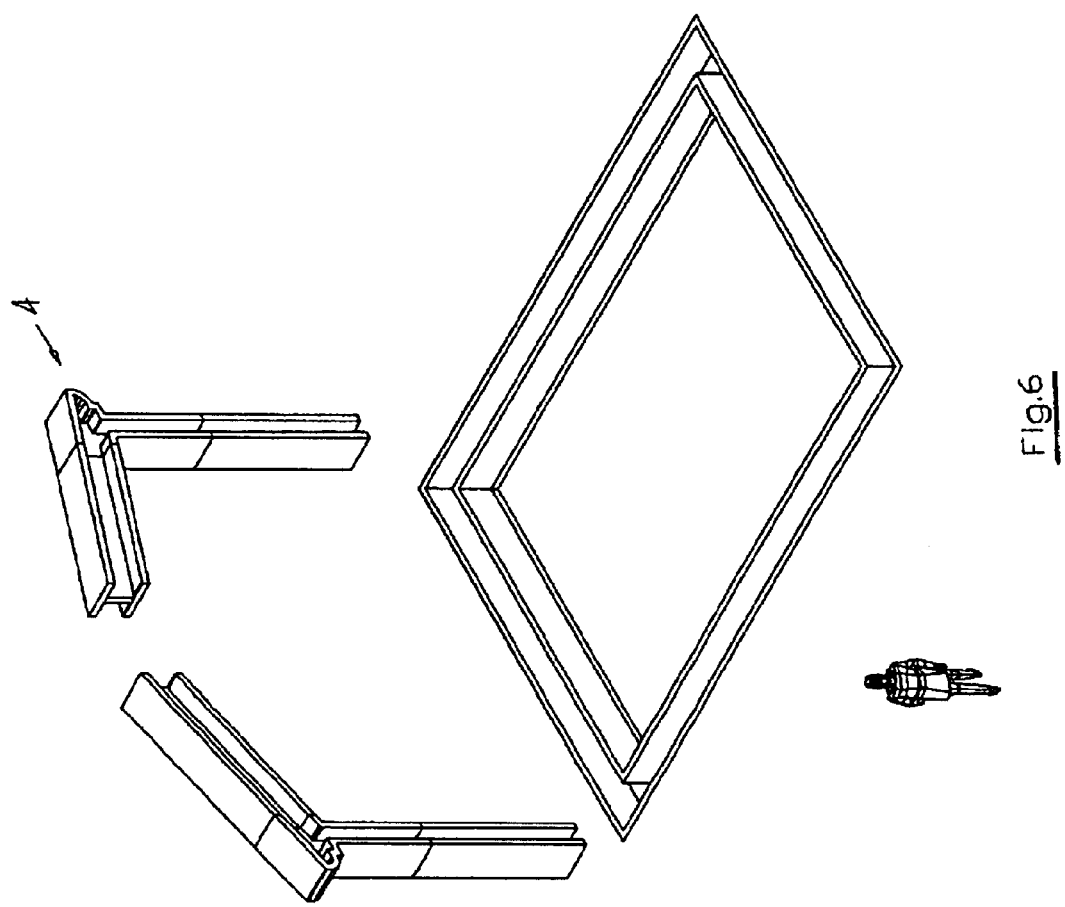
Figure 7:
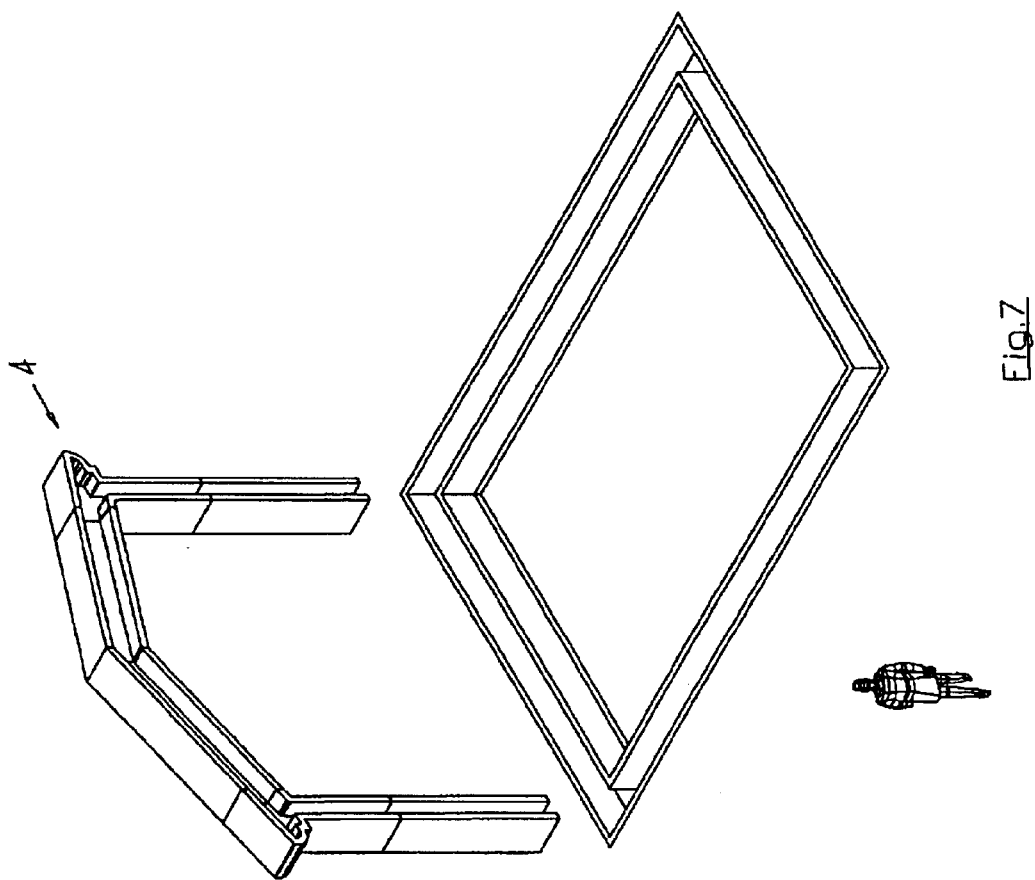

FIGS. 5–7 show the progressive assembly of the slice 4 of FIG. 4.

Figure 8:
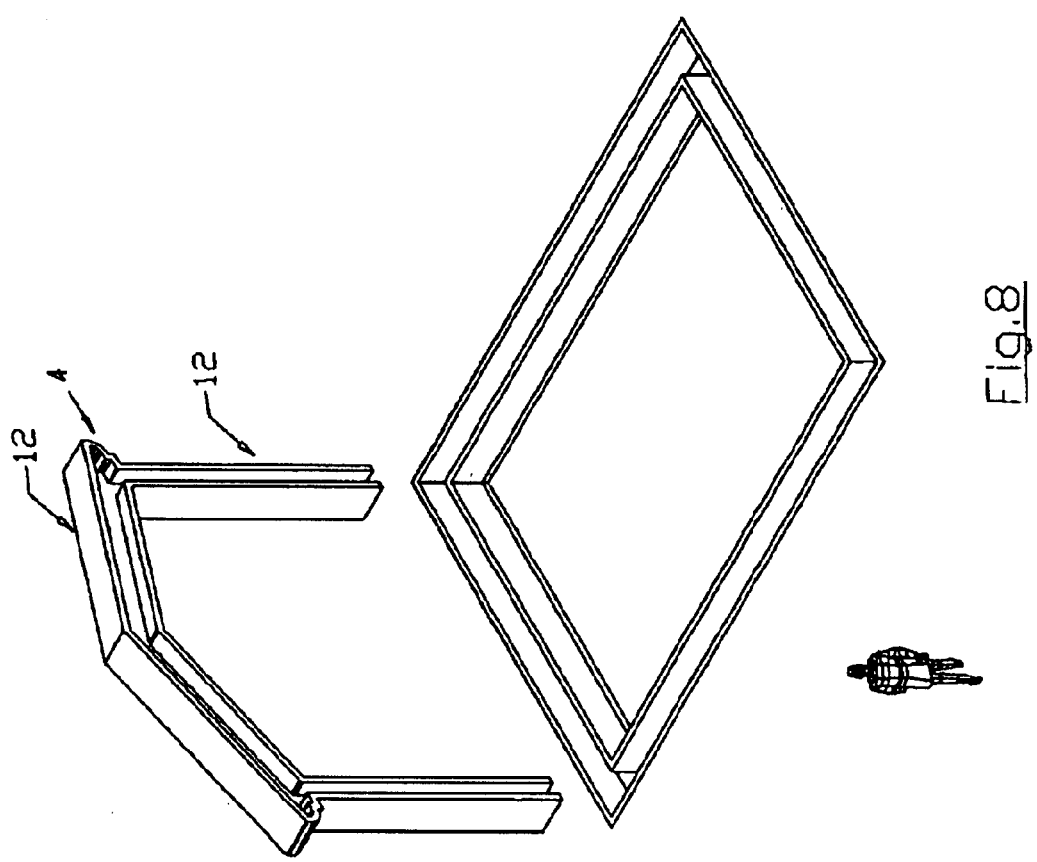
FIG. 8 is a perspective view of the slice coated with GFRC.

FIG. 8 shows the slice 4 fully coated with GFRC except on the surfaces abutting surfaces on the adjacent slice which may receive adhesives. The coated slice is ready to be positioned on the footing. The slice can be joined to the footing by adhesives previously disclosed or by grout/cement. The slice 4 can also be placed on the footings before having any of its surfaces coated.

Figure 9:
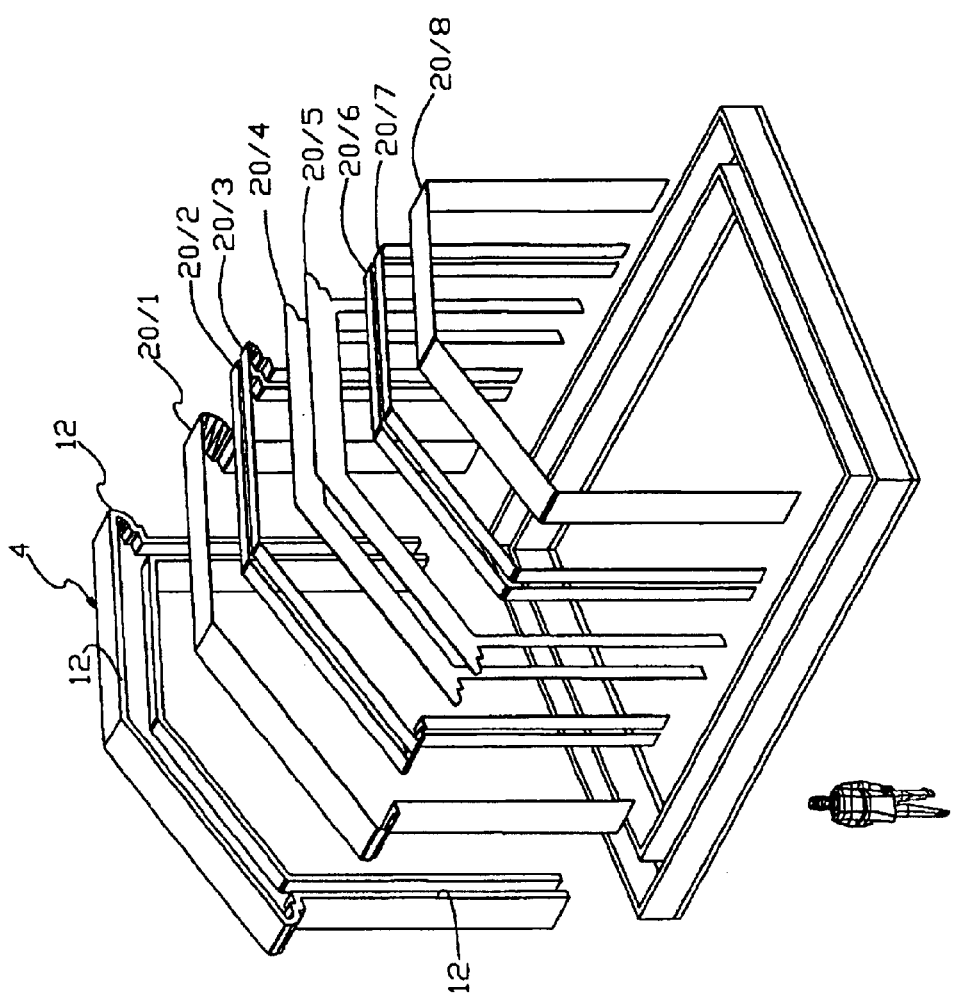
FIG. 9 is an exploded perspective view of the slice and its coating layers.

FIG. 9 shows the GFRC coated slice 4 and the various side coatings 20/1–20/8 removed and exploded to show the surface coatings individually. It is preferred to provide this preliminary coat 20 to all of the surfaces of the slice 4 except for the abutting edges 12 of the adjoining slices. The slice can be coated at a factory or at the building site. Preferable, the slice pieces are formed or cut, then joined and coated in the factory. Not all of the surfaces need to be coated. The preliminary coating is used to make the slice strong enough to withstand the stress experienced during transport to the building site, movement from the truck to the foundation/footing and wind loads prior to adding the final coat.

The side coatings of GFRC 20 of the upper flange are 20/1–20/3, the web coatings are 20/4, 20/5. The coatings of the lower flange are 20/6–20/8.

Any or many of the coatings 20/1–20/8 can be omitted. Preferably, at least one surface is coated. That is only one of the coatings C1–C8 may be needed to provide sufficient strength until the final coating of GFRC. In the proper circumstances, all of the coatings 20 can be omitted until the inner or outer coatings of GFRC.

Figure 10:
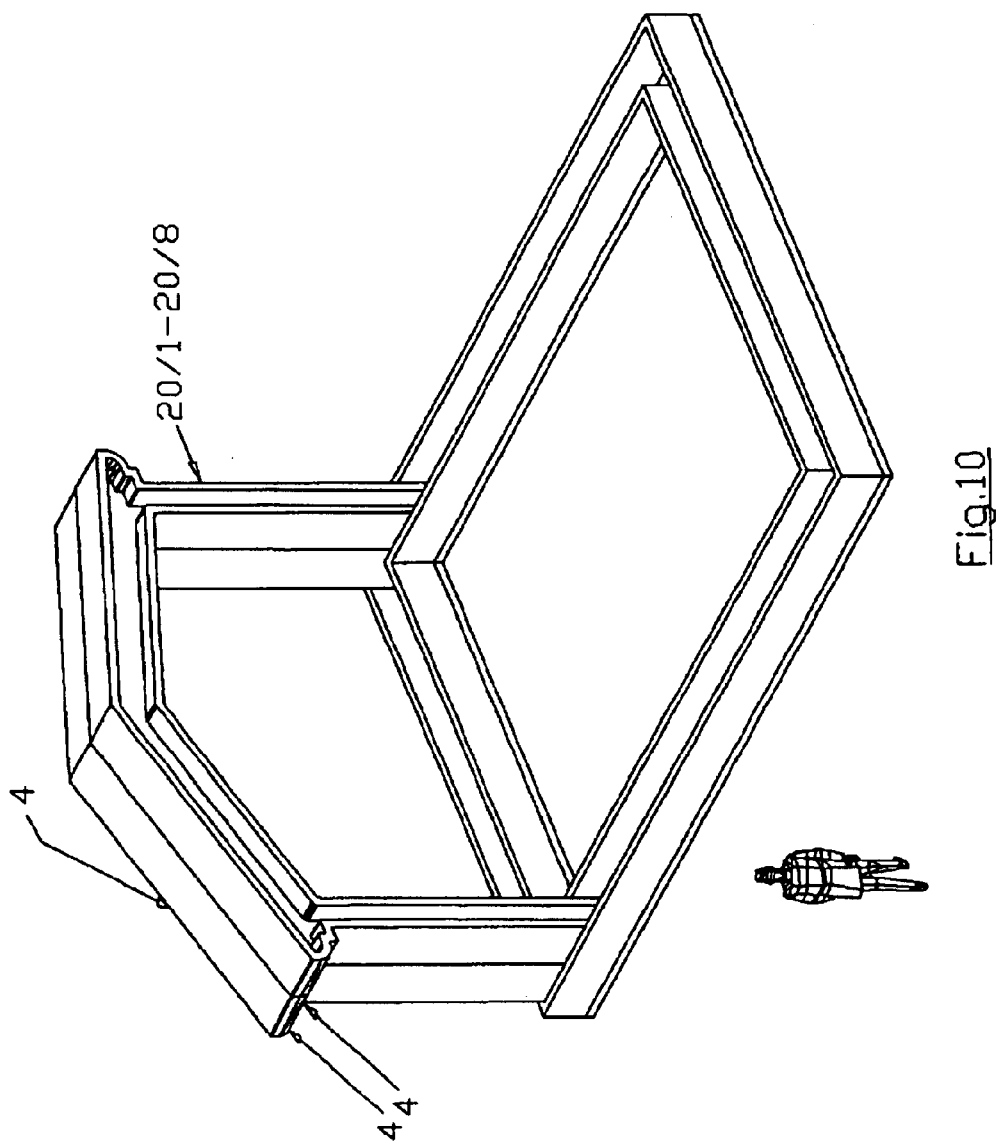
FIG. 10 is a perspective view of the slice and the coatings.

FIG. 10 shows the GFRC coated slice and the various side coatings of the removed and reassembled without the foam core.

Figure 11:
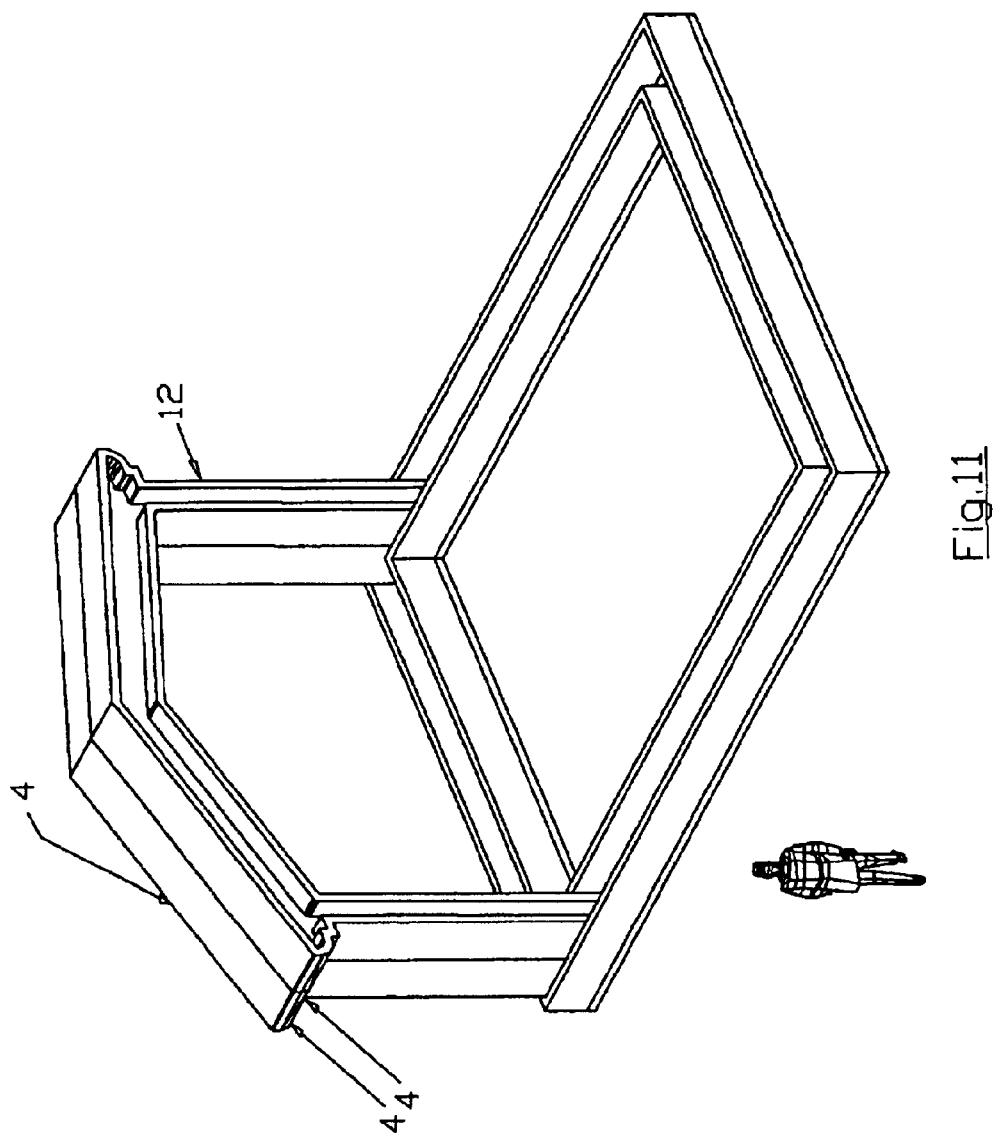
FIG. 11 is a perspective view of three slices joined together.

FIG. 11 shows three slices 4 assembled and positioned on the foundation. Multiple slices can be assembled by gluing at least some surfaces of the side edges 12 together. These abutting side edges 12 are left un-coated with GFRC to help in the adhesion process. However, if they are coated with GFRC, a suitable adhesive could be used.

The slices 4 can be assembled into a group of slices so that the group can be moved as one by cutting a hole through each slice and providing a tensioning member in the aligned holes such as a bolt, washers and a nut.

Figure 12:
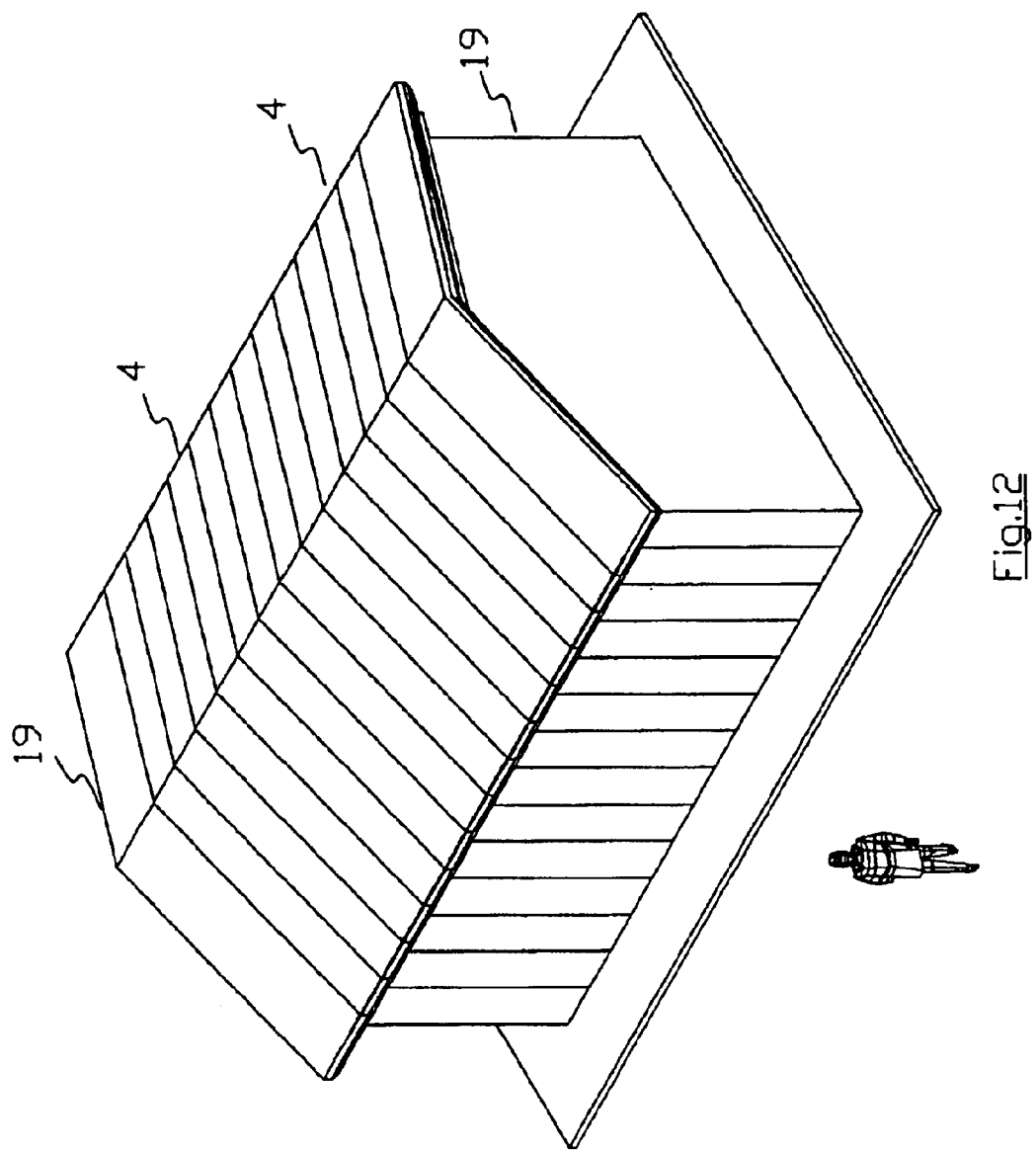
FIG. 12 is a perspective view of the building fully assembled.

FIG. 12 shows the full assembly of the slices 4 including the two end slices 19, which contain the end walls.

Figure 13:
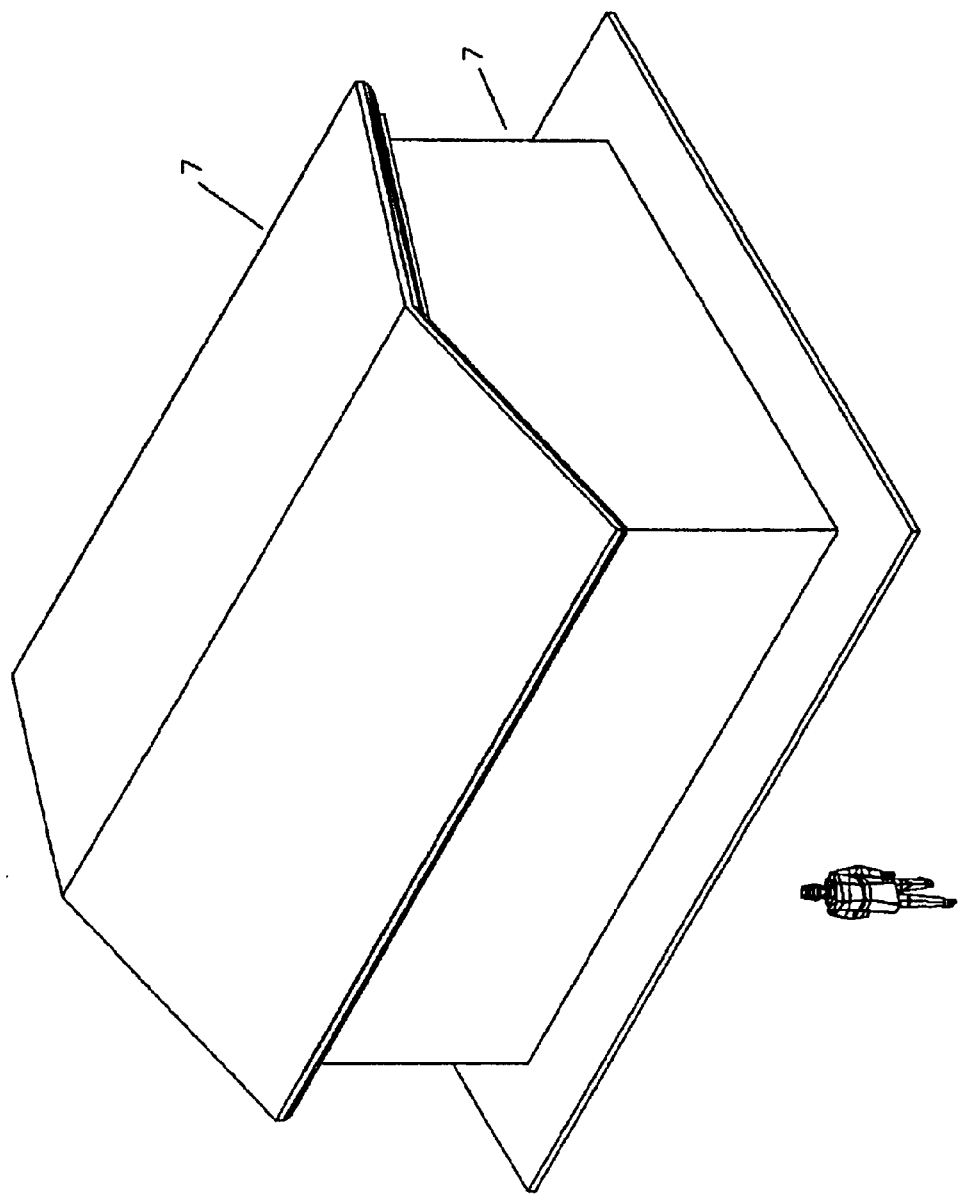
FIG. 13 is a perspective view of the coated building.

FIG. 13 shows the full assembly of slices with a final coating of GFRC 7.

Figure 14:
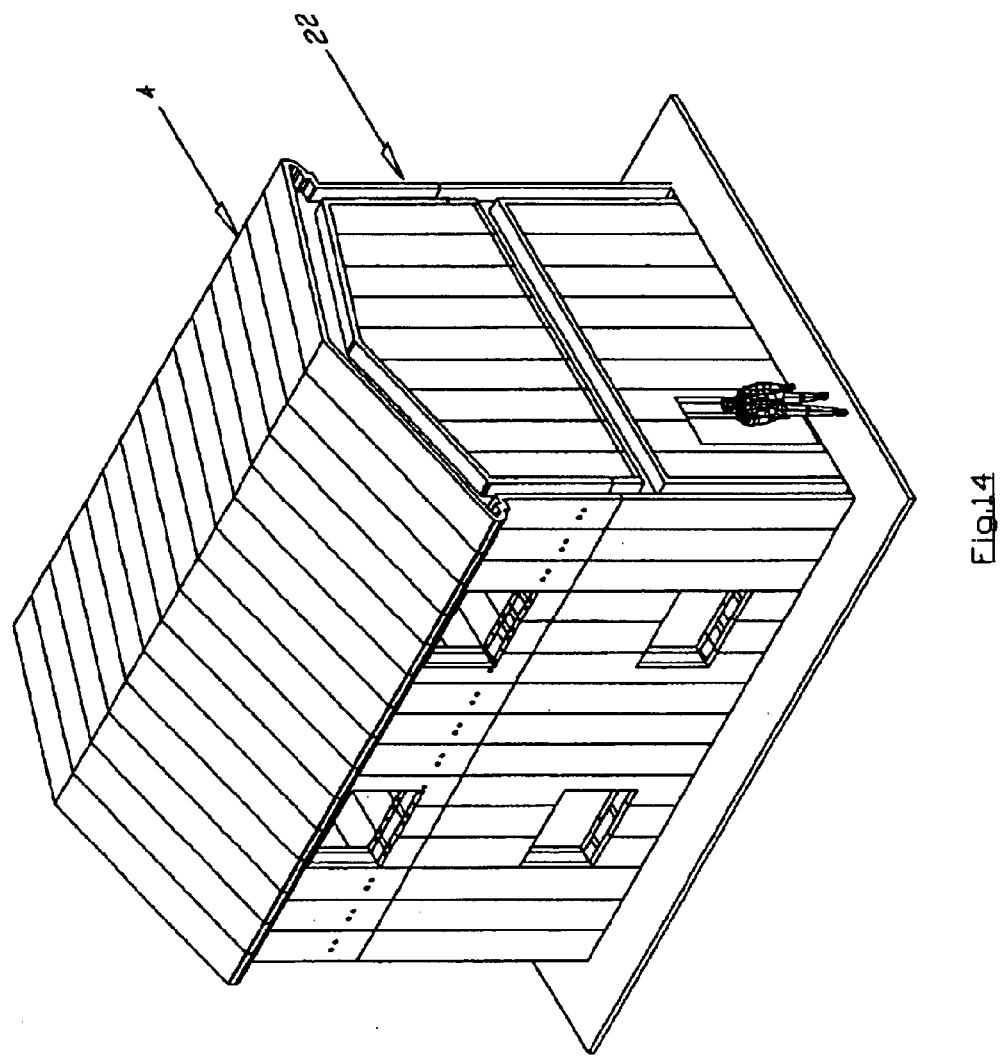
FIG. 14 is a perspective view of a two story building.

FIG. 14 shows a two-story building 22 without the GFRC final coating 7 applied. More stories can be added by adding more lower story slices 24. As shown the windows and doors can be cut out before the final coating is applied.

Figure 15:
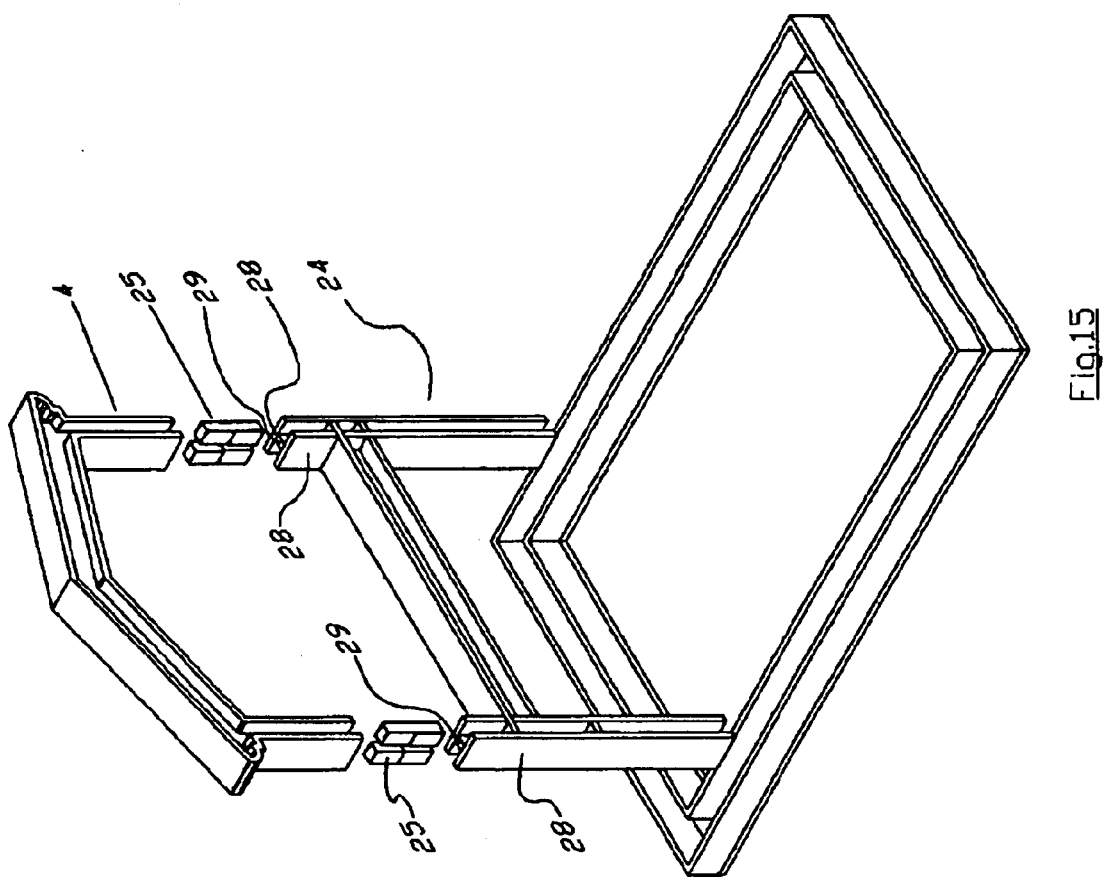
FIG. 15 is an exploded perspective view of the upper and lower slices forming the building of FIG. 14.

FIG. 15 shows two assembled slices exploded. Lower slice 24 is formed in an H-configuration. Upper slice 4 is formed in the same configuration as the single story slice 4 but is shorter in height. Dowels 25 are joined to the lower slice 24 to help align the upper slice 4 for assembly on the lower slice.

Figure 16:
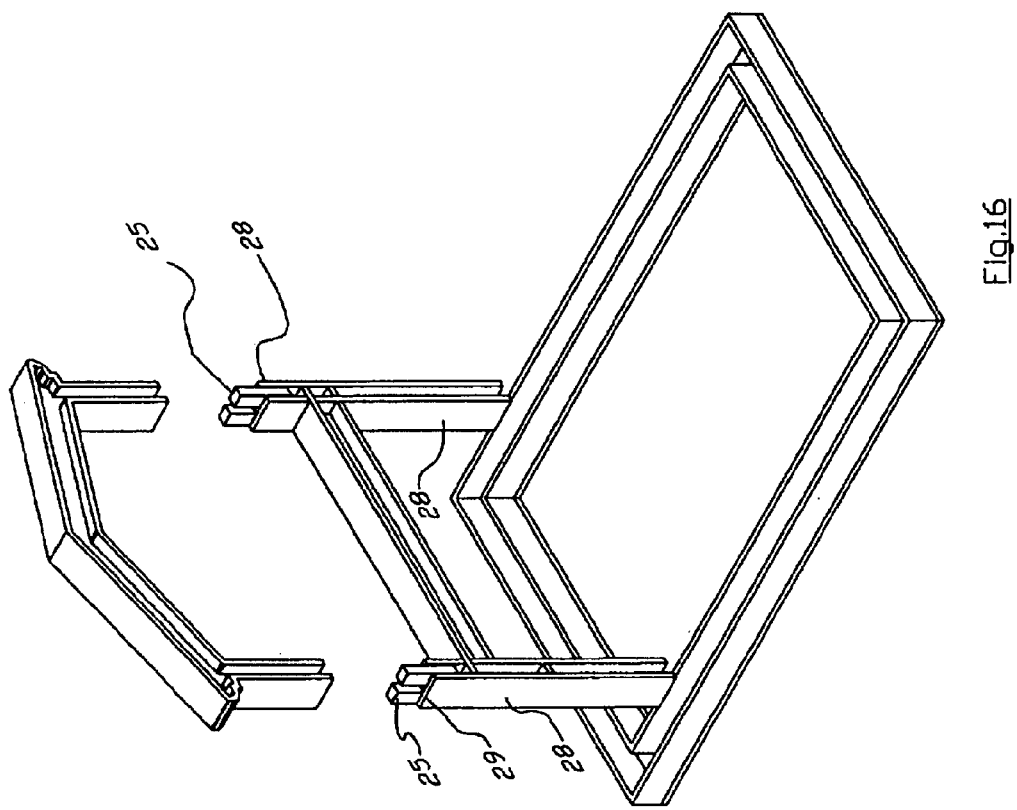
FIGS. 16 and 17 are perspective views of the two slices sequentially assembled.

FIG. 16 shows the dowels 25 joined to the lower slice 24. Dowels 25 are made of foam sized to be smaller than the space between the inner and outer flanges 8 of the lower slice. The foam dowel 25 is coated with GFRC and then adhered to the web 9 and flanges 8 of the lower slice 24 by grout, cement, concrete or GFRC.

Figure 17:
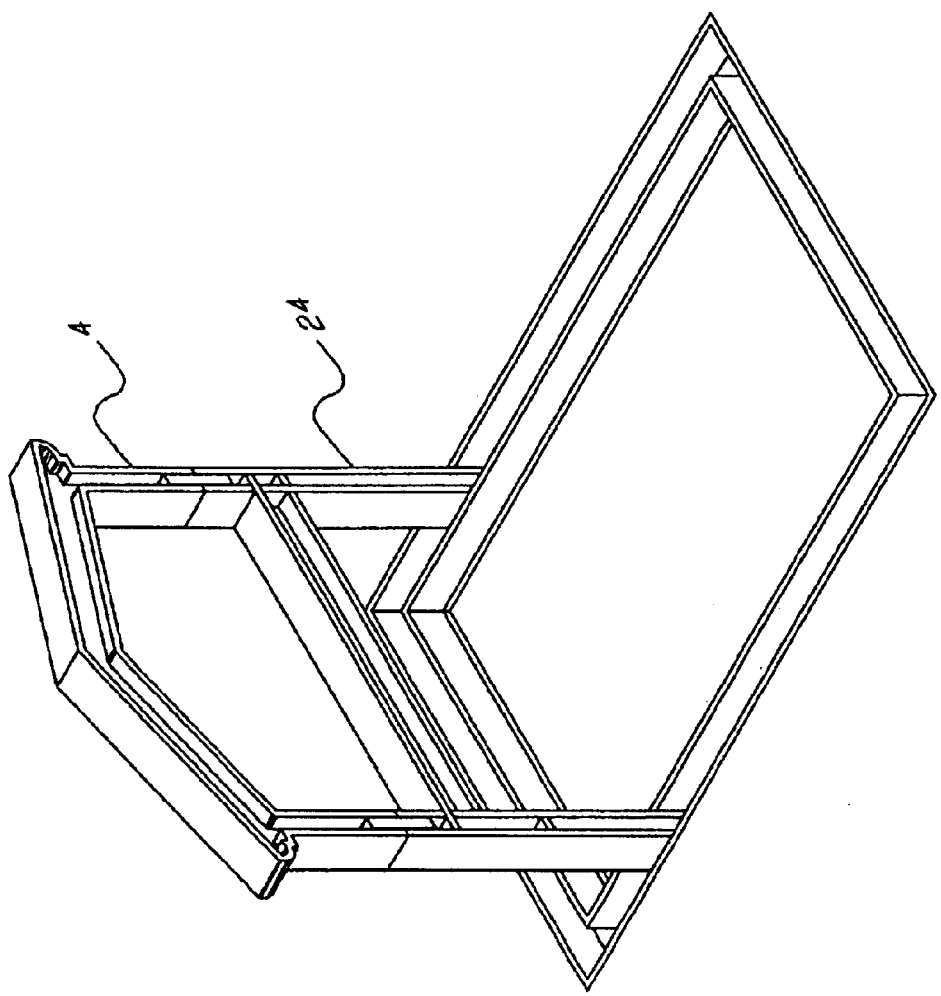

FIG. 17 shows the upper slice 4 and the lower slice 24 assembled without dowels. The assembled upper and lower slice can be coated on any or all surfaces preferably except the abutting edges to strengthen the slices and can be joined to other upper and lower slices as in FIG. 11 and positioned on the footing 3. However, usually, the first story will be built before the second story upper slices are added.

Figure 18:
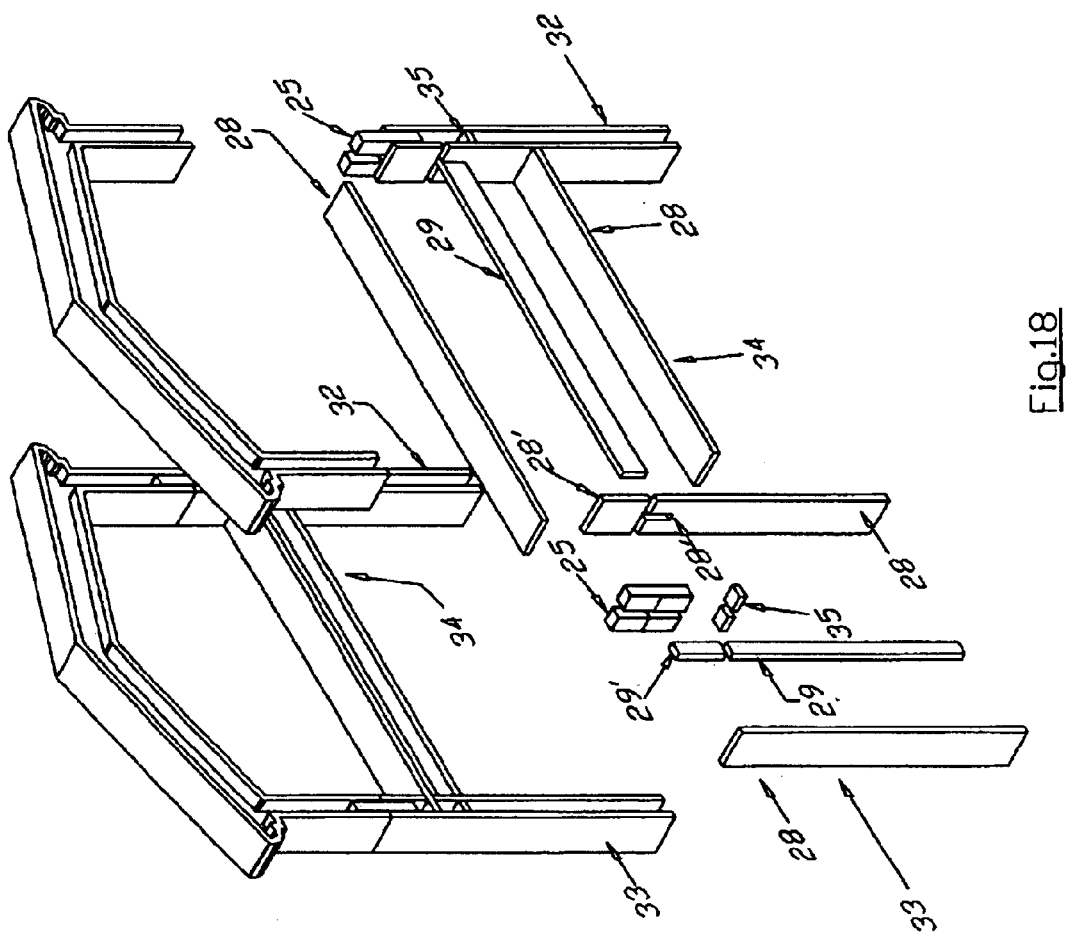
FIG. 18 is a perspective view showing the pieces that make up the lower slice.

FIG. 18 shows an exploded view of the lower slice foam pieces, which form the H. The H is formed by right and left columns 32, 33 and crosspiece 34, all of I-beam cross-section (two flanges joined by a web). The upper slice 4 is shown fully assembled. The four dowels 25 are shown exploded. The columns 32,33 have inner and outer flanges 28 and webs 29. The inner flanges have notch 28" which receive the web 29 of the crosspiece 34. The inner flange 28 and the web 29 of the column are shortened to receive the upper flange 28 of the crosspiece 34. Separate top pieces 28' and 29' are added to complete the inner flange 28 and web 29 of the column 33. Separate sidepieces 35 are added to complete the lower flange 28 of the crosspiece 34. The sidepieces 35 fit between the inner and outer flanges 28 of the columns 32,33 and are adhered thereto.

Figure 19:
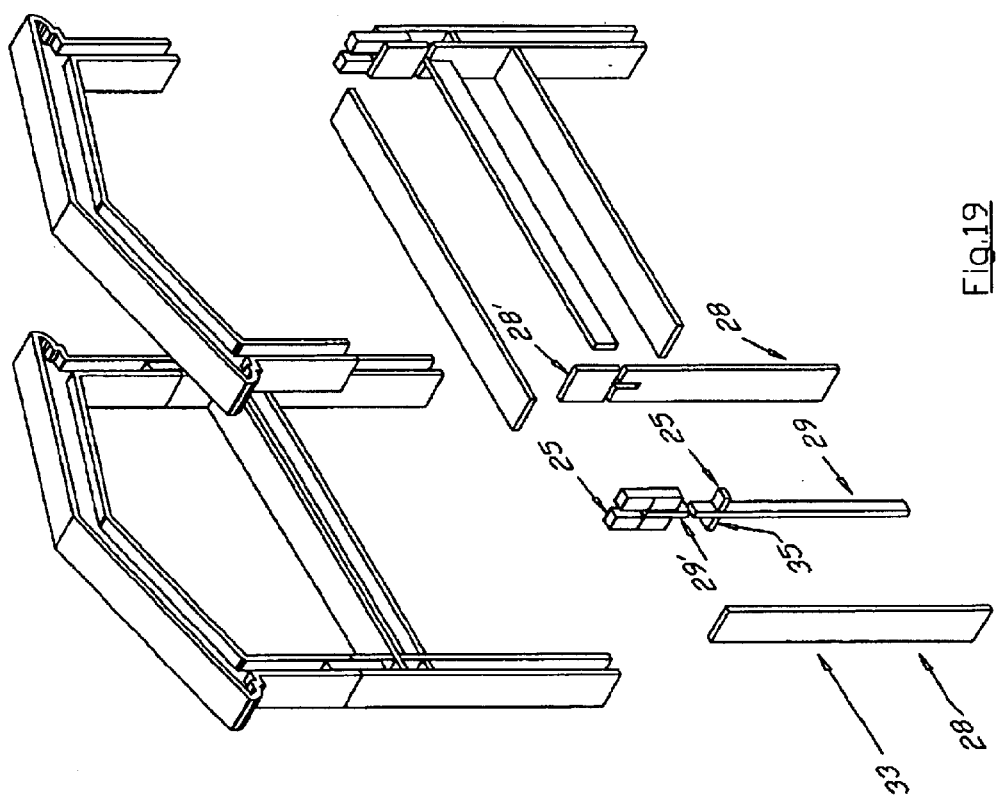
FIG. 19 is a perspective view showing some assembly of the lower slice.

FIG. 19 shows the lower slice web 29 partially assembled on the left side column 33. The top pieces 29', 28' are shown aligned over the web 29 and the inner flange 28. The sidepieces 35 are shown attached to the web 29 but may be attached to the inner and outer flanges 28 and/or the web 29.

Figure 20:
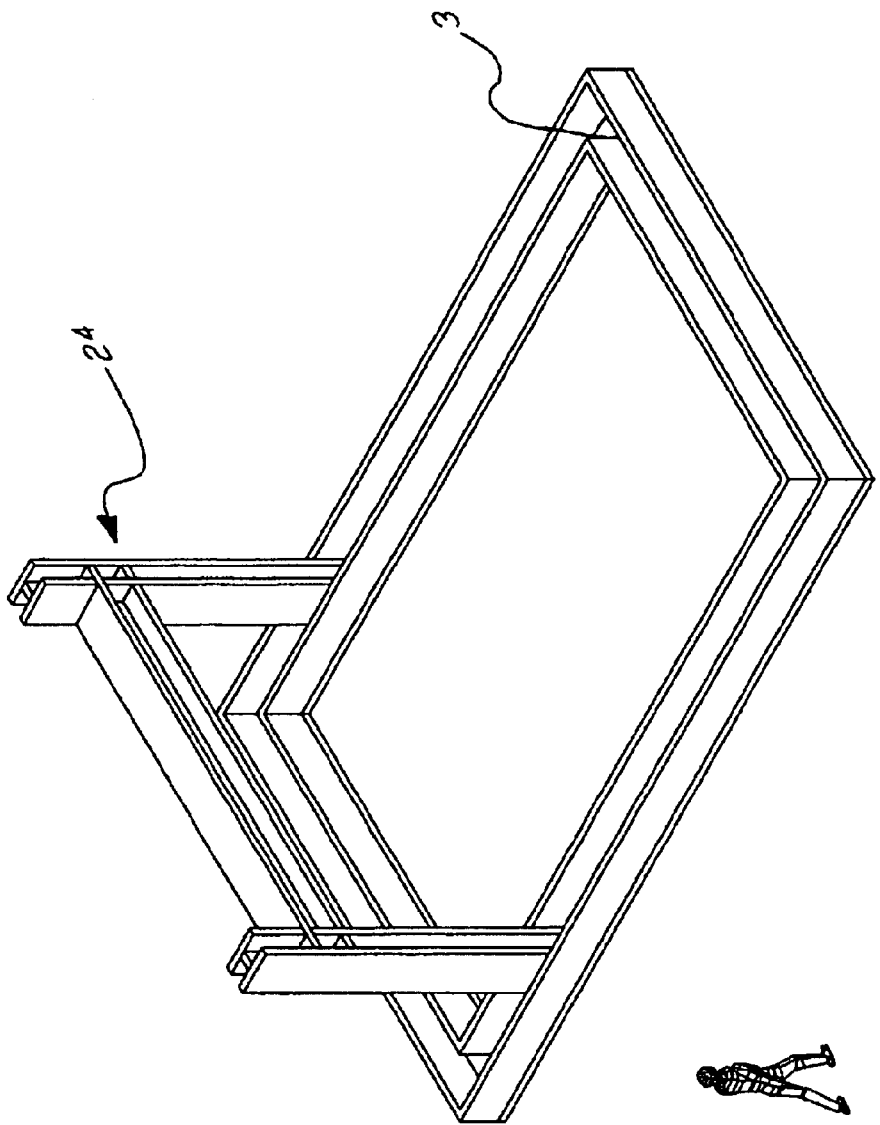
FIG. 20 is a perspective view of the assembled lower slice.
Figure 21:
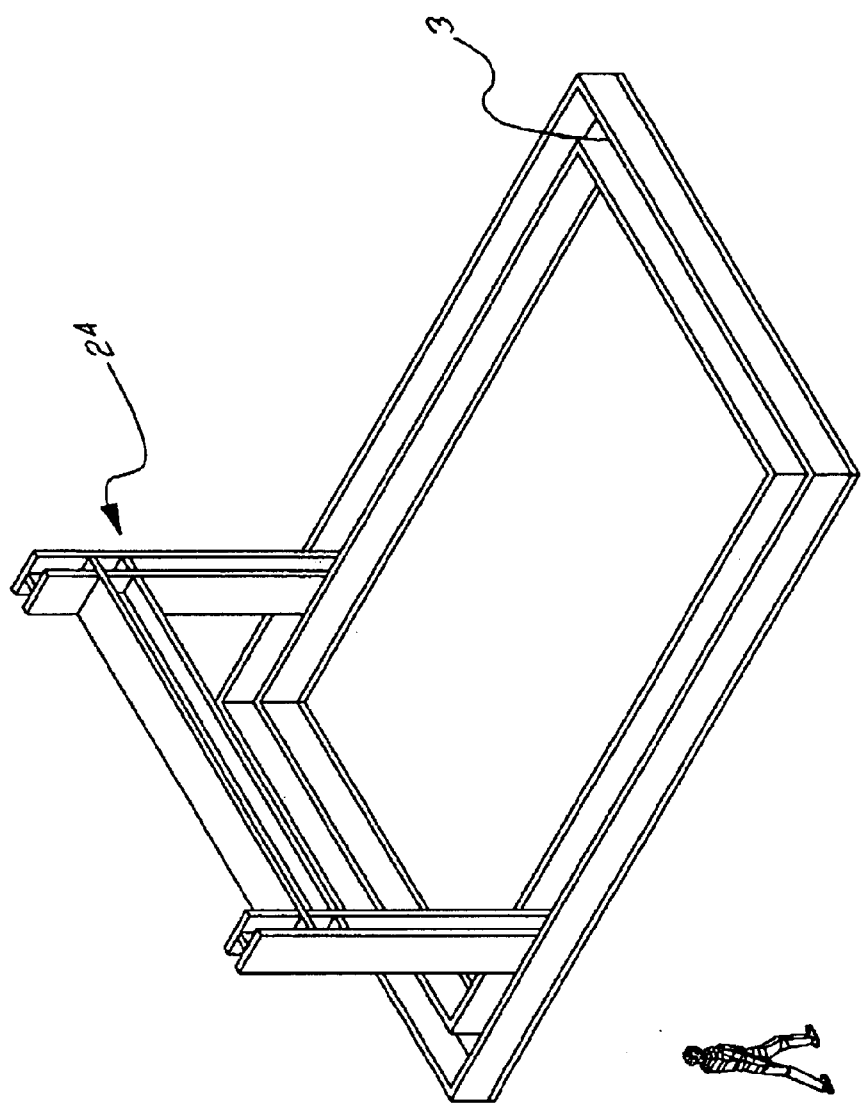
FIG. 21 is a perspective view of the lower slice on the footings.

FIG. 20 shows the fully assembled lower slice 24. FIG. 21A shows the lower slice 24 on the footing 3.

Figure 22:
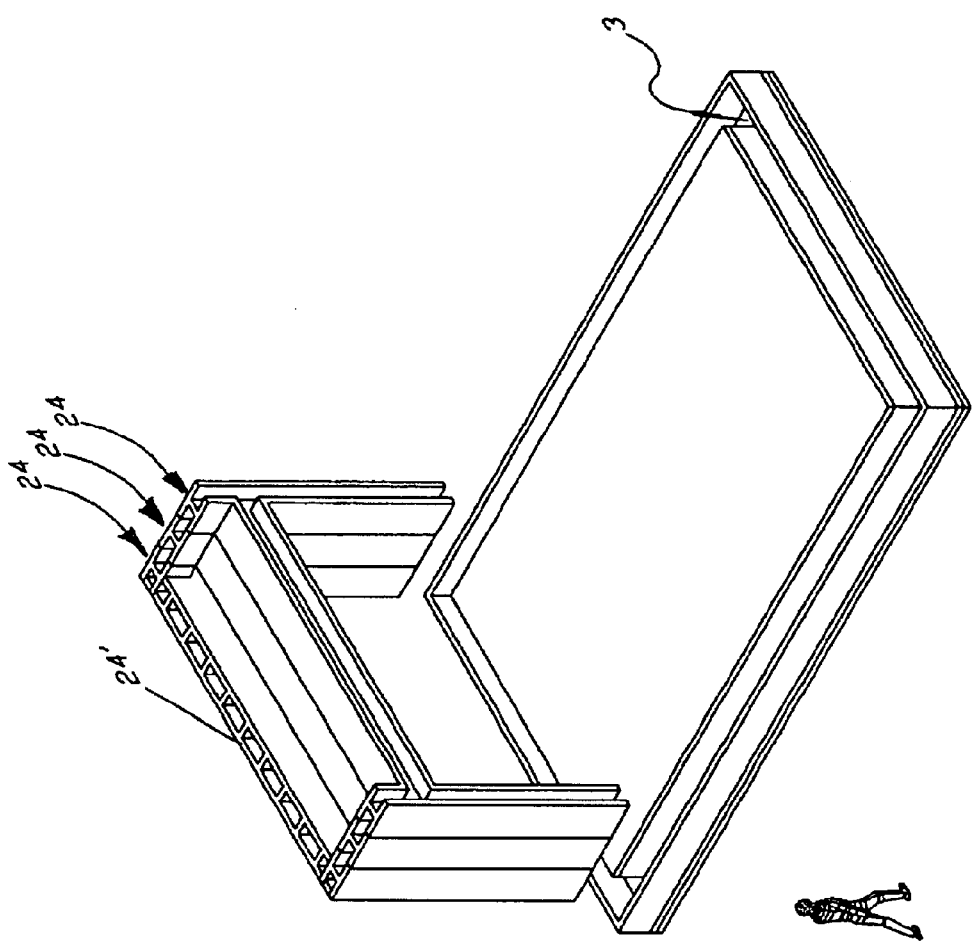
FIG. 22 is a perspective view of some lower slices assembled with an end wall slice.

FIG. 22 shows an assembly of lower slices 24 including an end wall lower slice 24'. In this construction embodiment, the assembly is made prior to the slices being positioned on the footing 3. The assembly is moved on to the footing and adhered thereto.

Figure 23:
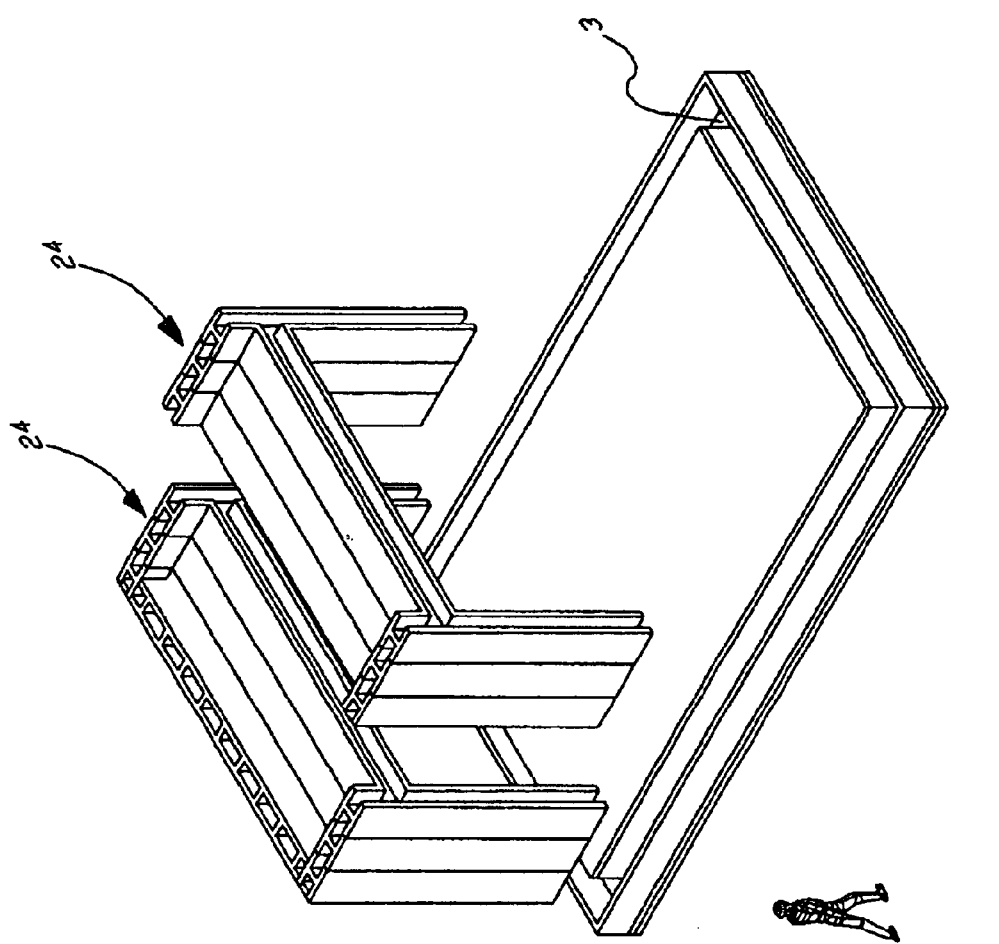
FIGS. 23 and 24 are perspective views of the sequential assembly of the lower slices.
Figure 24:
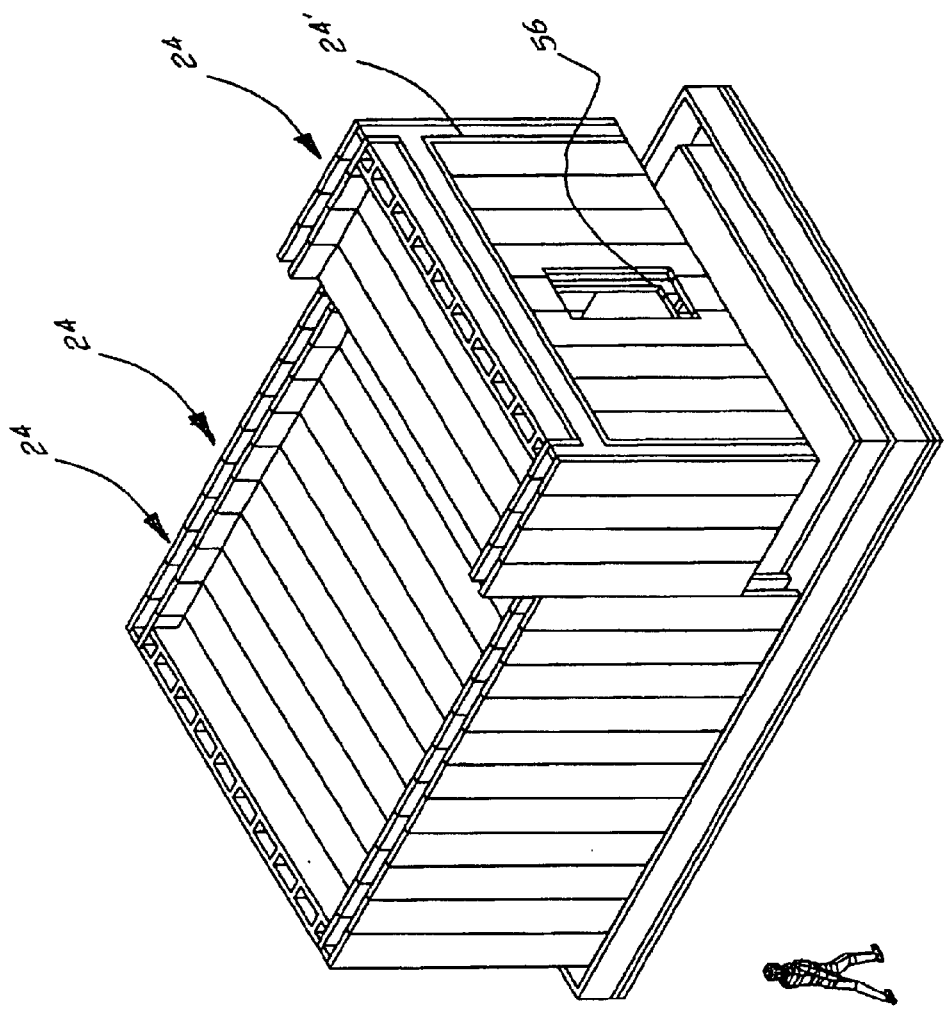

FIGS. 23 and 24 show several more assemblies of slices 24 being joined to the previously positioned slice assembly 24. In FIG. 24, the door 56 is cut out of the foam before it is coated with a coating of GFRC 7.

Figure 25:
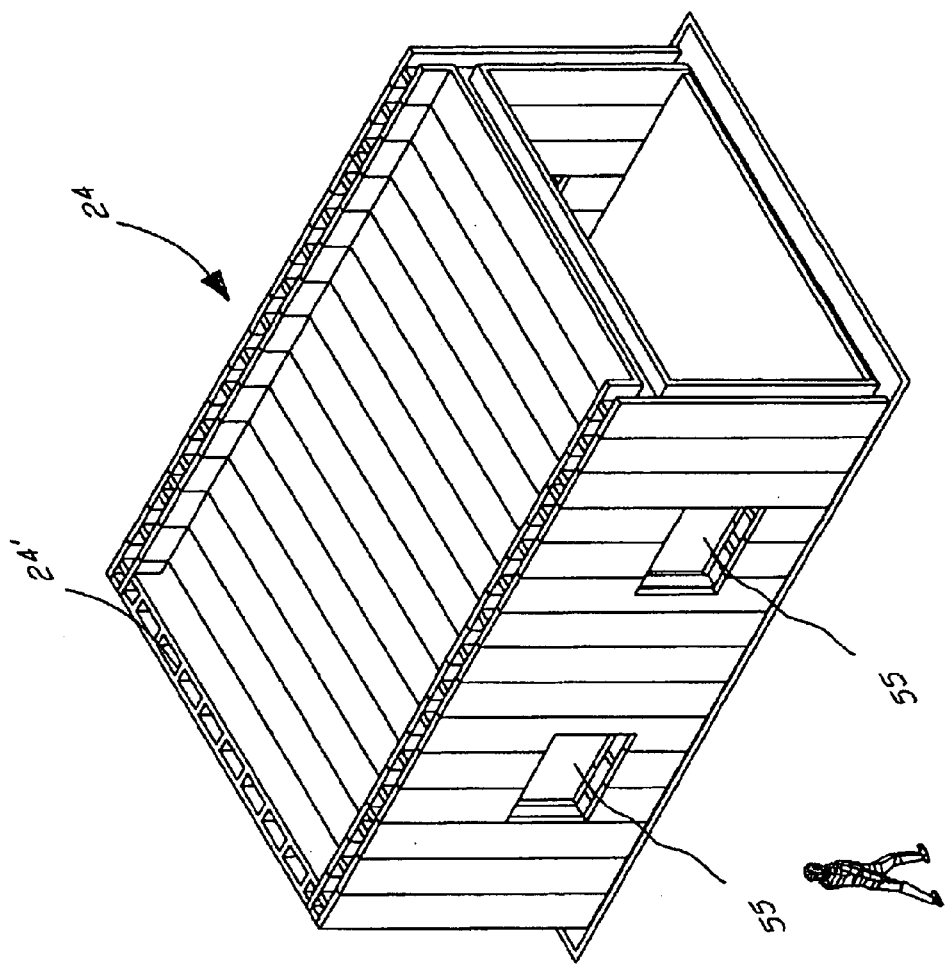
FIG. 25 is a perspective view of the building with the end wall slice removed.

FIG. 25 shows the complete lower slice portion of the building with one end wall slice 24' removed to more clearly show the inside of the building and walls. In this figure, the windows 55 have been cut out of the foam walls before the walls are coated with GFRC 7.

Figure 26:
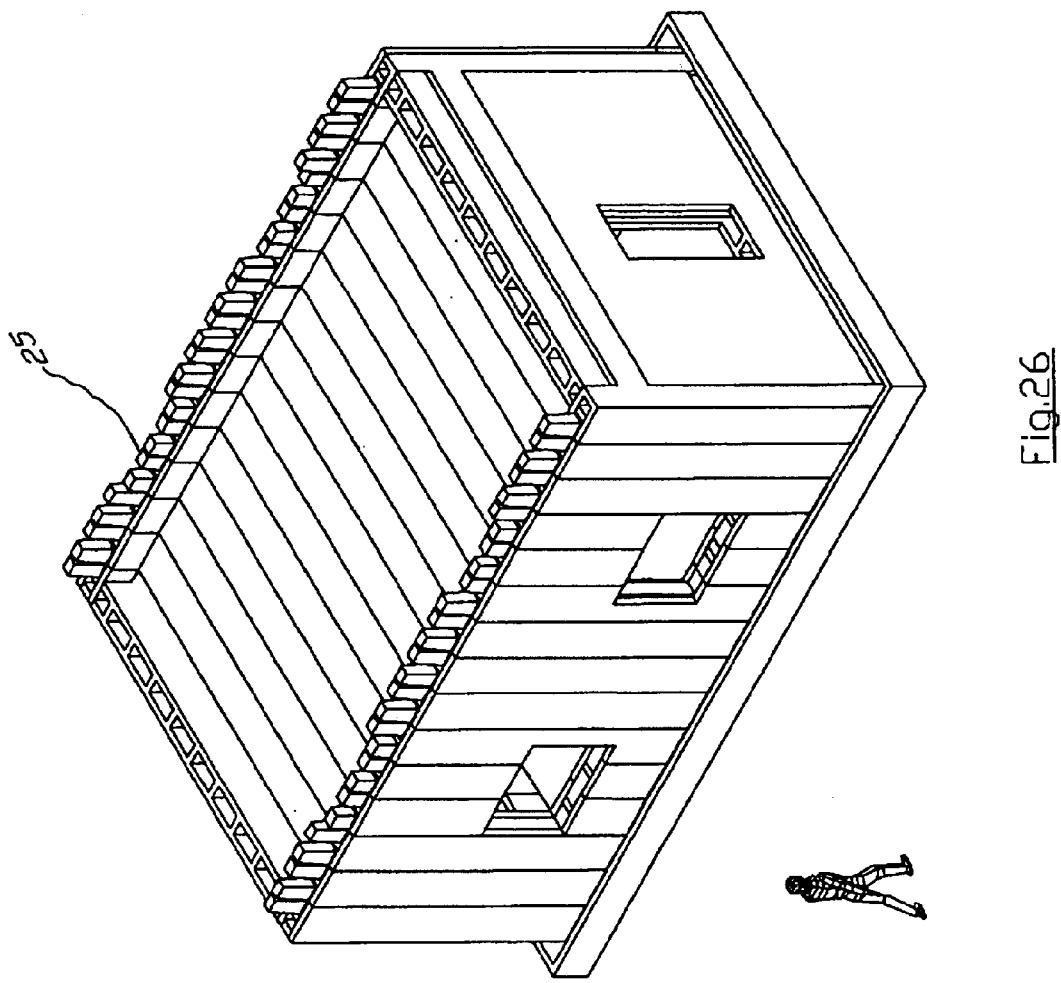
FIG. 26 is a perspective view of the building with the dowels assembled.

FIG. 26 shows the assembled lower slices 24 without windows but with the dowels 25 inserted. The dowels 25 can be inserted and joined to the slice 24 before or after it is joined to other slices 24. Preferably, the dowels 25 are coated with GFRC and adhered to the walls of the I-beam that they are inserted into. As shown, the dowels 25 are smaller at sections where windows 55 will be cut there above.

Figure 27:
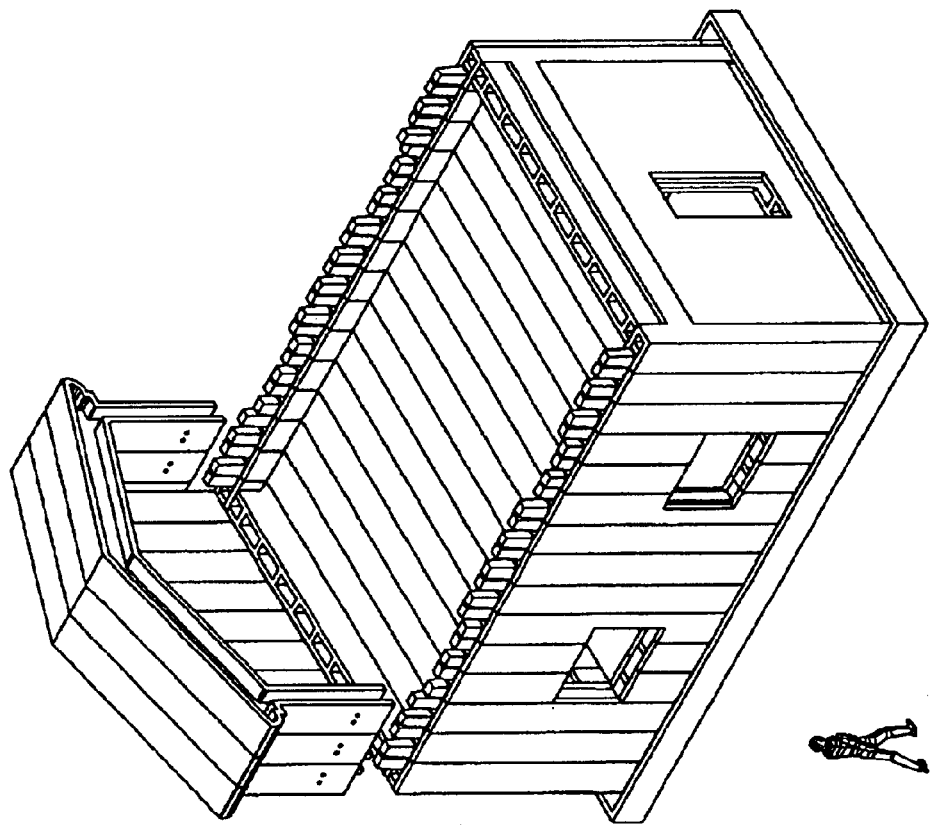
FIGS. 27–29 are perspective views of groups of upper slices positioned for assembly on the lower portion of the building.
Figure 28:
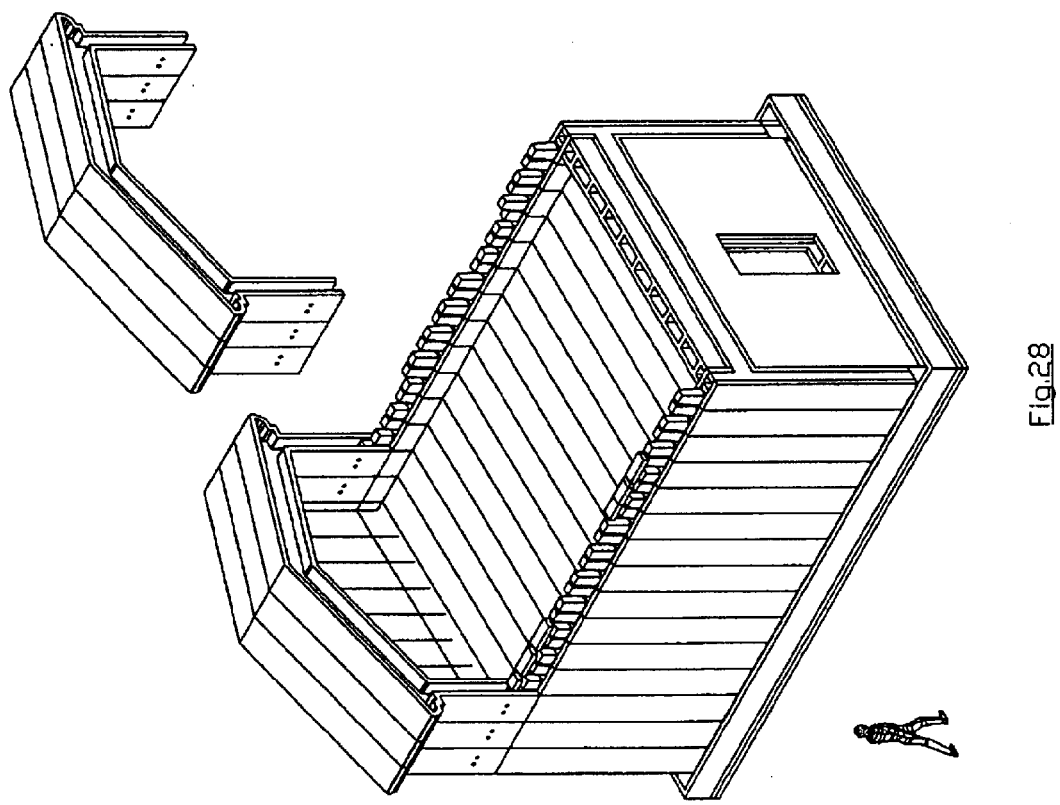
Figure 29:
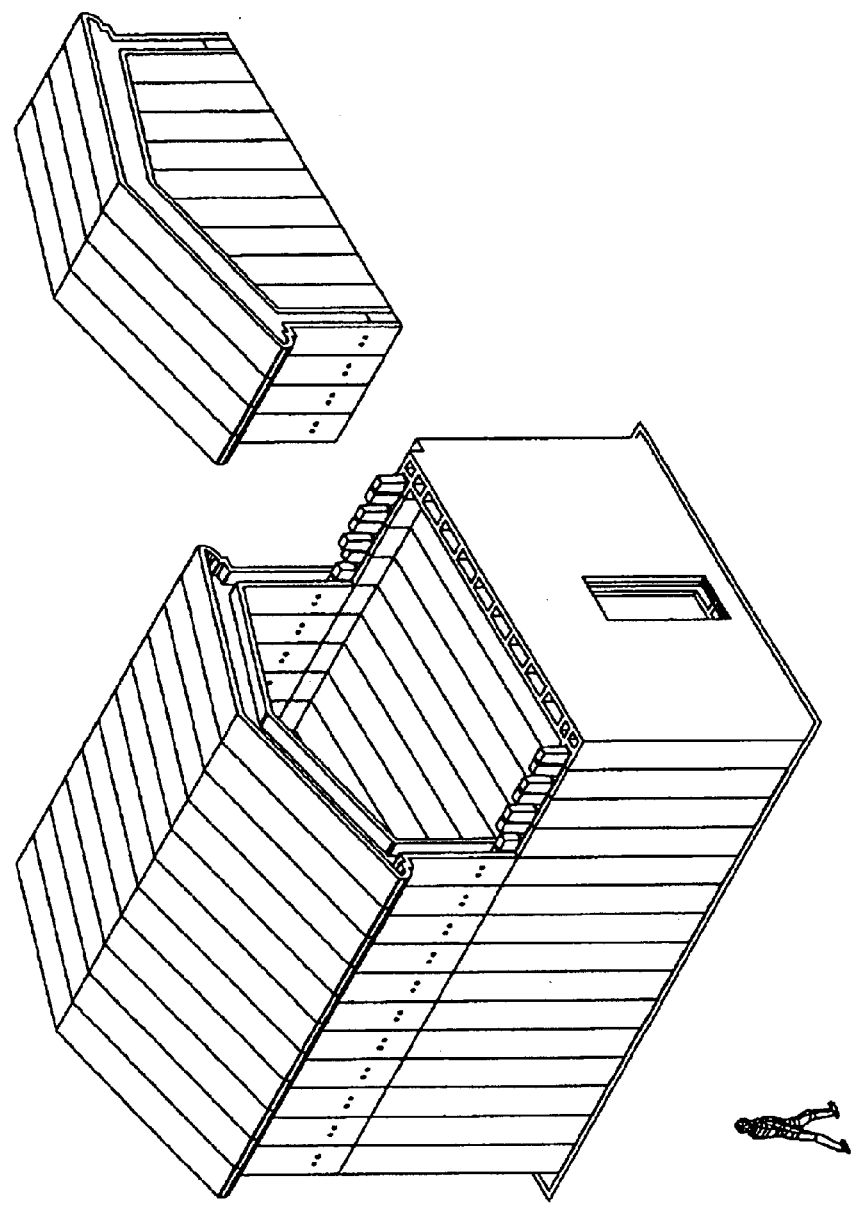

FIGS. 27–29 show upper slice assemblies 4 being placed on top of the lower slice full assembly. The dowels 25 assist in this positioning. At least some of the internal walls of the I-beam cross-section of the slices are previously coated with GFRC. Preferably, the foam dowels 25 coated with GFRC are adhered to these previously coated or non-coated walls. Preferably, grout is used to adhere the dowels 25 to the walls, but GFRC, non-reinforced cement/concrete or other appropriate adhesive can be used.

Figure 29A:
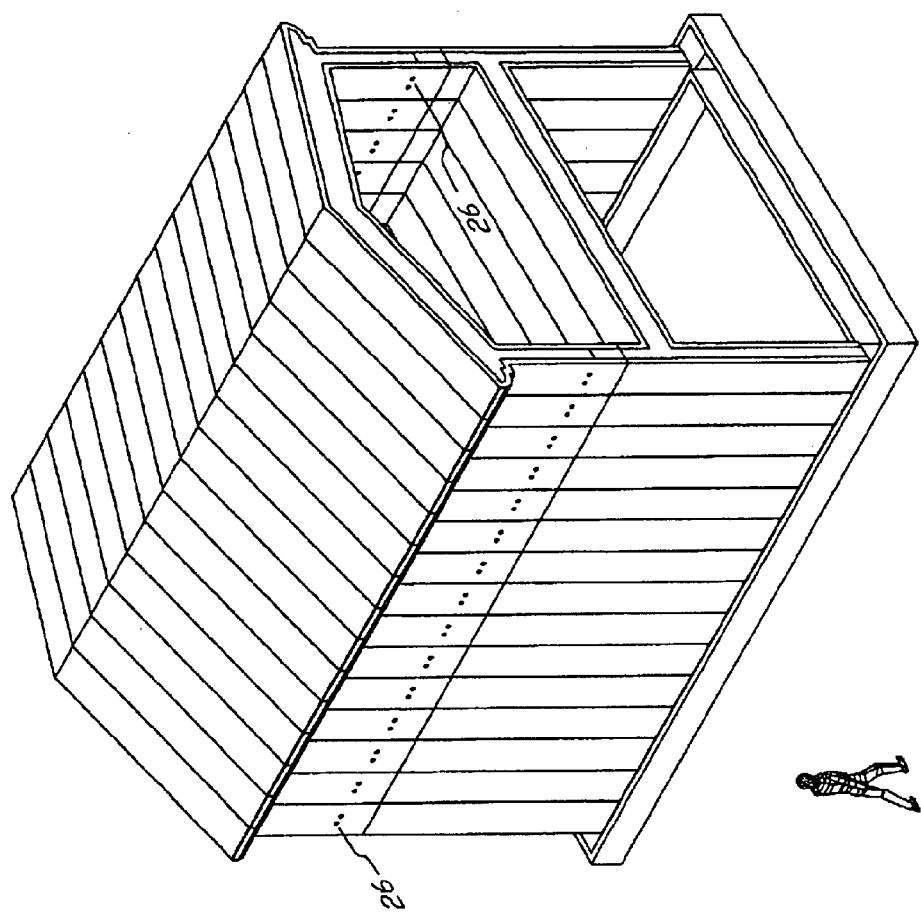
FIG. 29A is a perspective of the two story building with the end wall removed.

FIG. 29A shows a variation of the two story building in which the building ends are added after the in-between slices/sections are added. Holes 26 are provided in the inner and outer walls to assist in feeding grout into the areas around the dowels 25.

The slice formed building of FIGS. 1–29A can also be formed from a full C-Beam slice 44 instead of the I-Beam slice 4. The full C-Beam slice 44 is shown in FIGS. 30–42. The full slice 44 can be made without the use of dowels. The slice 44 is built, coated with GFRC on some surfaces, if needed, raised and positioned on the footings as one piece.

FIG. 30 shows an exploded frontal view of a slice 44 of the building.

FIG. 31 shows an exploded perspective view of the slice 44 of FIG. 30. The C-Beam slice 44 is made as in FIGS. 18, 19 from pieces of foam that are joined by adhesives. The C-Beams 50 are formed from flanges 48 and webs 49. The web 9 of the I-Beam of the I-Beam 10 lies in the mid-plane of the I-shaped element. The web 49 of the C-Beam 50 connects the flanges 48 and lies on one of the sides of the C-shaped element.

Figure 32:
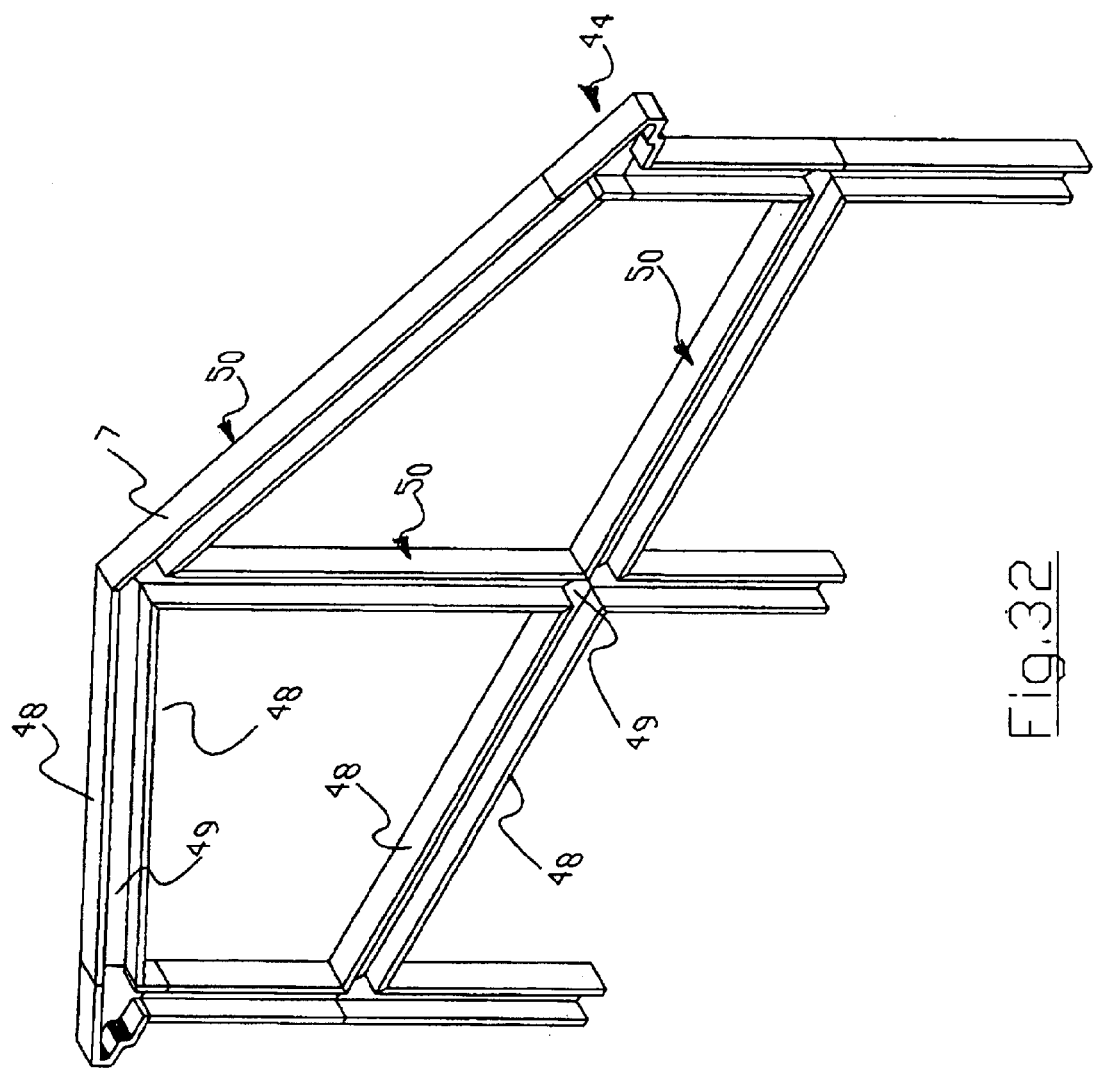
FIG. 32 is a perspective view of the assembled slice of FIG. 30.

FIG. 32 shows a perspective view of the C-Beam slice 44 formed by joining the C-Beam pieces of FIG. 31 by adhesives. The walls of the slice are shown as coated by GFRC 7; however, the coating need not be applied before being positioned on the footings and need not cover all surfaces, especially the abutting surfaces.

Figure 32A:
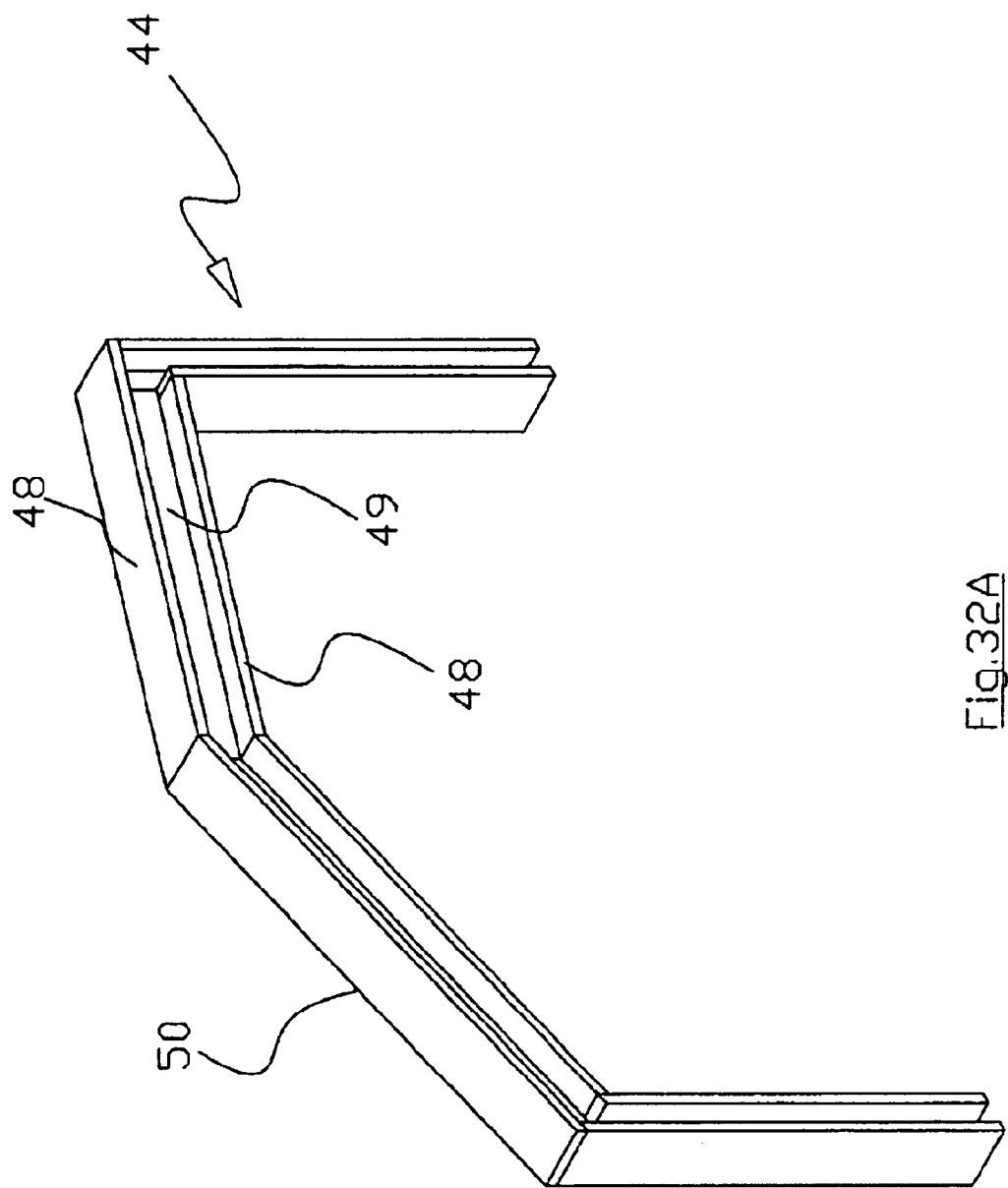
FIG. 32A is a perspective view of a different embodiment of the C-Beam of FIG. 30.

FIG. 32A shows a perspective view of a different embodiment of the full C-Beam slice 44. The span of this configuration can be at least 20 feet which makes it ideal for modern homes. It is noted that the foam pieces are joined at different points in this embodiment.

Figure 33:
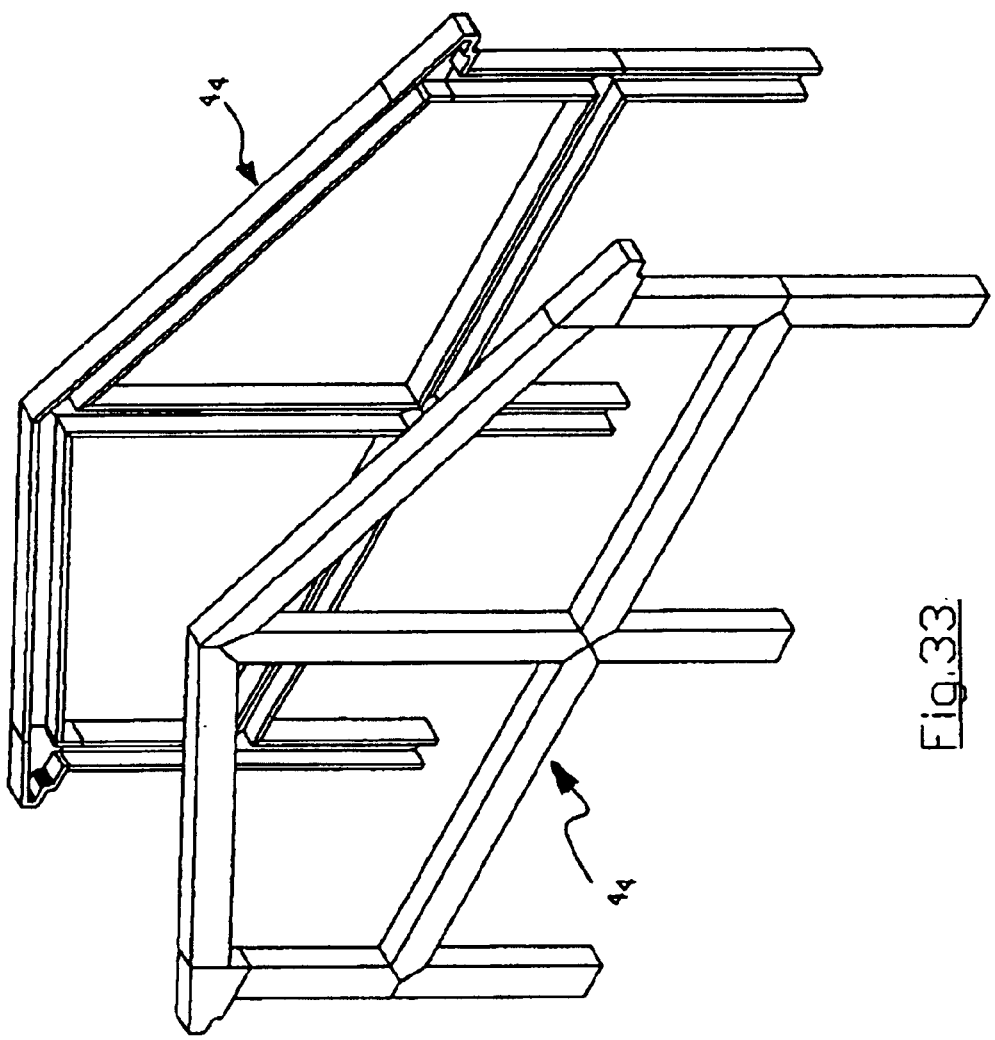
FIG. 33 is a perspective view of two slices oriented for joining.

FIG. 33 shows a perspective view of two C-Beam slices 44 prior to their being joined to each other by adhesives.

Figure 34:
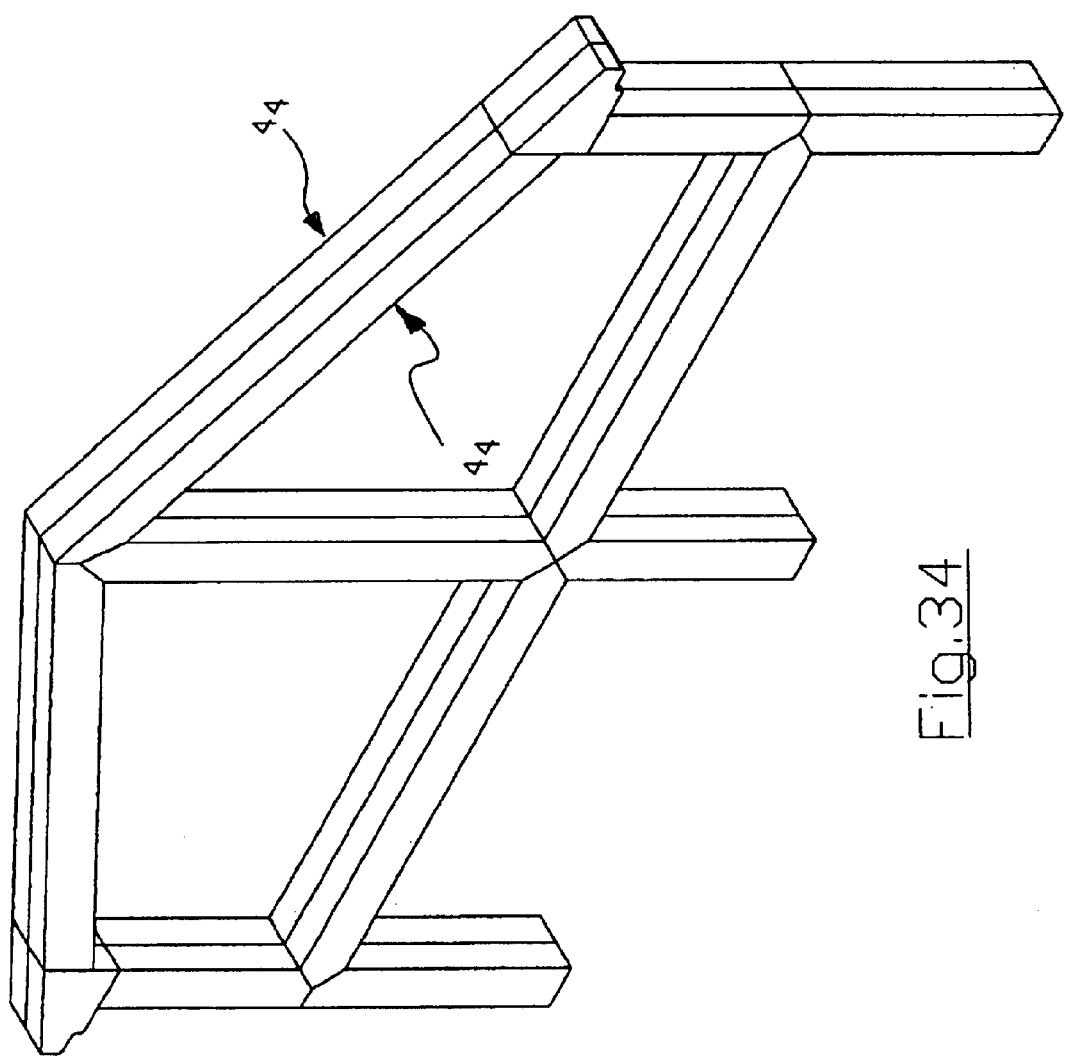
FIG. 34 is a perspective view of the joined slices.

FIG. 34 shows a perspective view of the two C-Beams of FIG. 33A joined together along their abutting edges, the edges of the flanges 48, by adhesives.

Figure 35:
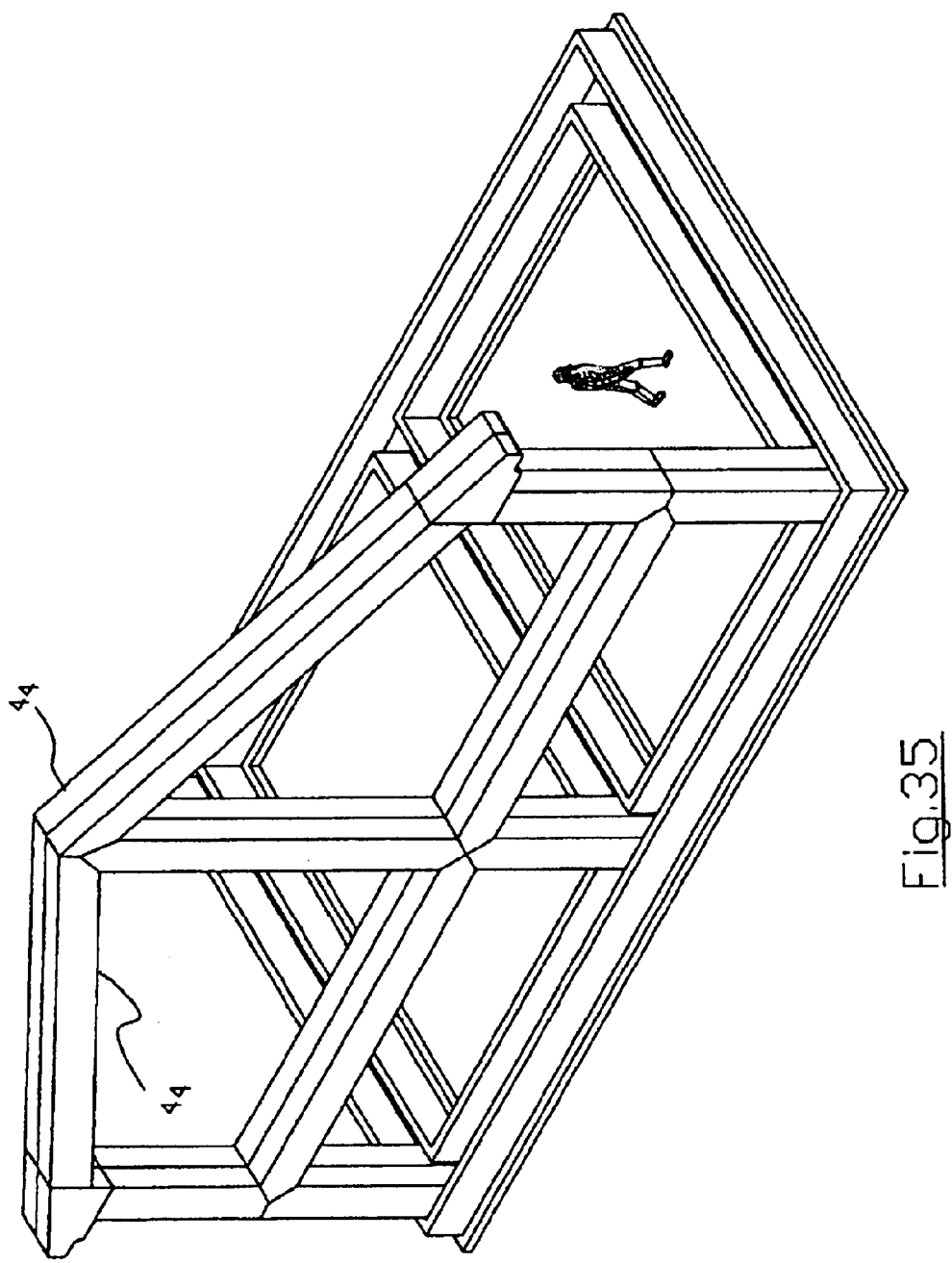
FIG. 35 is a perspective view of the assembled slices positioned on the footings.

FIG. 35 is a perspective view showing the two joined slices 44 positioned on the footings 3. The back-fill dirt 6 is not shown in this figure.

Figure 36:
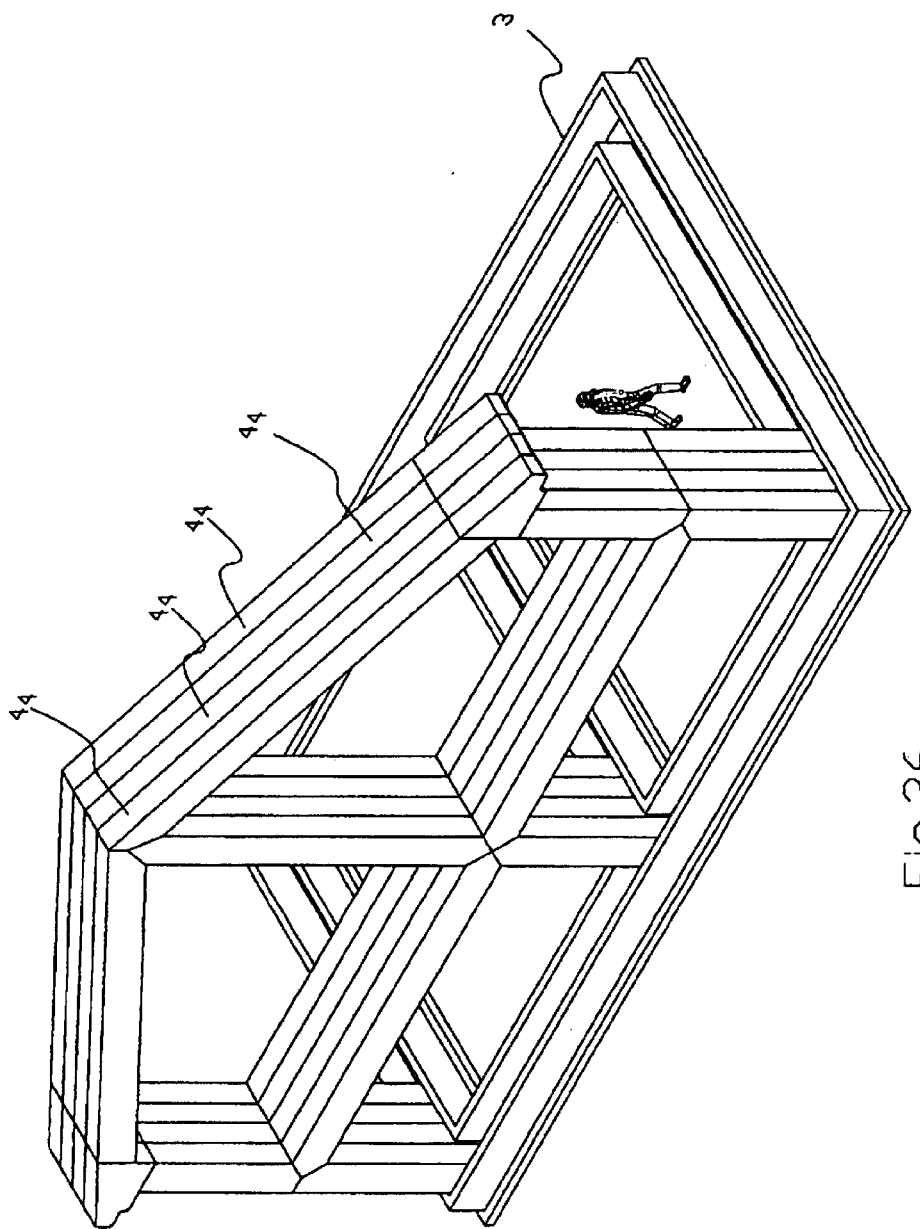
FIGS. 36 and 37 are perspective views of additional slices positioned on the footings.

FIG. 36 shows a perspective view of four slices 44 positioned on the footings 3. The two sets of joined slices 44 forming the four slices 44 are joined to each other on their abutting faces, the outside surfaces of the webs 49, by adhesives.

Figure 37:
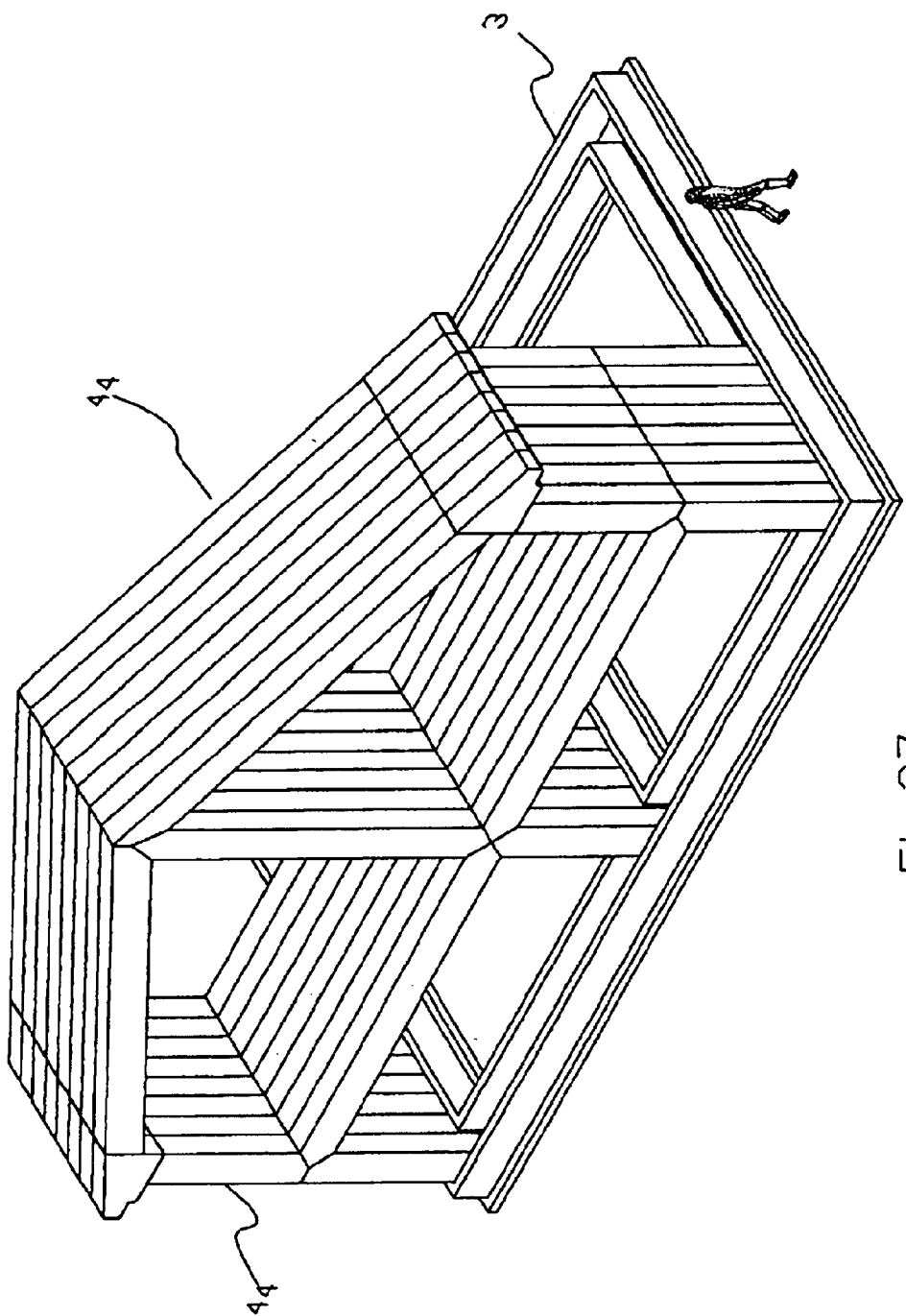

FIG. 37 shows eight slices 44 positioned on the footings 3. The bottoms of the slices 44 are usually adhered to the footings 3 by grout or other adhesive.

Figure 38:
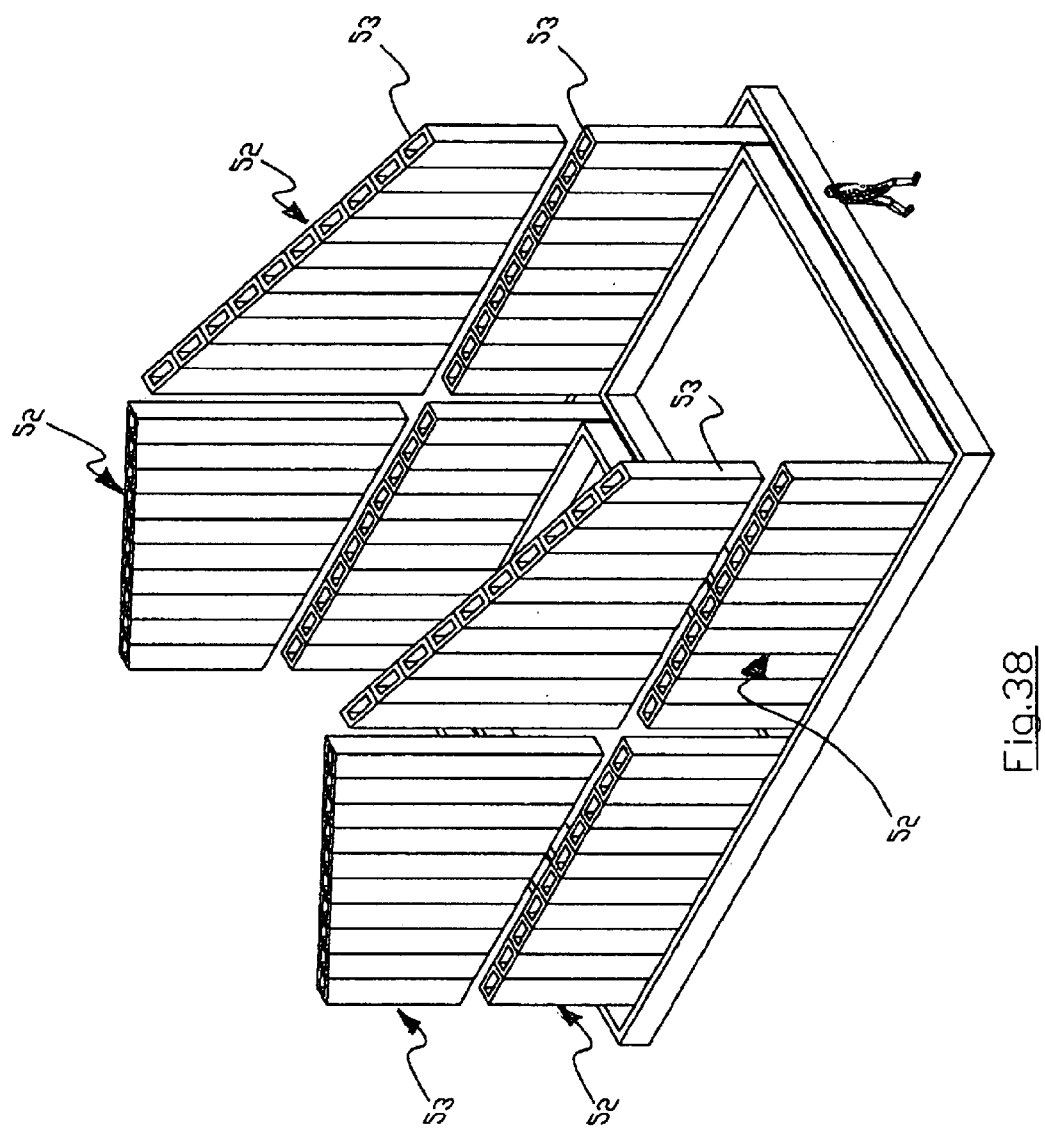
FIG. 38 is a perspective view of some of the pieces which make the end walls.
Figure 39:
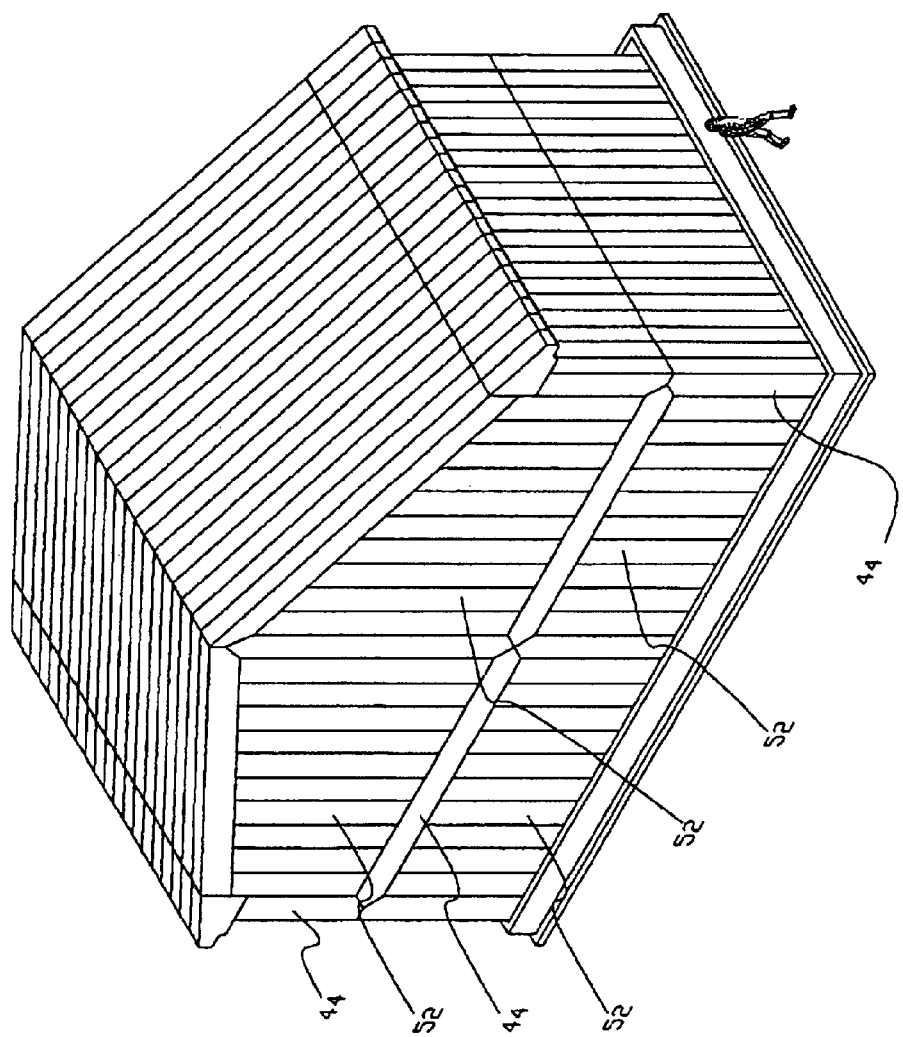
FIG. 39 is a perspective view showing the fully formed end wall.

FIG. 38 is a perspective view showing end walls 52 formed from tubes 53 having a rectangular cross-section. The tubes 53 can be formed from four foam pieces joined by adhesives. The some of the internal surfaces of the tubes 53 may be coated with GFRC where added strength is needed. The tubes 53 are adhered to adjacent tubes by adhesives. The end walls fill in the spaces in slices 44 as shown in FIG. 39.

Figure 40:
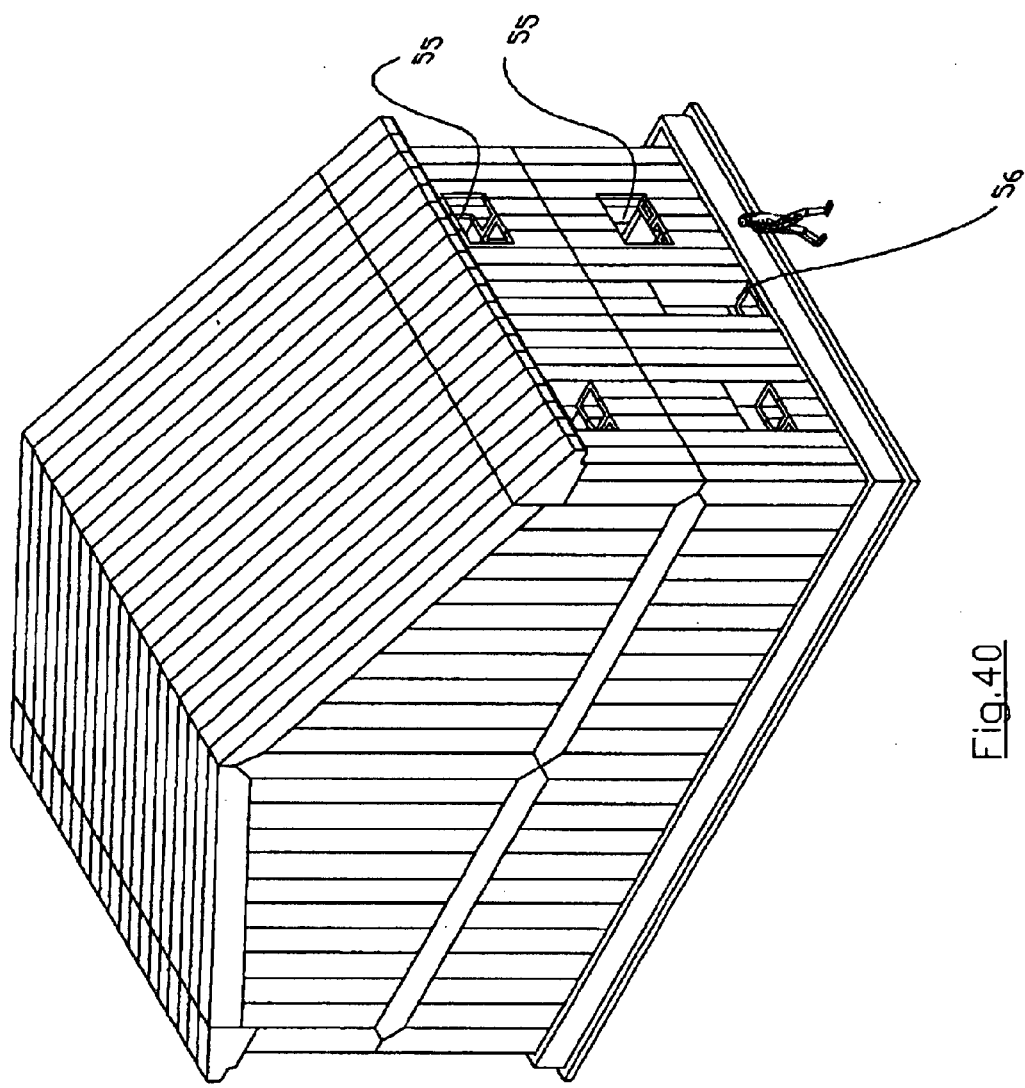
FIG. 40 is a perspective view of the assembled building.

FIG. 40 shows a perspective view of the assembled building 2 with the windows 55 and door 56 cut out.

Figure 41:
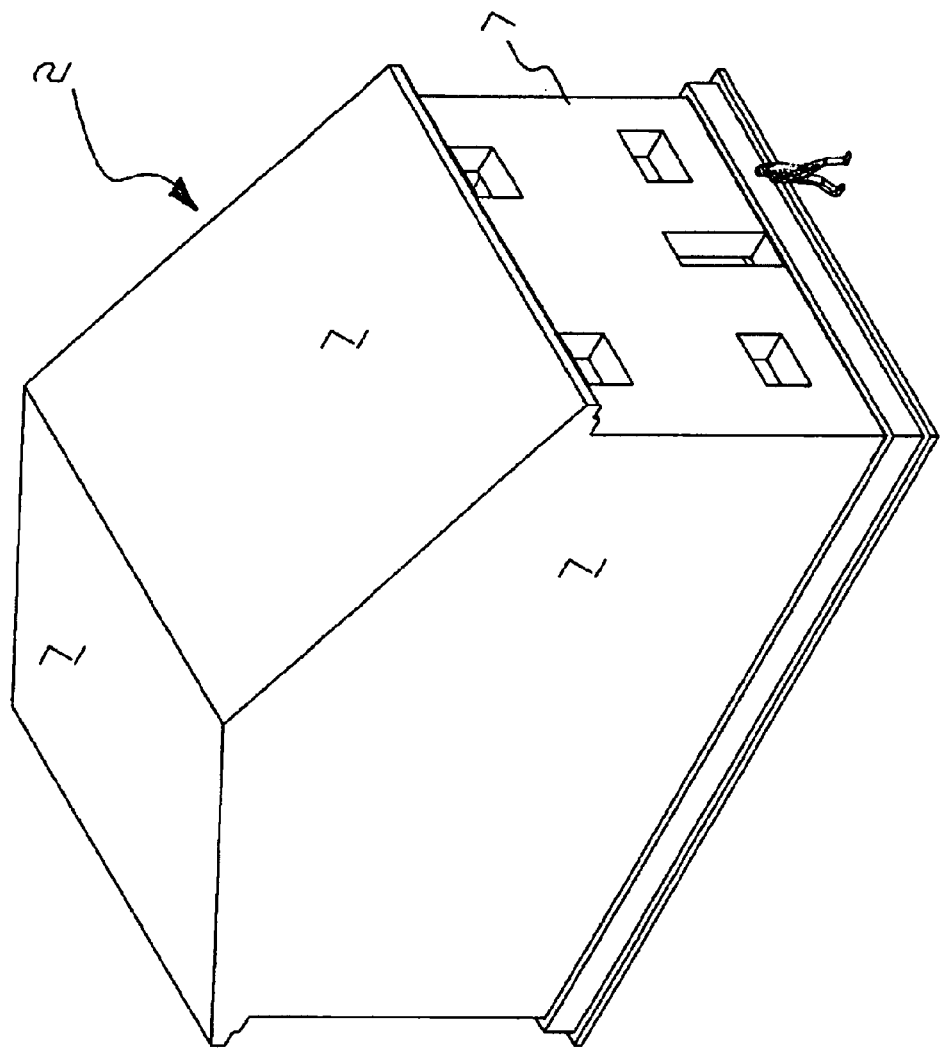
FIG. 41 is a perspective view of the building with the exterior coat of GFRC applied.

FIG. 41 shows a perspective view of the assembled building 2 with the exterior coated with GFRC coating 7. The interior surfaces are also coated with GFRC. The inner and outer GFRC coatings 7 form inner and outer shells on the foam composite building 2. The strength of the building is greatly increased by adding GFRC coatings to the inner surfaces of the slice 44. The inner coatings can be as little as 1/16 inches.

Figure 42:
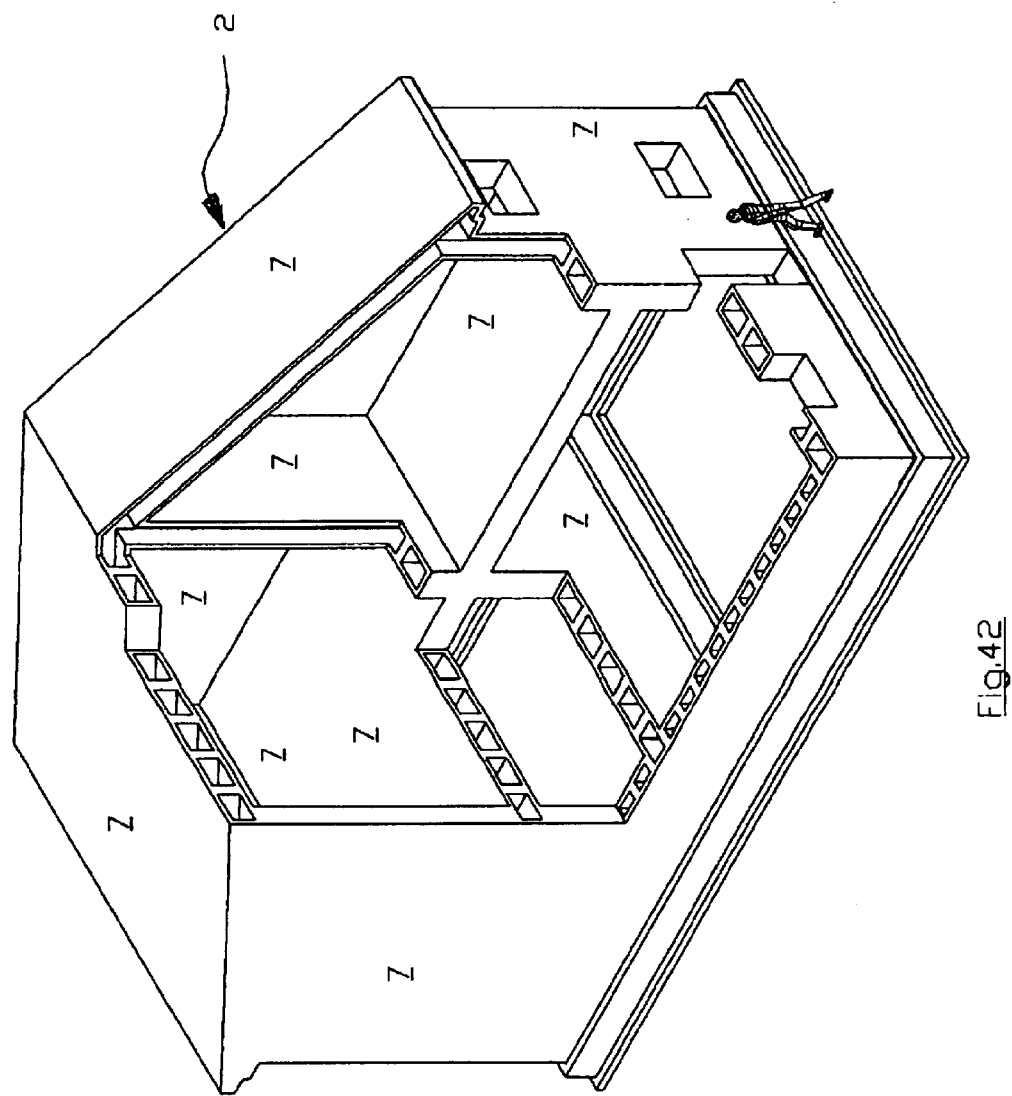
FIG. 42 is a perspective view of the building of FIG. 41 with portions removed.

FIG. 42 shows the building of FIG. 41 with some portions removed to show the insides of the building with interior GFRC coatings 7. The internal stairs and doorways have been omitted for simplicity.

Figure 43:
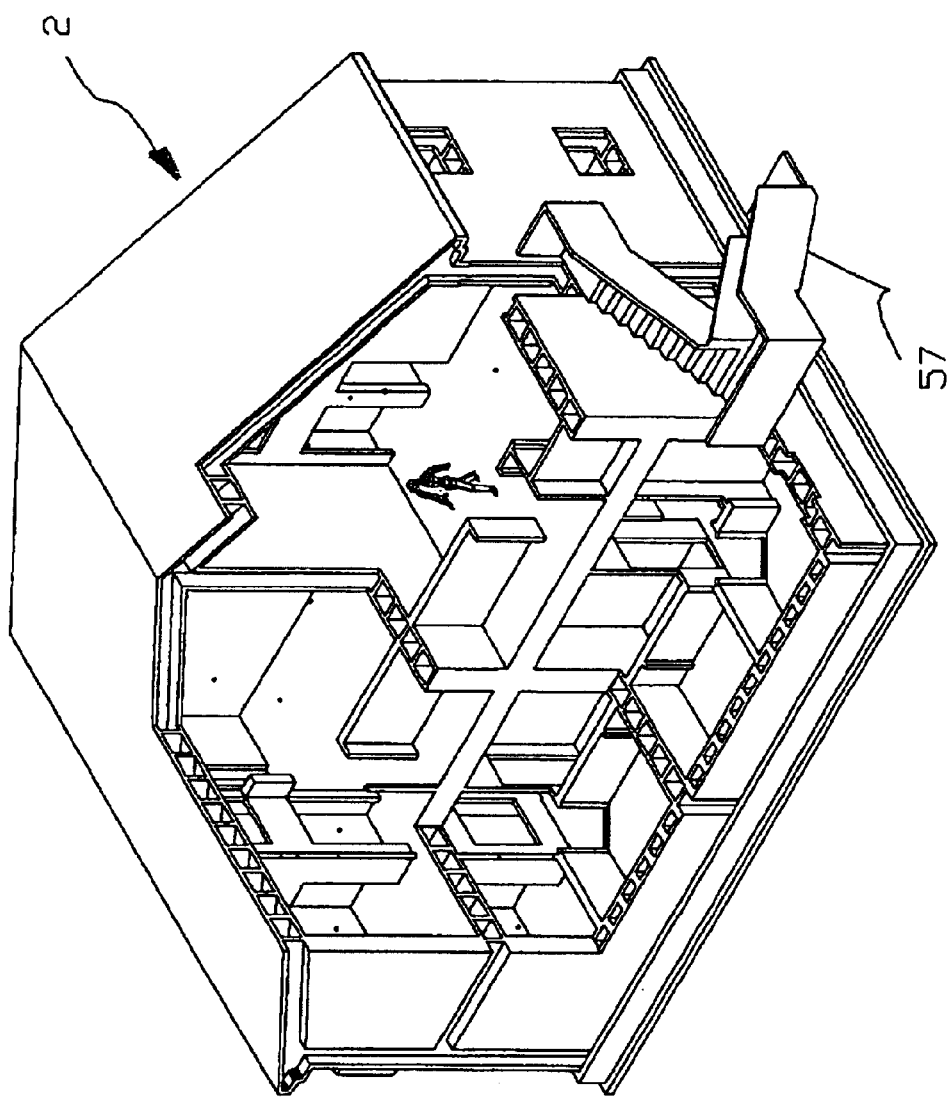
FIG. 43 is a perspective of a top and bottom duplex building with portions removed.

FIG. 43 shows a top and bottom duplex building 2 with the top floor duplex being accessed by use of stairs 57.

Figure 44:
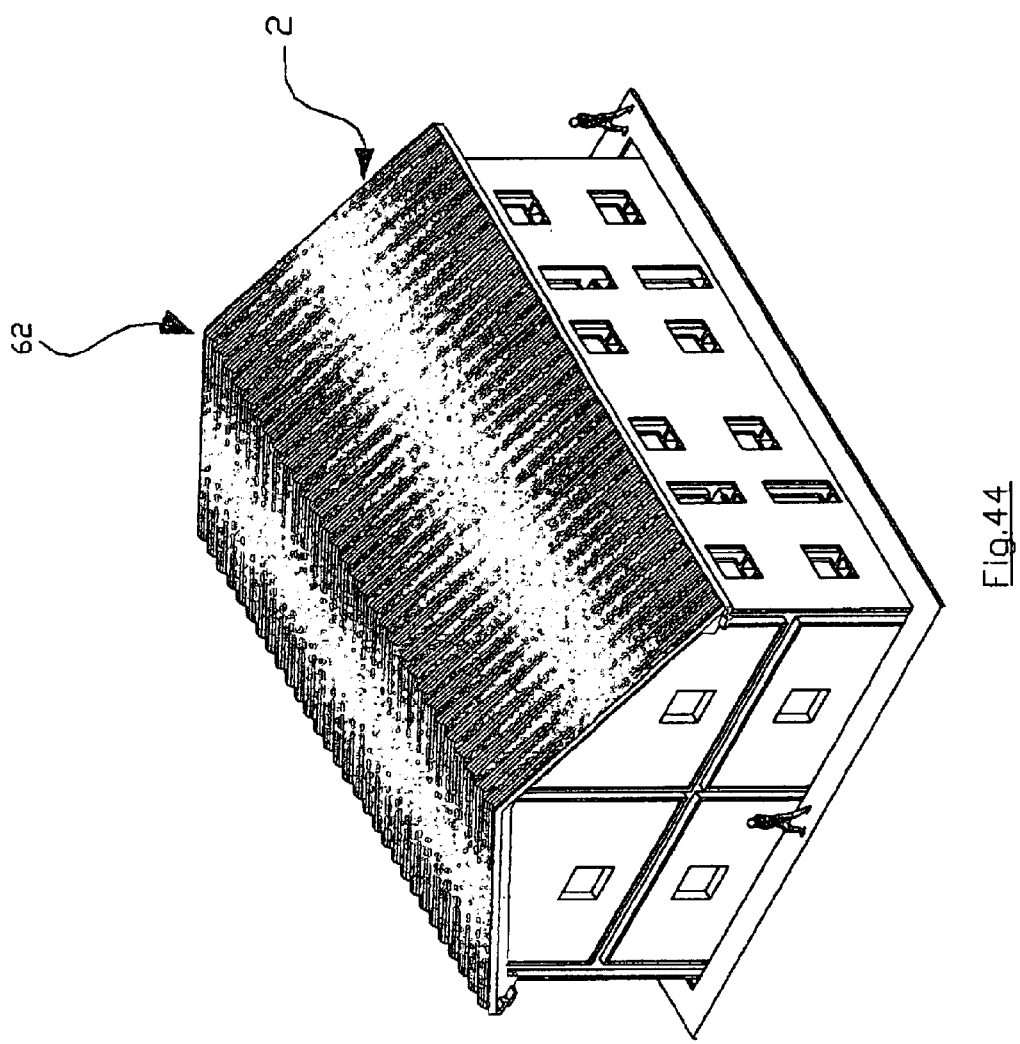
FIG. 44 is a perspective view of an eight unit building.

FIG. 44 shows an eight-unit building with the outer upper unit stairs omitted. There are four units front to back in this design. The roof 62 is formed by shaping the foam to mimic traditional roofing such as Spanish roofing tiles here.

There can be as many floors as desired built using the I or C-Beam technology of this invention.

Figure 45:
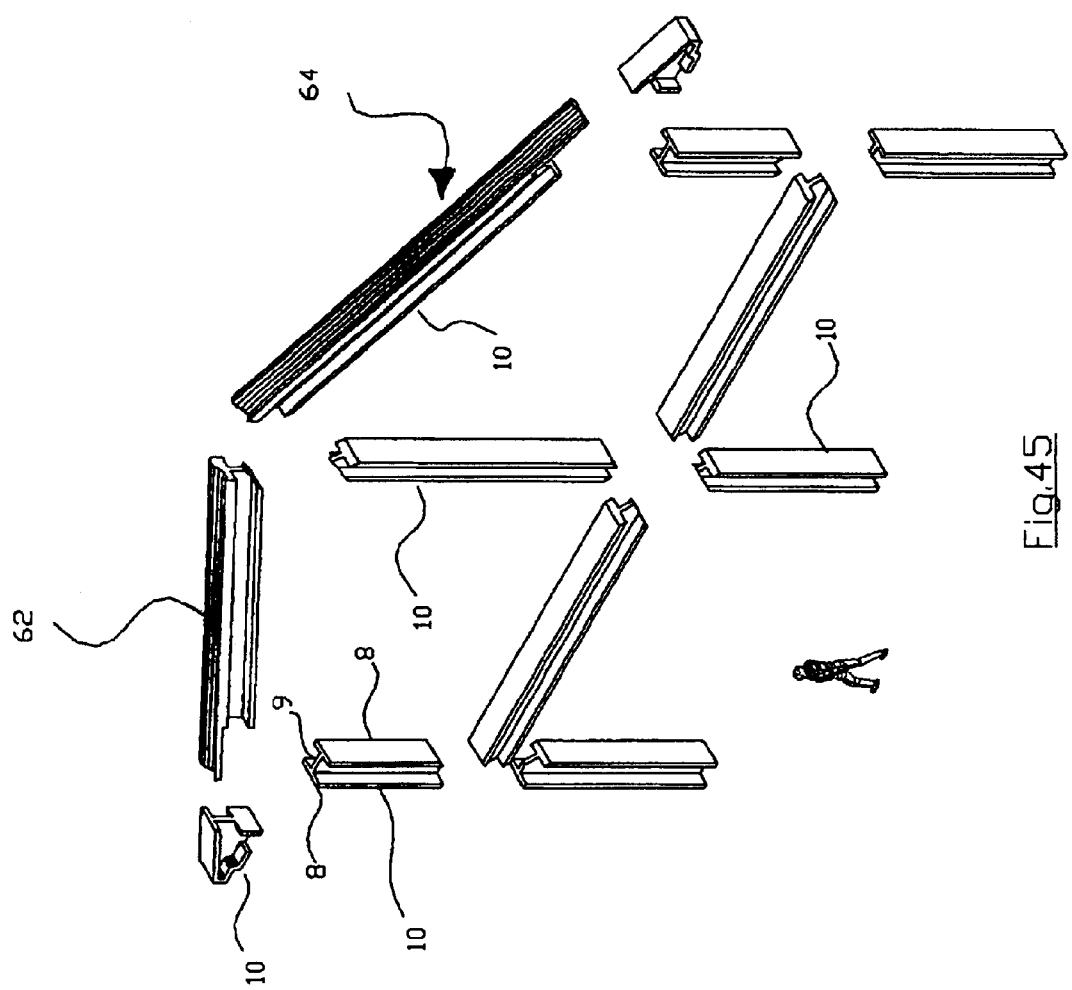
FIG. 45 is an exploded perspective view of a slice with a shaped roof.
Figure 46:
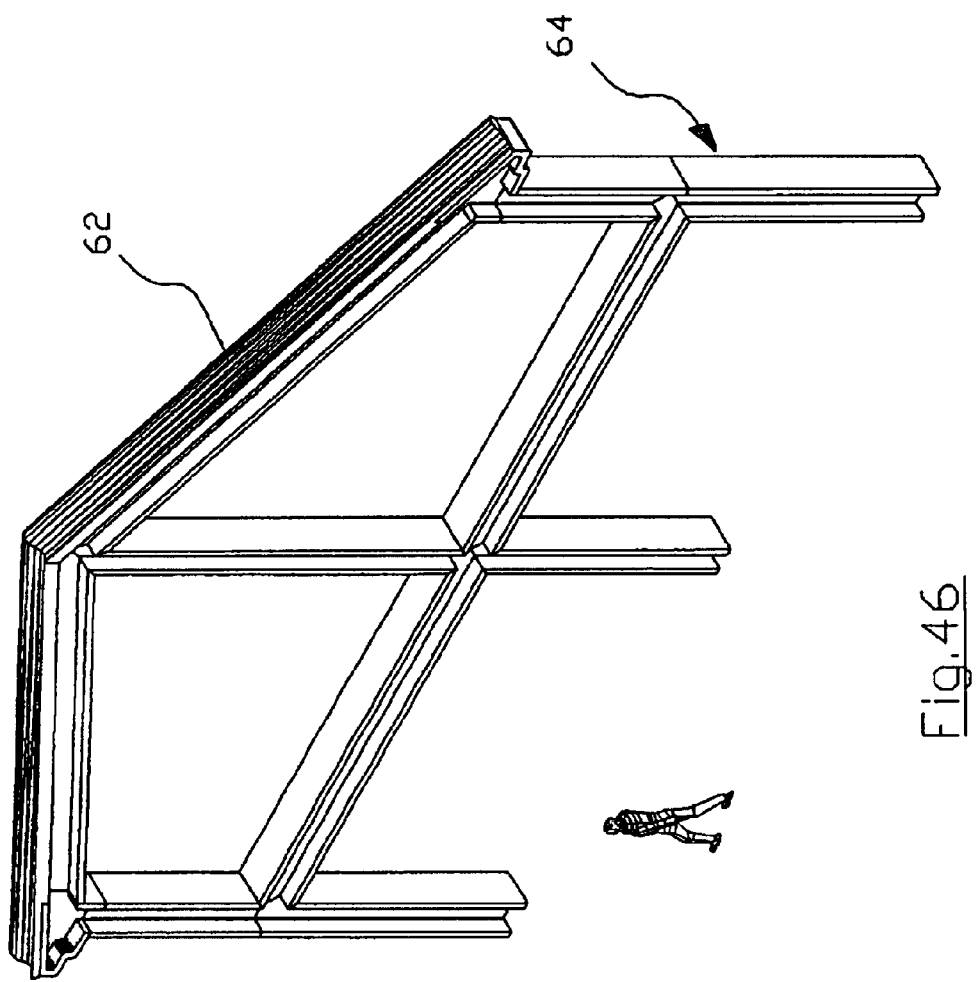
FIG. 46 is a perspective view of the assembled slice of FIG. 45.

FIGS. 45 and 46 show a full I-Beam slice 64 with a shaped roof 62. The I-Beam 10 has flanges 8 and web 9.

FIGS. 47, 47A show a modified dowel 25'. Dowel 25' has a bottom portion A that is not tapered and a top portion B that has a taper, such as a 2% taper. The dowel can be three feet long. FIG. 47A shows the dowels 25' in place.

FIG. 48 shows a cross-sectional view of a slice wall positioned on a footing in more detail. The four inches of SCM or foam 5 is usually four inches of EPS.

Figure 49:
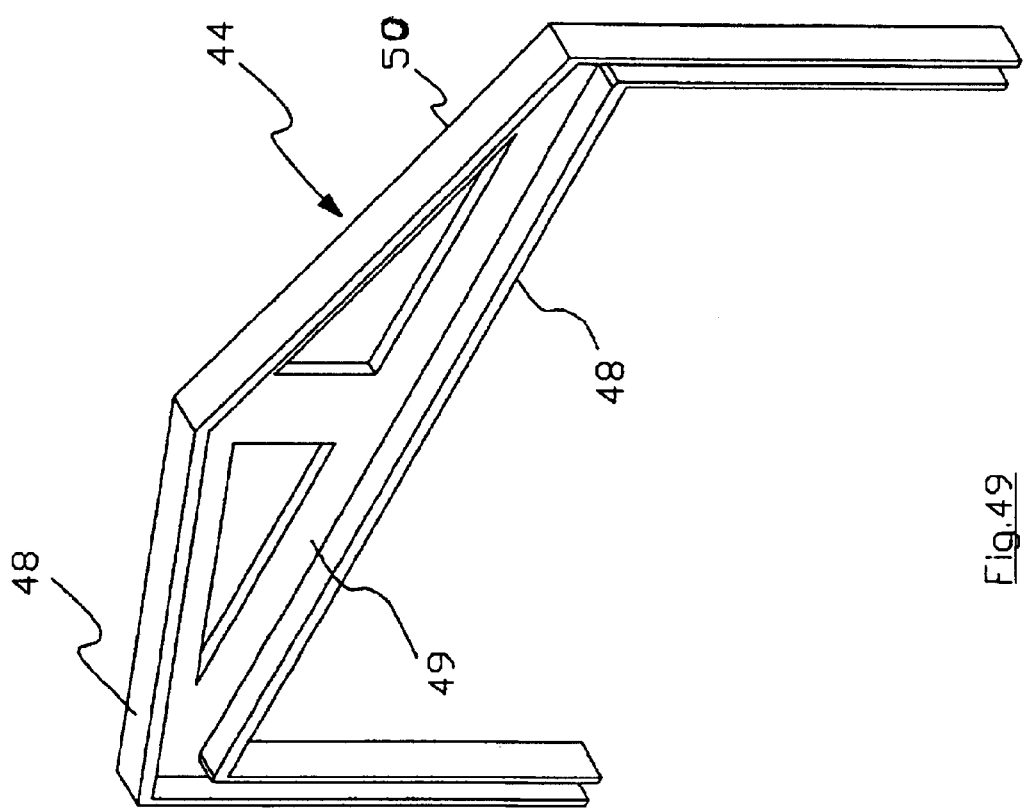
FIG. 49 is a perspective view of another embodiment of the C-Beam slice.

FIG. 49 shows a perspective view of another embodiment of the C-Beam 50 showing a full slice 44. In this embodiment, the web 49 is made larger and has portions that are omitted. This configuration is very strong once it is joined to other slices.

Figure 50:
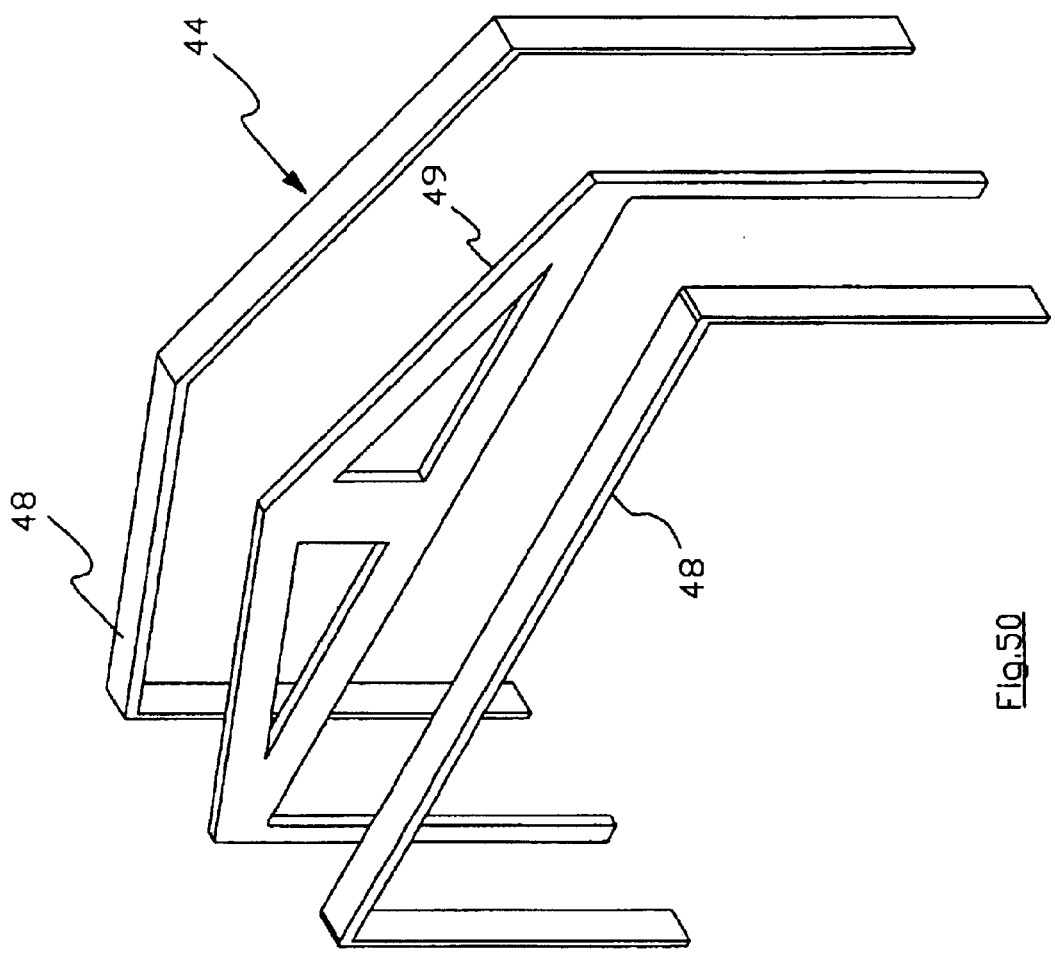
FIG. 50 is an exploded perspective view of the slice.

FIG. 50 shows an exploded perspective view of the foam pieces making up the C-Beam full slice 44.

Figure 51:
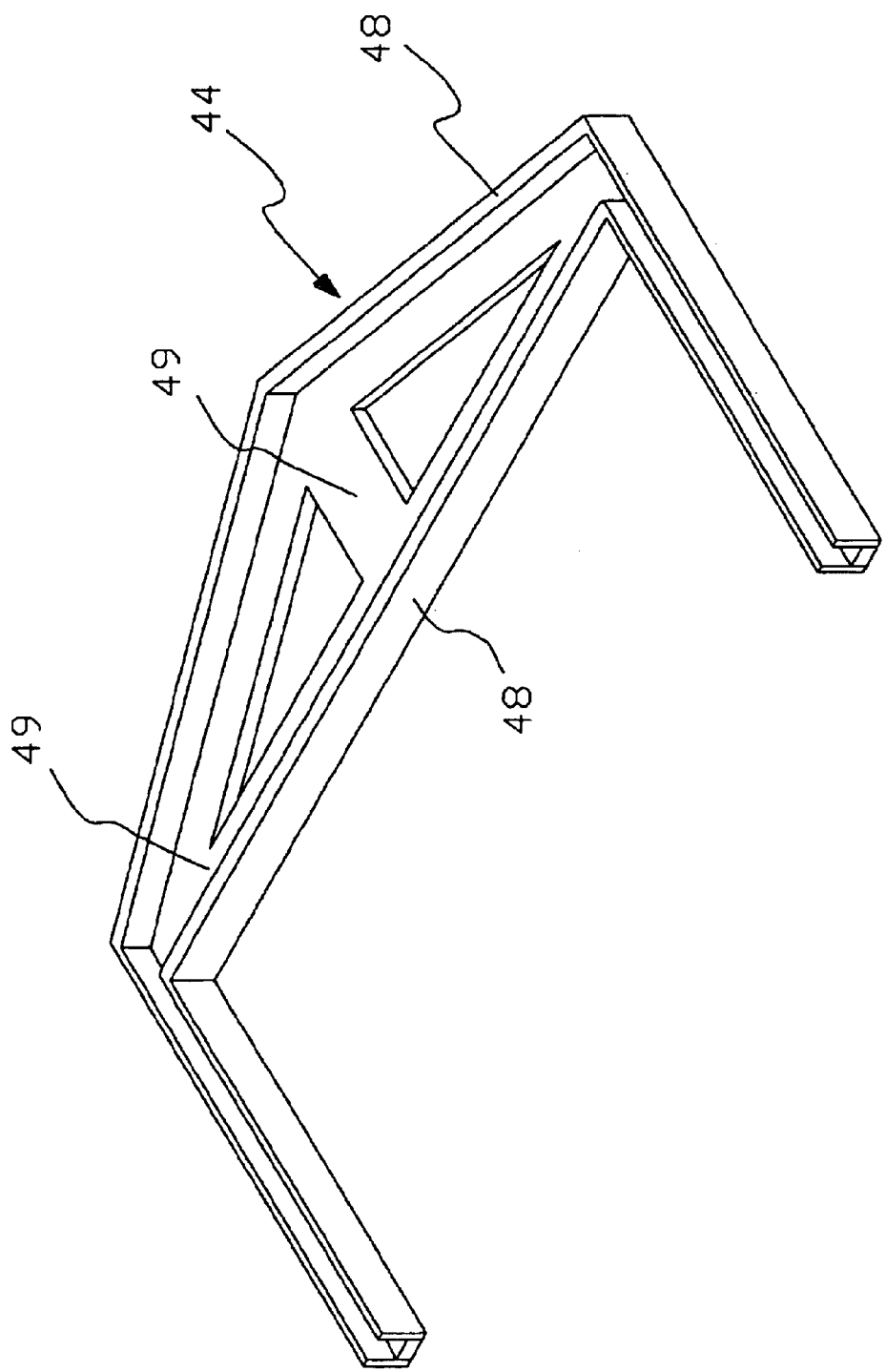
FIG. 51 is a perspective view of the slice in the horizontal plane after assembly.

FIG. 51 shows a perspective view of the assembled C-Beam full slice 44 of FIG. 49A horizontally positioned.

Figure 52:
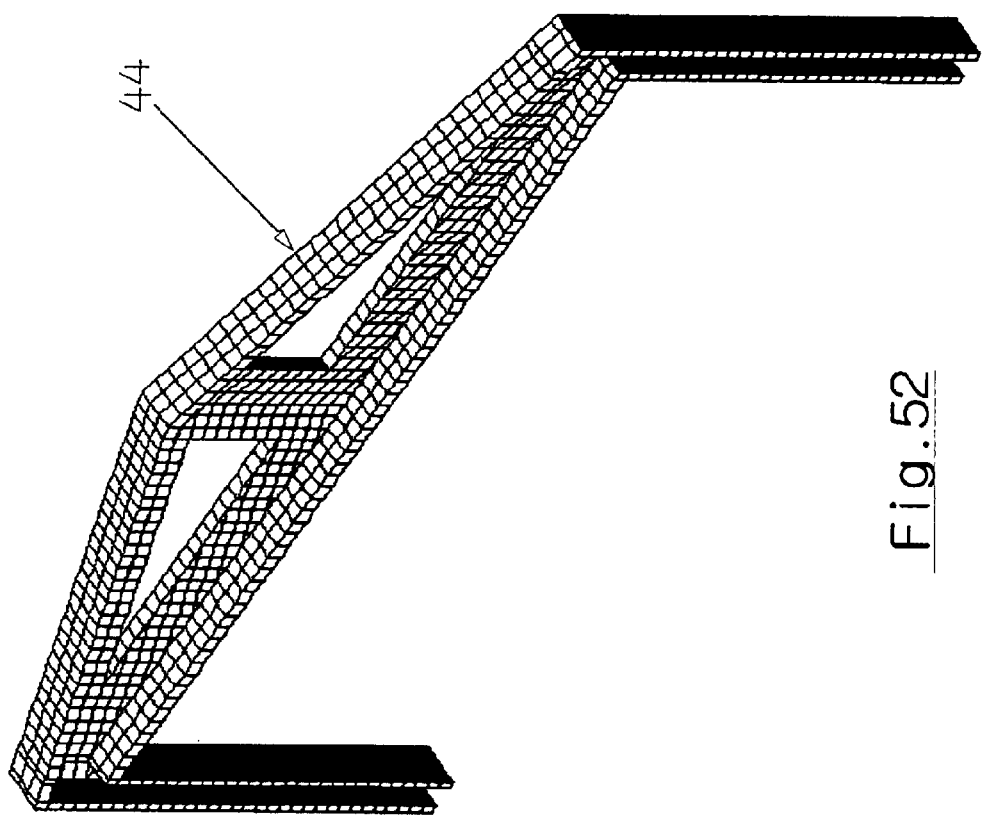
FIG. 52 is a perspective view of the slice meshed into bricks for FEA purposes.

FIG. 52 shows a perspective view of the C-Beam full slice of FIG. 49. The slice is divided into bricks for the purpose of FEA (Finite Element Analysis).

Figure 53:
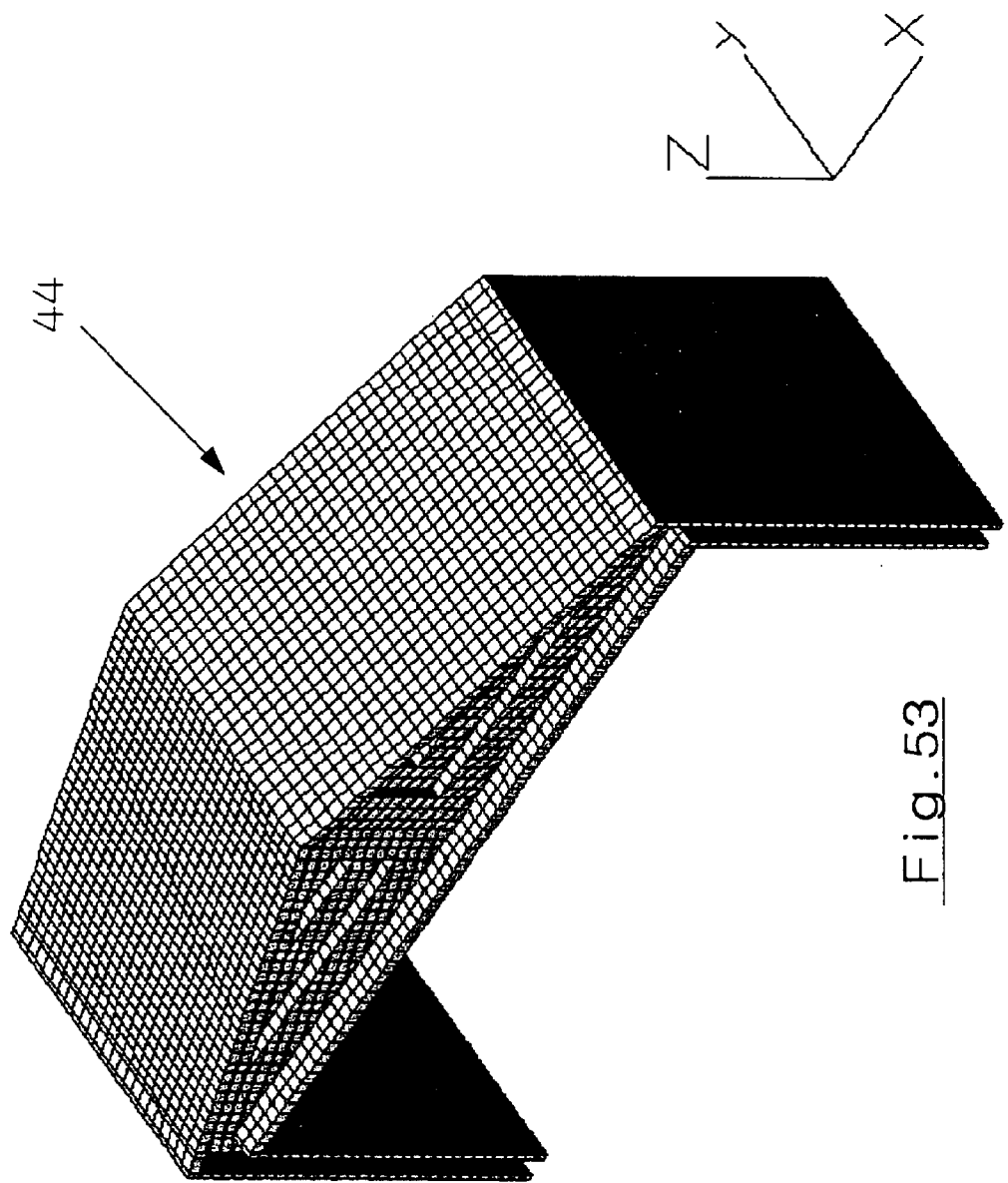
FIG. 53 is a perspective view of several meshed slices joined together for FEA.

FIG. 53 shows several slices 44 joined together and divided into bricks for FEA.

FEA Analysis

Calculation of deformation, strains, and stresses of buildings of conventional design is performed by classical methods of analysis by considering their framing structure as a continuum whose behavior is governed by partial or ordinary differential equations. Most conventional buildings, which have three components system (structural framing, interior, and exterior material) fit into simple mathematical modeling formats which, can be analytically solved by classical methods. However, the invention's structures using a composite of foam—concrete in the construction are complex to analyze. They do not fit into a simple mathematical format and can not be solved classically. Therefore a finite element analysis which is a computerized method for predicting how an object will react to forces, heat, vibration, etc., will be employed. The finite element method works by breaking a real object down into a large number (1000s or 100,000s) of elements, such as little cubes. The behavior of each little element, which is regular in shape, is readily predicted by set mathematical equations. Then the computer adds up all the individual behaviors to predict the behavior of the actual object. The "finite" in finite element analysis means there are a finite number of elements in a finite element model. A node is a coordinate location in space where the degrees of freedom (DOF) are defined. The DOF of this point represent the possible movement of this point due to the loading of the structure. The DOF also represents which forces and moments are transferred from one element to the next. Also, results of an FEA (deflections and stresses) are usually given at the nodes. An element is the basic building block of finite element analysis. There are several basic types of elements. Which type is used depends on the type of object that is to be modeled for finite element analysis and the type of analysis that is going to be performed. An element is a mathematical relation that defines how the degrees of freedom of a node relate to the next. These elements can be lines (beams), areas (2-D or 3-D plates) or solids (bricks). It also relates how the deflections create stresses.

Figure 54:
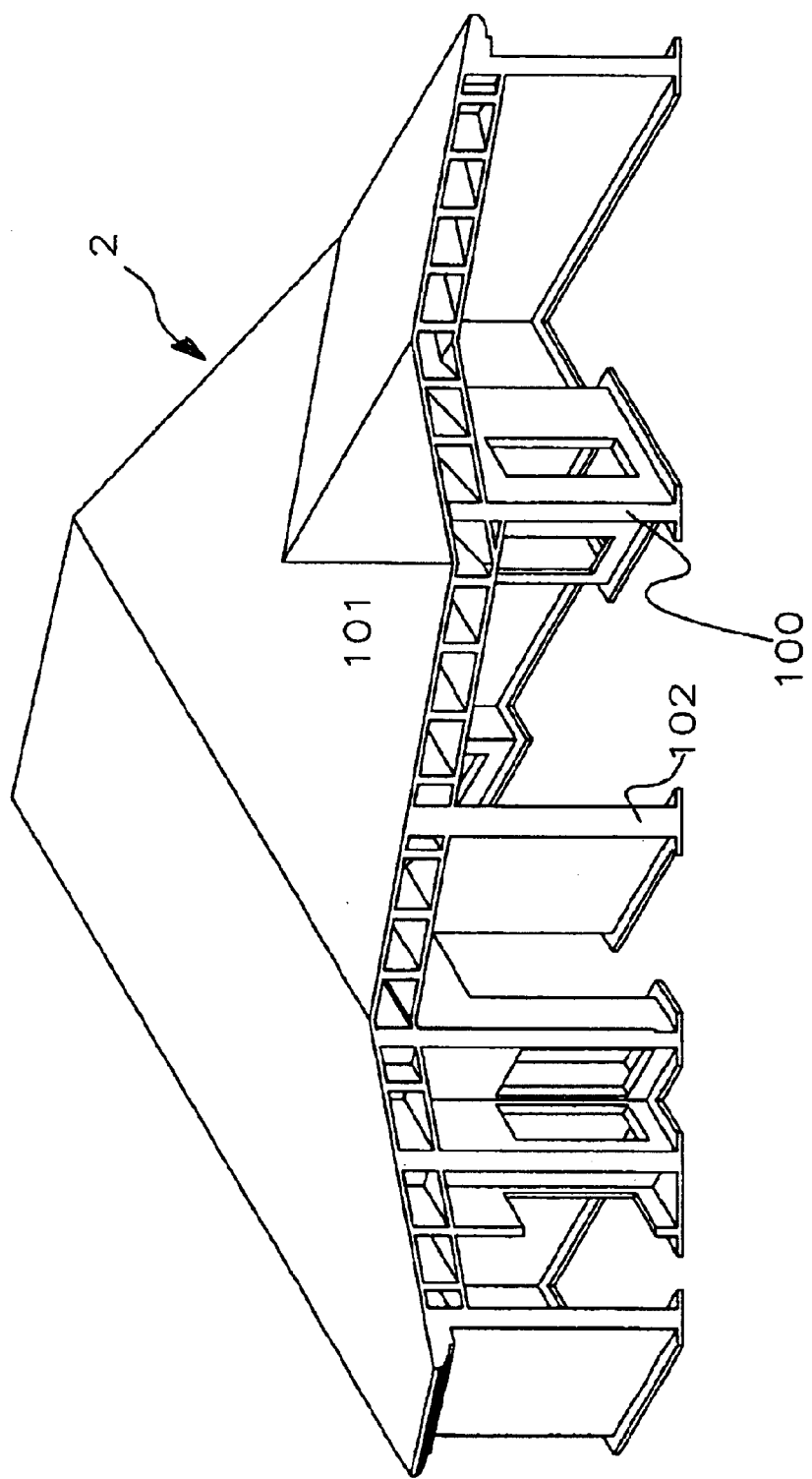
FIG. 54 is a perspective cut view of a different embodiment of an EPS composite building with flat Ceiling System.
Figure 55:
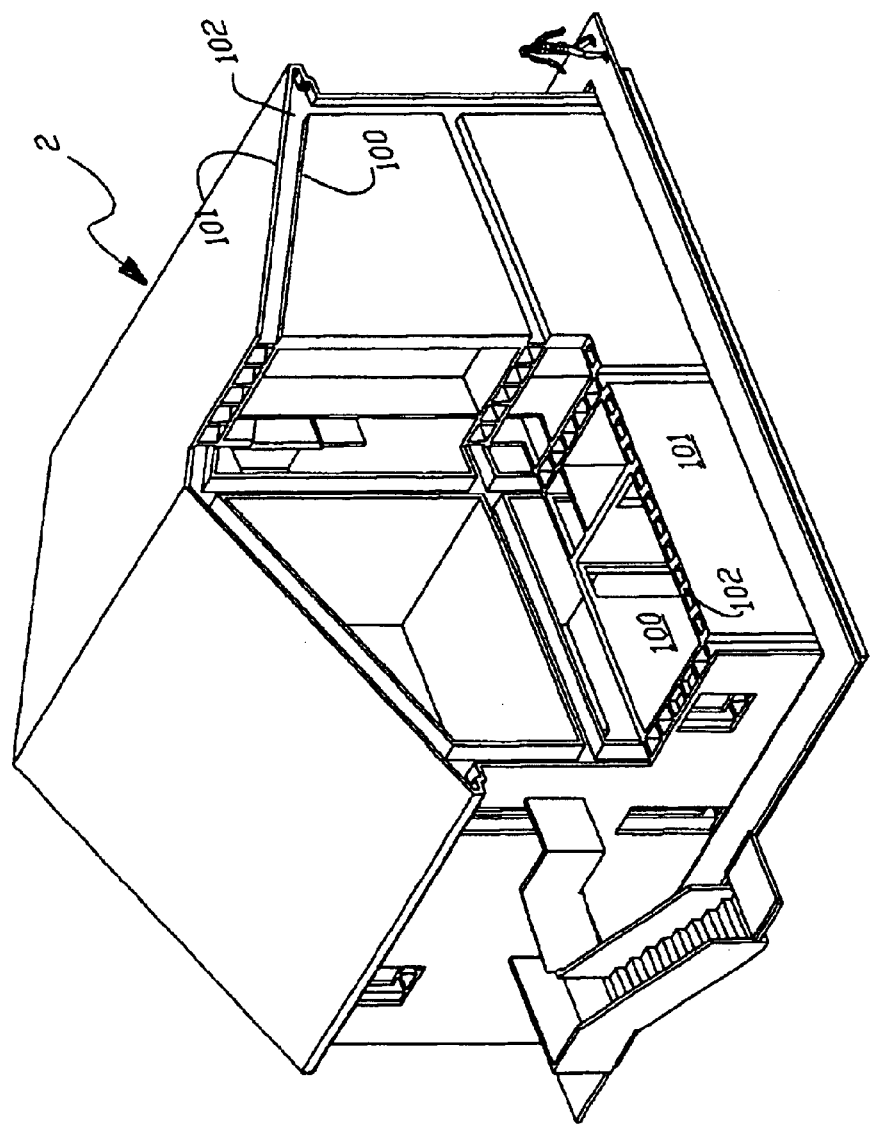
FIG. 55 is a perspective cut view of embodiment of an EPS composite two story building with C or I cross-section slice construction.
Figure 56:
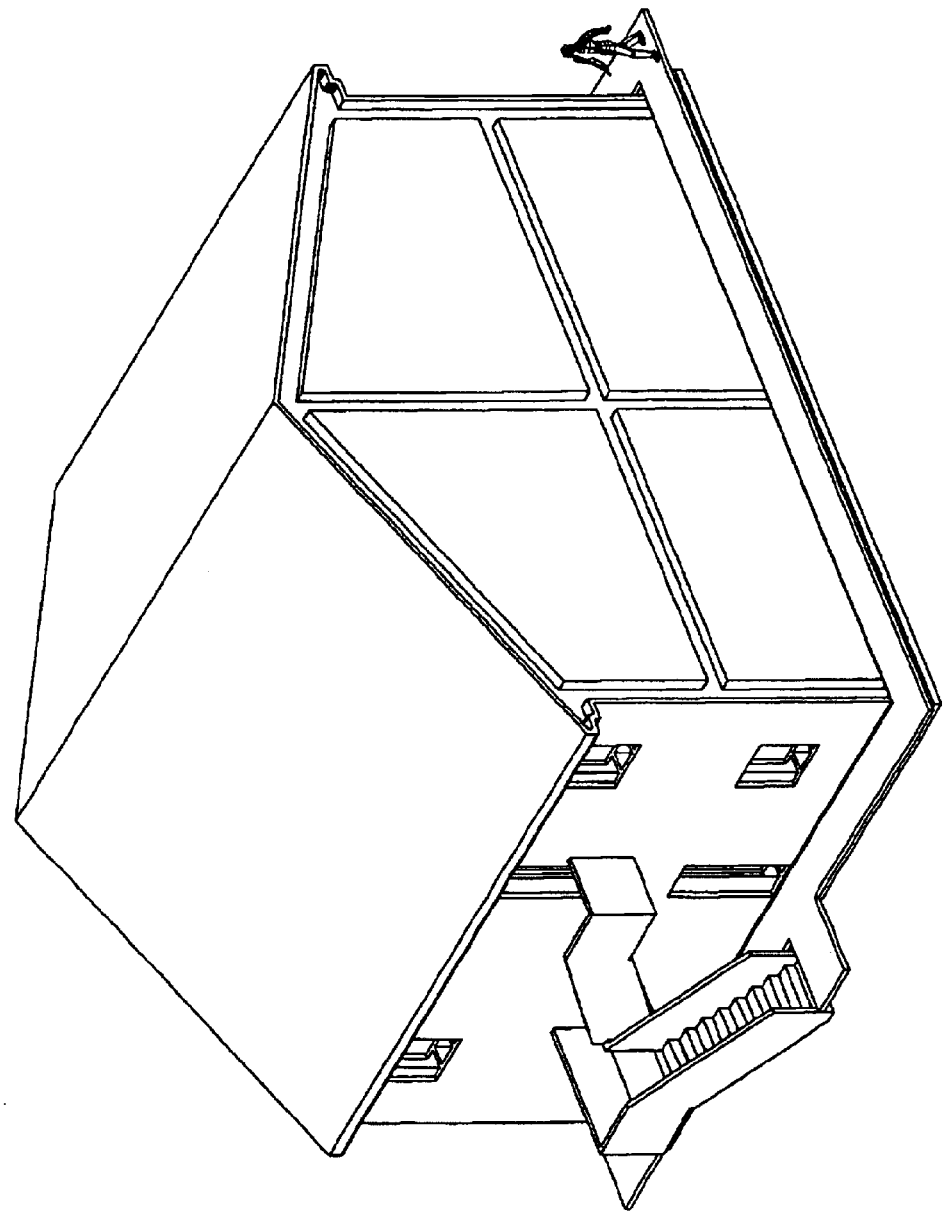
FIG. 56 is a perspective view of embodiment of FIG. 55.
Figure 61:
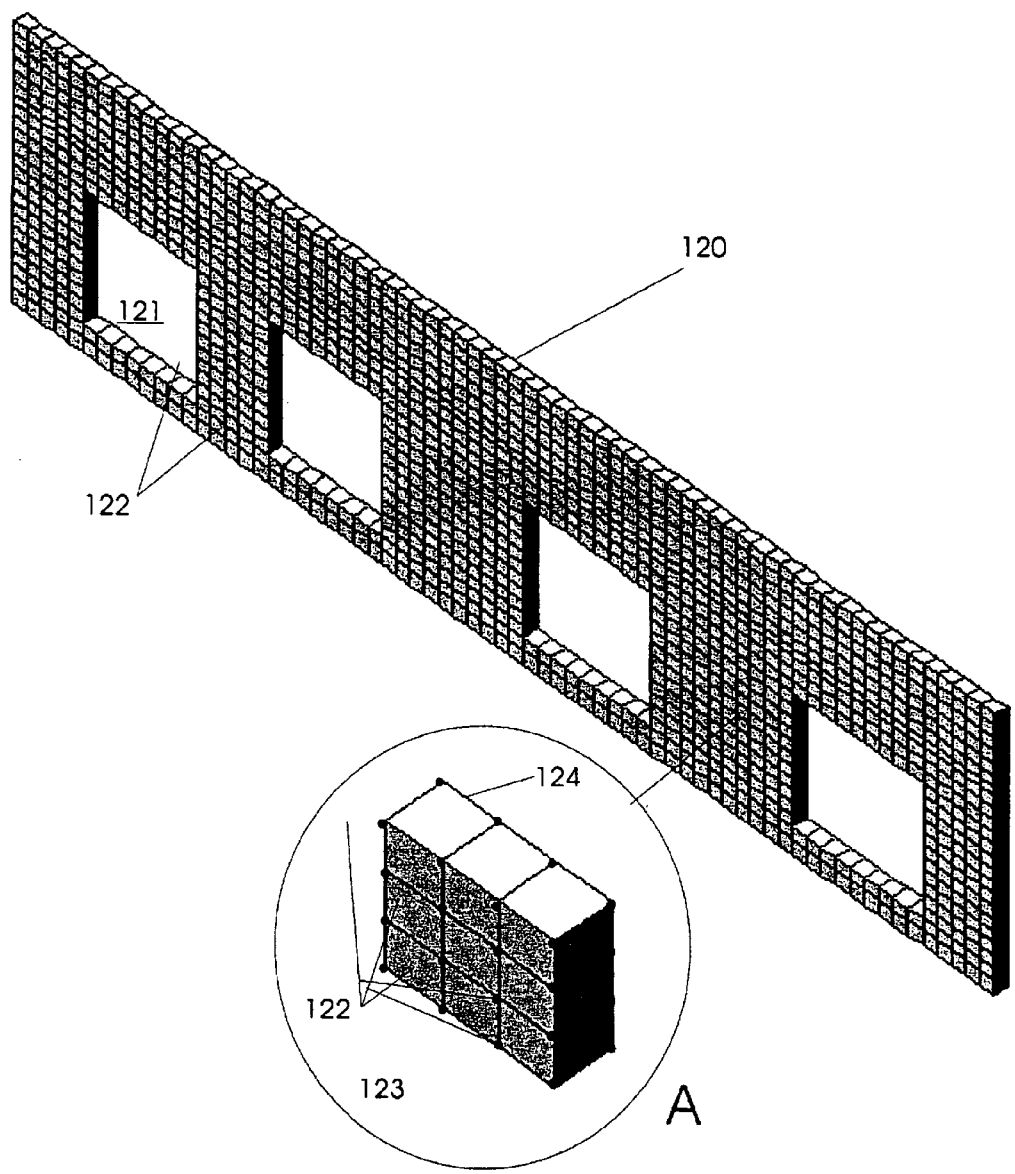
FIG. 61 is a perspective view of FEA model of Group 1 (North Wall 120).

The ceiling and roof and sometimes the walls of the inventive buildings 2 have two separate thick layers of EPS 100, 101 connected with a third thick layer of EPS forming ribs 102 shown at (FIG. 54) and (FIG. 55). The behavior of such a system can only be analyzed by dividing the whole structure into discrete size elements called finite elements. Such finite elements are assumed to be connected together by the connection points, which are common to each element (FIG. 61). Such connection points are called nodes 123 as seen in FIG. 61. Each finite element 124 is made of lines (mesh) connecting their nodes. The Finite element method considers the structure to be an assembly of small finite-sized volumes or bricks. Through FEA method, the behavior of the volumes and the overall structure is obtained by application of algebraic equations of equilibrium with computers. In the FEA method of analysis the assembly of elements which makes up the structure is a continuum with physical properties such as weight, modulus of elasticity, coefficient of expansion, etc. To solve the composite building by finite element analysis involves seven steps. The seven steps are defined in the next sections. The rest of the steps are automatically performed by computer software. The steps of Finite Element Analysis for our purposes are as follows:

1. Discrete or model the structure
2. Define the element properties
3. Assemble the element stiffness matrices
4. Apply the loads
5. Define the boundary conditions 6. Solve the system of linear algebraic equations
7. Calculate the stresses Step One Modeling To predict the structural limits of the inventive buildings 2, the building is divided into small brick elements or volumes FIG. 58.

The 3-D model in the CAD program is divided into small volumes. The volumes can be on the order of 0.1–12 inch volumes of the actual or full sized building. That is, the model is sliced in close parallel planes in the x-y, x-z, and y-z planes of a Cartesian co-ordinate system using the CAD program. This process is called meshing.

The meshing can be done by exporting the CAD model of the inventive buildings 2 for example FIG. 57 in a format acceptable to a FEA (Finite Element Analysis) software program. After importing the CAD model, it must be cleaned by removing all duplicate lines automatically or manually. Some FEA software has features which allow meshing of the CAD models thereby providing the division into small volumes (discretization) of the entire model automatically. However, the results of automatic meshing in the case of the inventive buildings usually are unsatisfactory. The FEA software programs automatic meshing process creates many discrete volumes that are too thin and too long (slivers). Such slivers will not allow for an accurate solution to the analysis. In the future this may be possible, but for now, the buildings 2 of the invention must be manually meshed to discretize the model. Thus, it is necessary to divide the CAD model manually.

This could be accomplished in two ways. One way of subdividing the CAD model is to slice the model into discrete volumes within the CAD program software. The data representing the discrete volumes is "exported" into an interface program to reformat the discrete volumes data so that it can be read by a finite element analysis (FEA) program. Suitable interface programs are IGES™, ACIS™ or Parasolid™. The reformatted data is then "imported" into a FEA program. Suitable FEA programs are ME NASTRAN™, ANSYS™ or ALGOR FINITE ELEMENT™.

Figure 58:
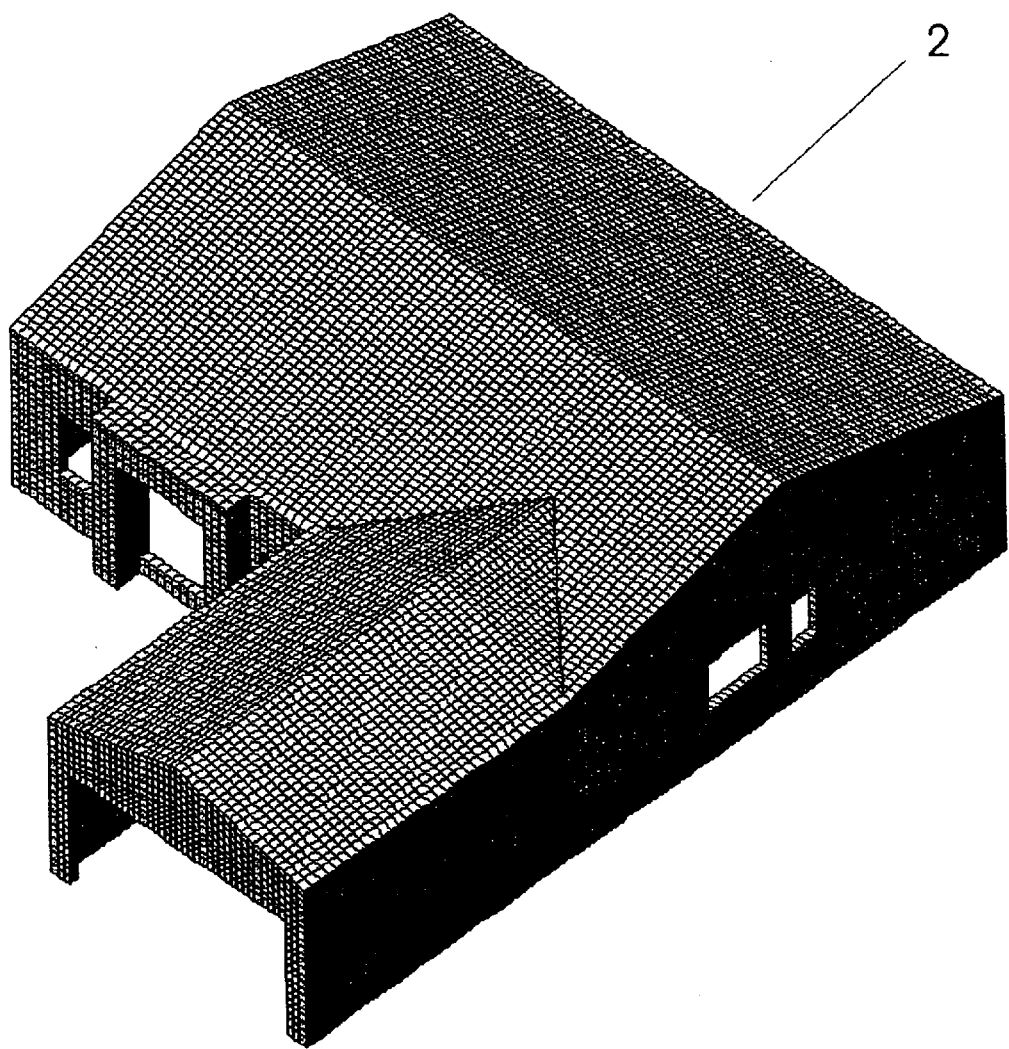
FIG. 58 is a perspective view of an FEA model of the building of FIG. 57.
Figure 59:
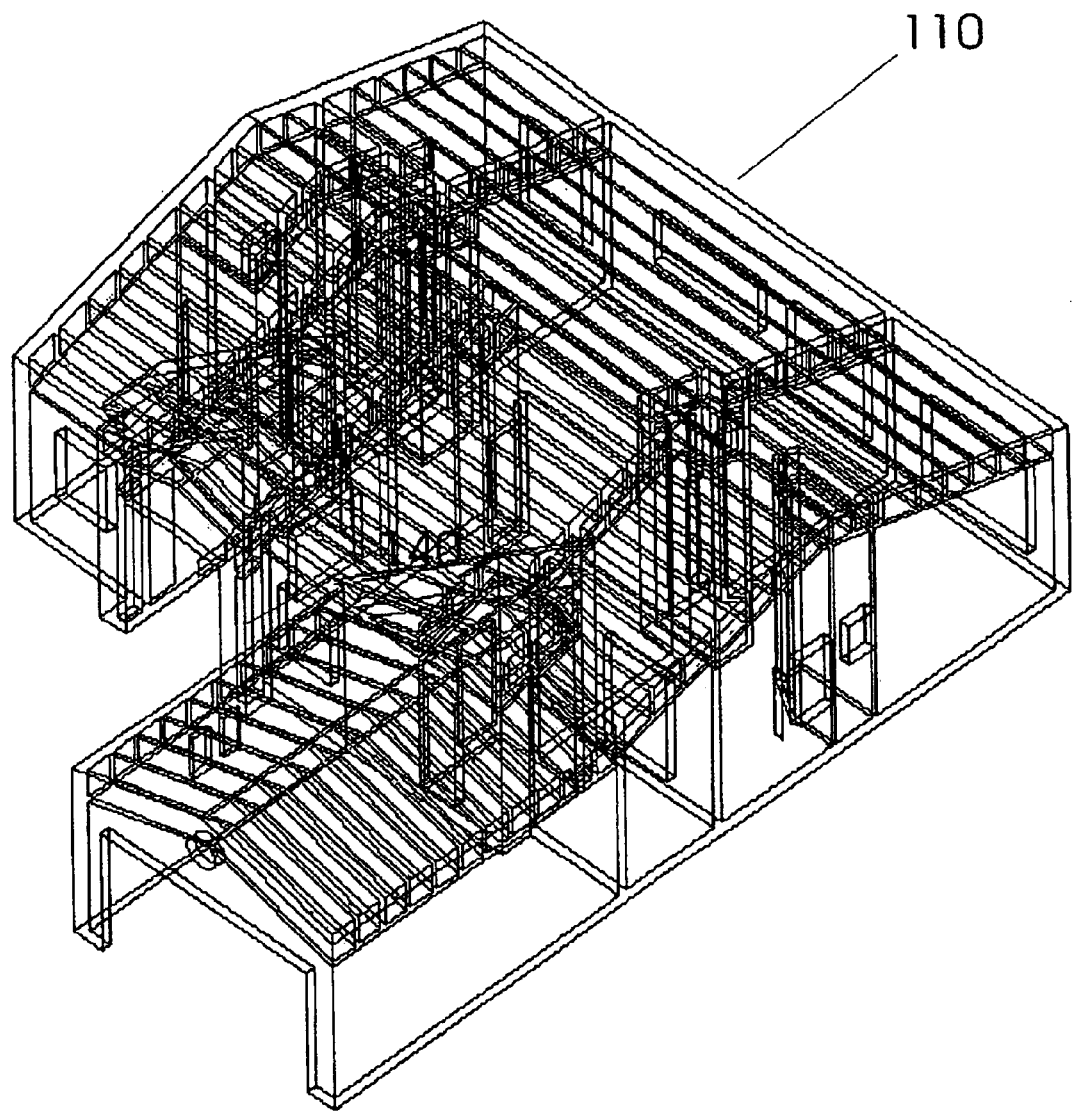
FIG. 59 is a perspective view of the outline of the building of FIG. 57 imported from AutoCAD program into Algor FEA Software.

The second method of dividing the inventive building 2 into finite elements is to draw up the building in the Finite Element Analysis software. This is accomplished by importing the outline of the inventive building in dfx format into the FEA software and then splitting it into smaller discrete sizes by manual manipulation. The building 2 shown in FIG. 57is simplified before being imported by removing the decorative features of facade. For example, the meshing of building 2 of FIG. 58, is carried out by importing the 3D Cad model of FIG. 57 in a dfx format, which is a format recognized by the FEA software (in this case Algor 12 software) The CAD model 110 is shown in FIG. 59.

Figure 60:
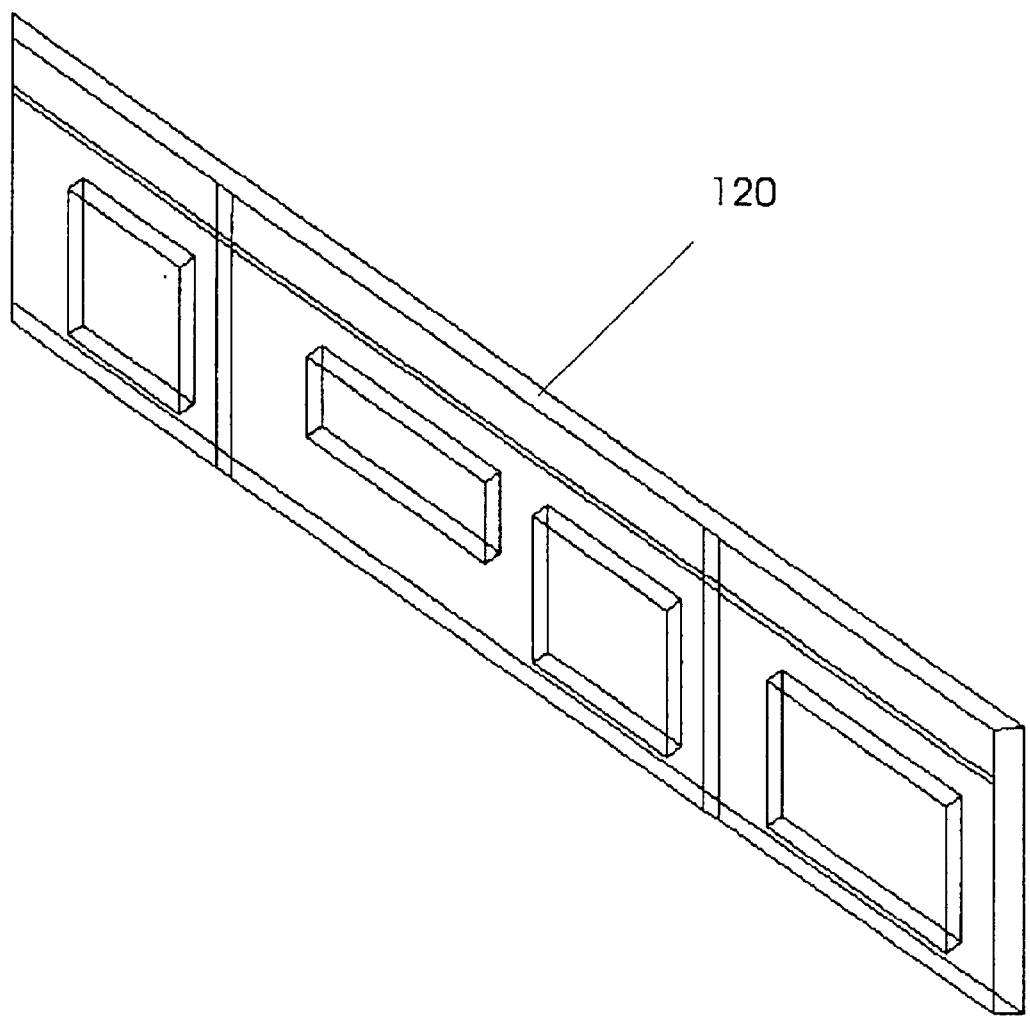
FIG. 60 is a perspective view of Group 1 (North Wall 120) in the FEA program.

The next step is to group all walls, ceiling and roof sections of the structure into separate groups so that each group can be isolated for meshing. Each group is given a different color. There are 255 Groups in Algor 12 software. Each group is given a different color starting with Green as Group 1 and Red as Group 2. The first set of lines shown in FIG. 60 is chosen, as Group 1 colored green. This Figure represents the entire North wall 120 of the building. The North wall 120 is then divided into discrete elements by actually dividing each line. To make the division of the lines, each line is highlighted within the FEA program and the Divide Command is invoked after a number of divisions is entered. Dividing starts from the window areas 121 and working outward toward the boundaries of the wall 120. The results of the construction of FEA elements is shown in FIG. 61. The entire North wall 120 is made of discrete elements 122 having eight nodes 123 at the corners forming shapes resembling bricks, which are called brick elements. The elements 122 of the entire wall can be of equal or unequal size. Depending on the configuration of the wall or the component of the building that is being meshed, the FEA elements will be of varying size and shape. The elements will vary from three node elements to eight node elements.

Once the first wall (North) 120 is completed, it is used as the base for the adjacent wall 130, which is the West wall. All the neighboring nodes 123 of adjacent walls 120, 130 and others have to precisely match, thereby becoming common nodes.

Figure 62:
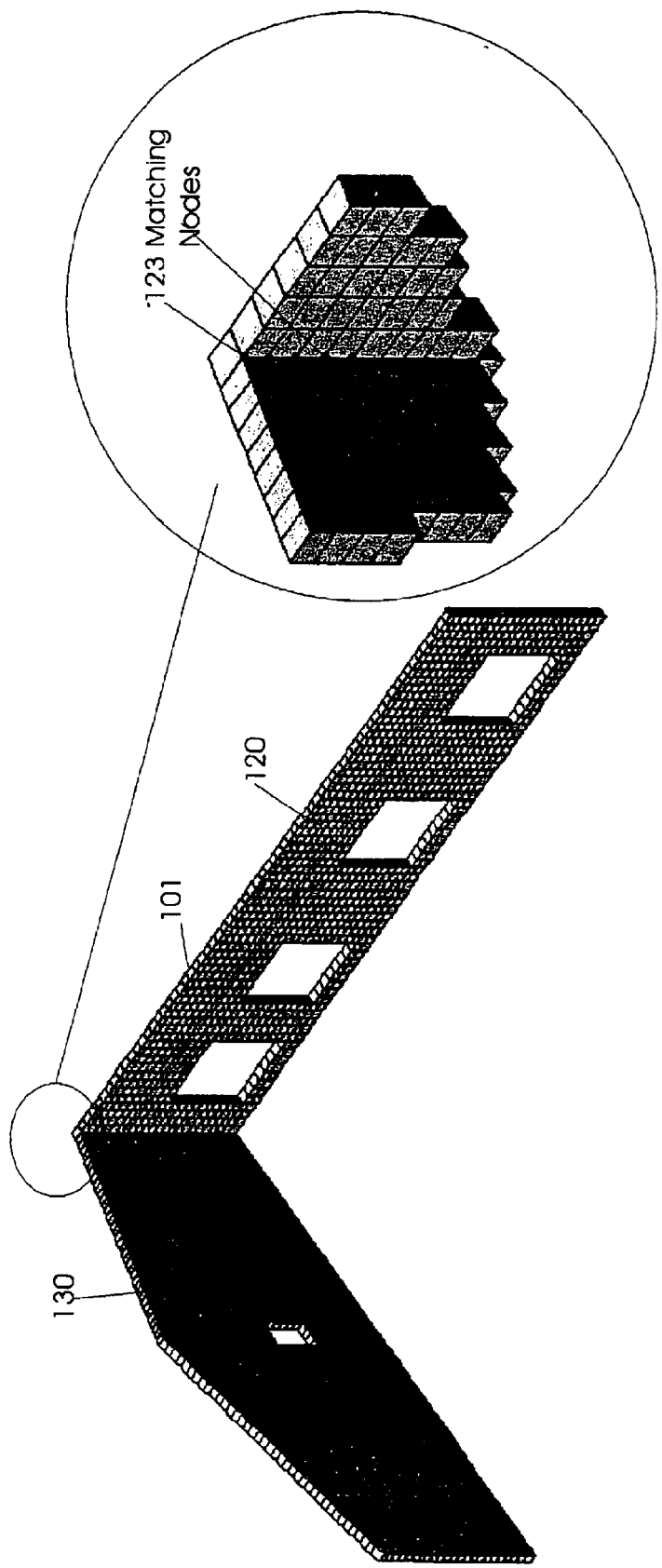
FIG. 62 is a perspective view of the embodiment of elements in Groups 1 and 2 (North 120 & West 130 Walls).
Figure 63:
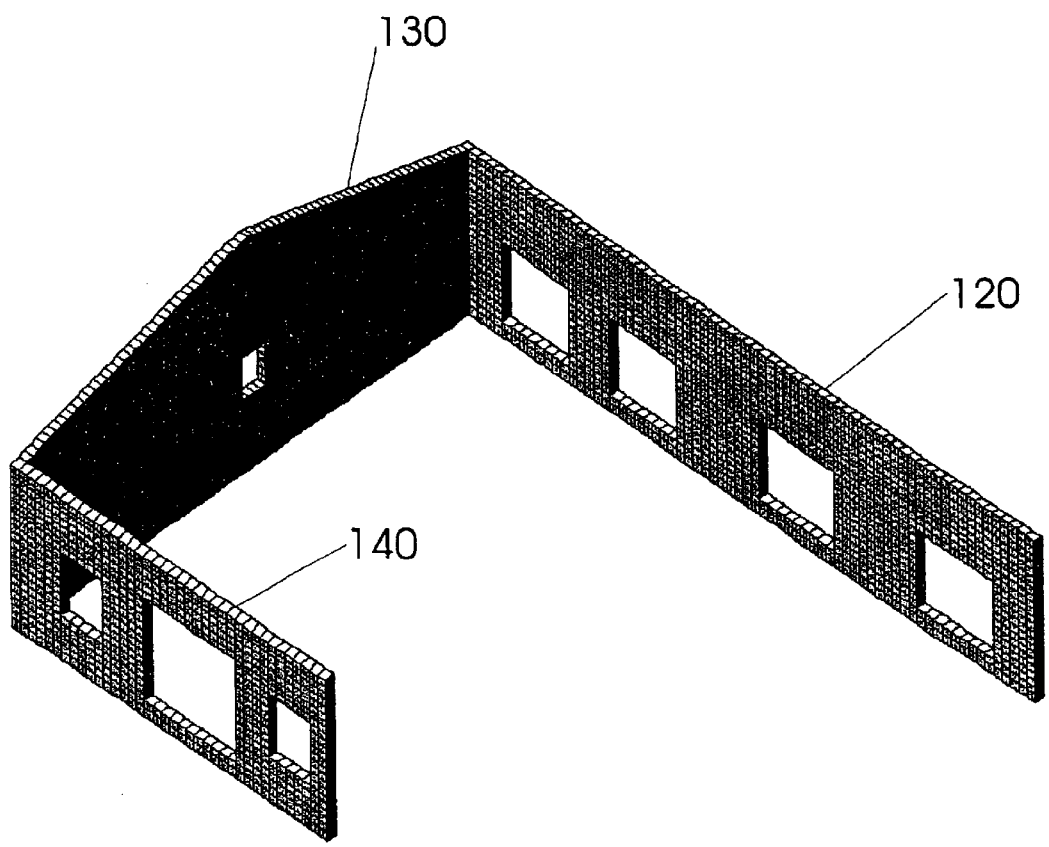
FIG. 63 is a perspective view of FEA model of Groups 1, 2 and 3 (North, West and partial South Walls).
Figure 64:
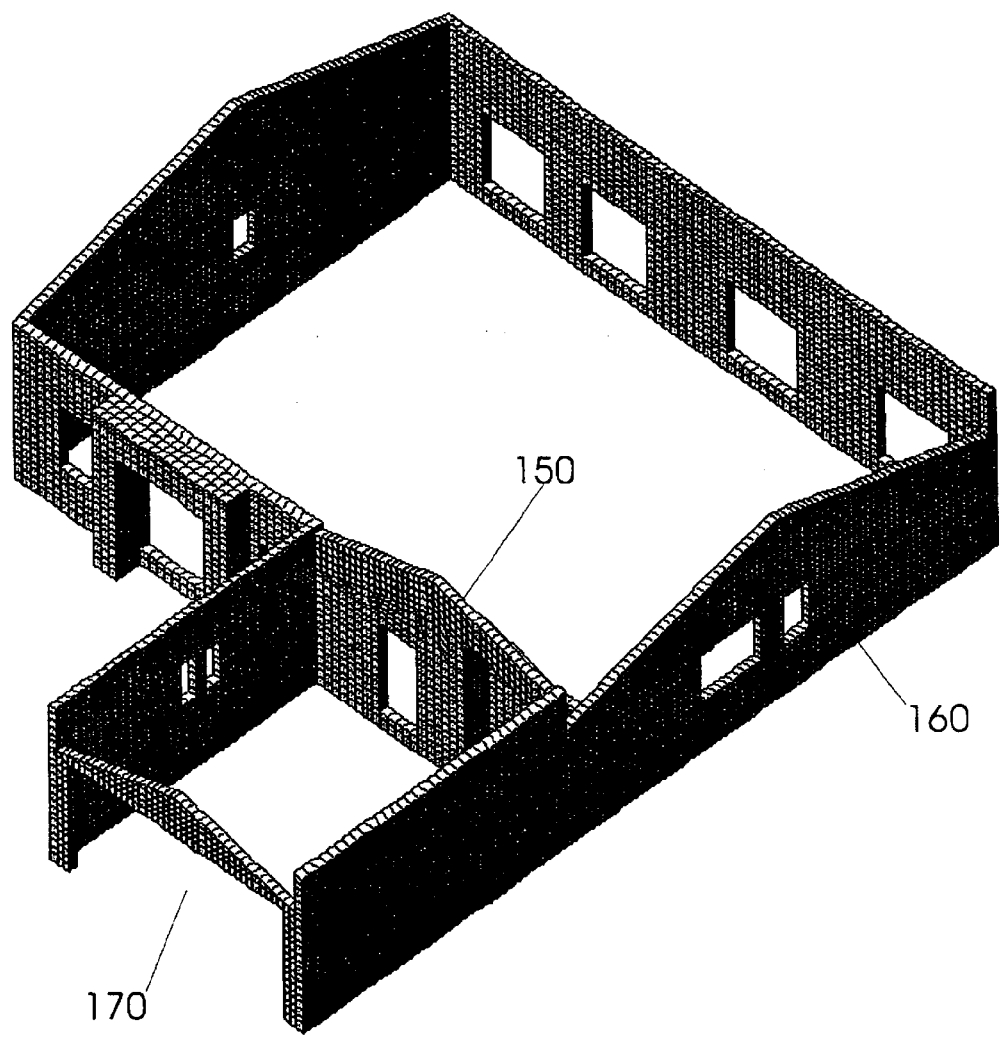
FIG. 64 is a perspective view of the meshed lines of the exterior walls of the same building.

The combination of North and West walls 120 and 130 is shown in FIG. 62. The volumes or bricks 122 are made as wide as the walls in thickness. In the case of the model shown, the actual exterior walls are made from 8 inch Expanded Polystyrene (EPS) foam. Similarly, the South walls 140 and all other exterior walls 150, 160 are shown in FIG. 63 and FIG. 64, respectively.

It is important to note that all of the nodes of adjacent elements must match. Otherwise, the application of mathematical equations constructed for the model by the FEA software will fail or go to a never ending loop without resulting in a solution.

The FEA elements of opposite walls must line up with each other. For example, the North and South walls 120 and 140 have exactly the same number of columns of bricks from the lowest part of the wall to the highest areas of the wall at the rooflines. This is because the roof elements have to match with the wall bricks everywhere and the mesh lines of the interior partitions must match the mesh lines of the exterior walls from the lowest bricks at the bottom of the walls to the highest mesh lines of the walls.

If an error in the dividing or meshing process has created a different number of bricks or elements at the roofline where the roof elements match the wall elements, then an adjustment is made to have all the nodes meet. This may occur because of an error which may happen during the process of meshing the components in different groups or it can occur because of the varying configurations of neighboring components. This adjustment can be performed by highlighting one of the nodes 123 and then moving that node over to the neighboring node 123 and dropping the moved node on top of the neighboring node. If the error is a space that should have a brick, then another way of making the adjustment is to insert a new brick element with a lesser number of line elements between the non-matching nodes.

Figure 65:
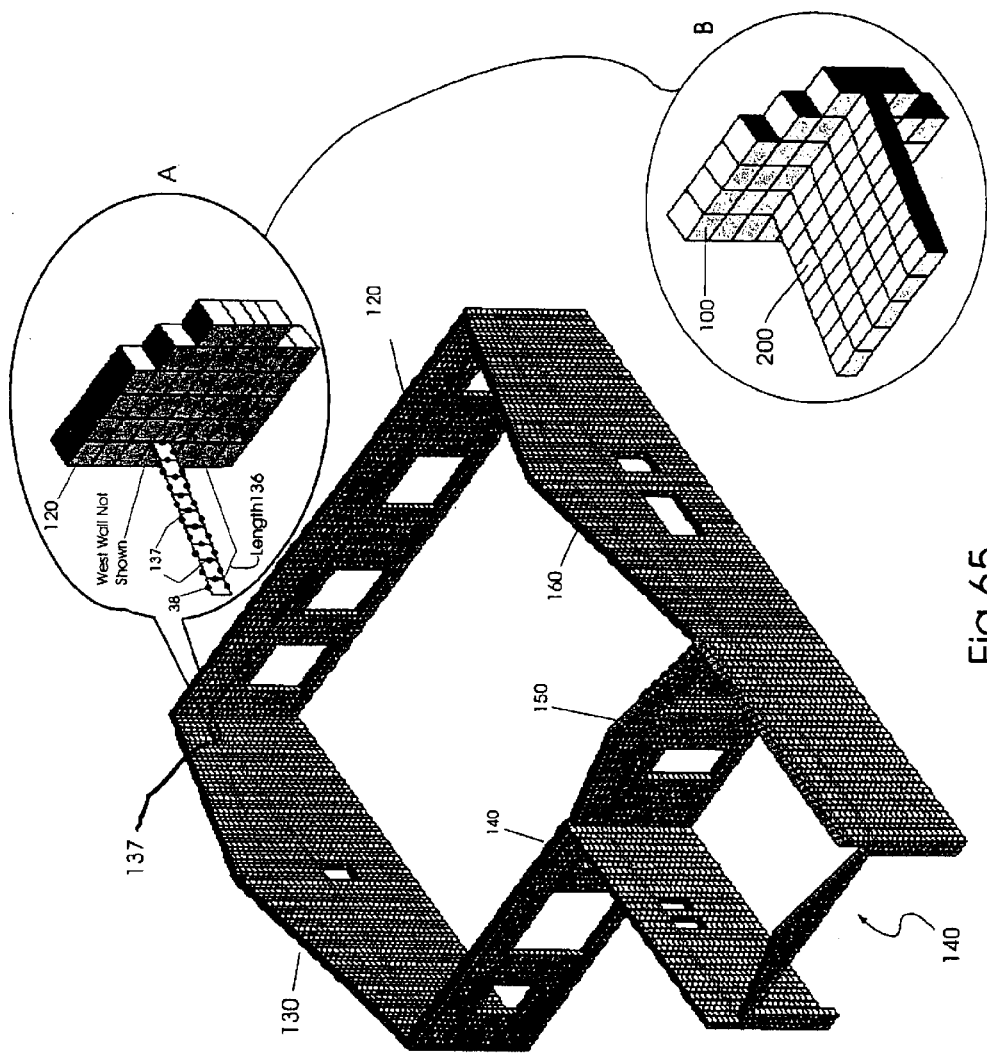
FIG. 65 is a perspective view of the FEA model of the exterior walls of a building of FIG. 57 showing the process of making the ceiling brick elements.

In FIG. 64, the non-alignment error occurs in the North wall 150 of the garage 170. The North garage wall 150 must match with the roof of the house and the roof system of the garage, so manual manipulation has been made to place the nodes in the right place. Thus brick elements with skew configuration have resulted. When modeling a component of the structure, the connection between the components must be corrected many times. For example the interior side of the wall of FIG. 60 has parallel lines depicting where the north wall connects to the Roof Group, Ceiling Group and the Interior walls. This is done to insure that all nodes of the neighboring elements throughout the structure match exactly. Once the exterior walls 120–160 are modeled (FIG. 64), next comes the first layer 200 of the ceiling. To do this we can select or highlight the outer face of line elements 137 of the West wall 130.(FIG. 65) along the area in which the ceiling 200 will intersect the wall 130. When the line elements 137 are highlighted, a dot 138 is left on the highlighted line. Then by using the copy command the lines 137 are copied to a new position of a distance 136 in the X direction by moving the lines with the JOIN ALL COPIES feature turned ON in the Algor software (FIG. 65A). By performing this operation brick elements 200 (FIG. 65B) are created.

Figure 66:
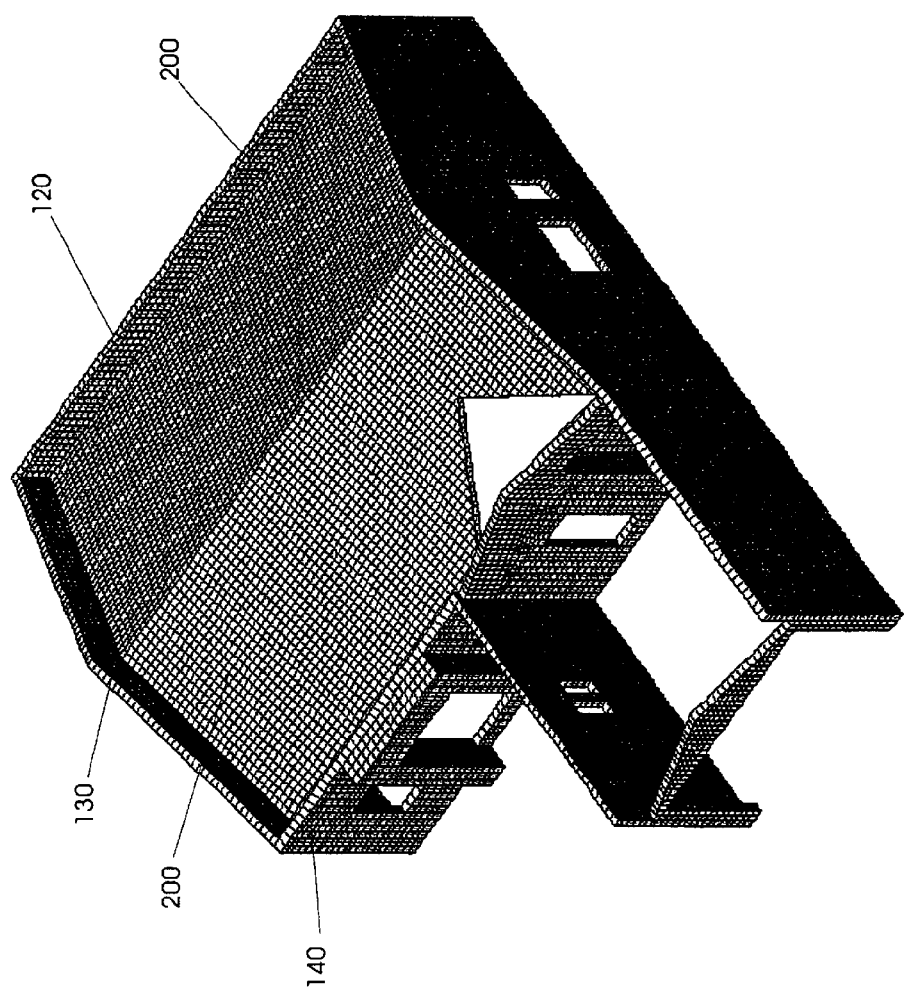
FIG. 66 is a perspective view of FEA model of the exterior walls with partial ceiling model.
Figure 67:
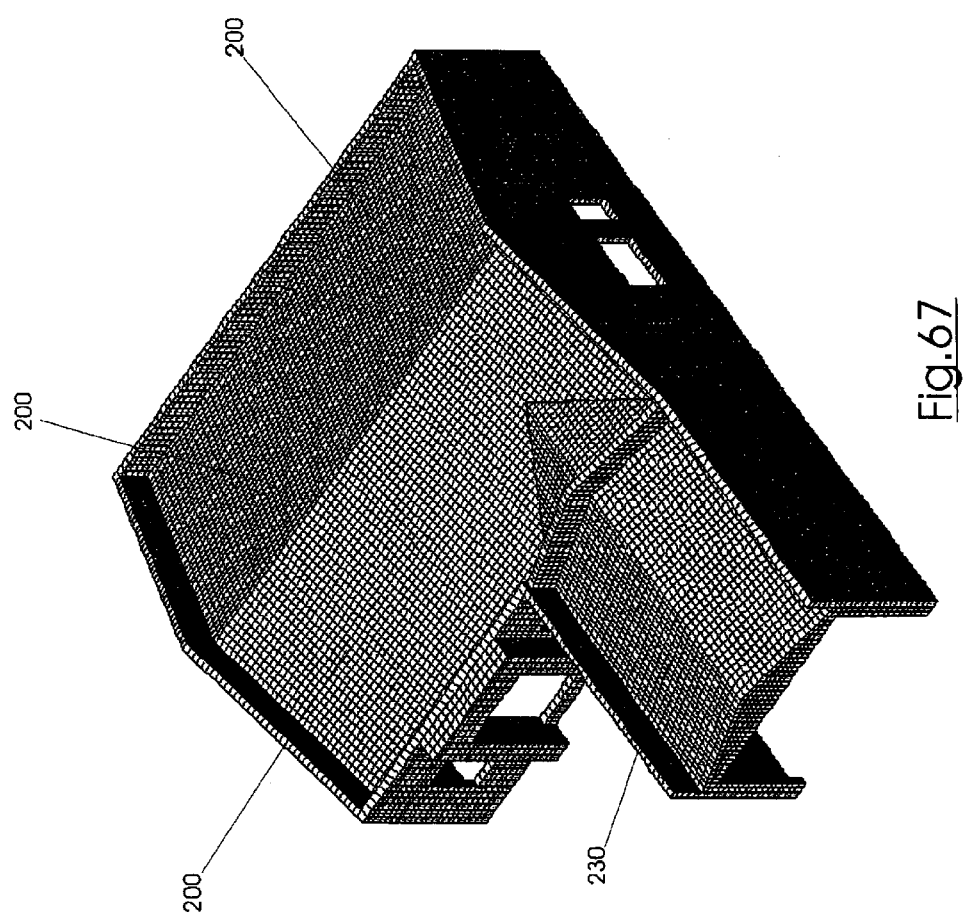
FIG. 67 is a perspective view of the mesh lines of the exterior walls and the ceiling of building of FIG. 57.
Figure 68:
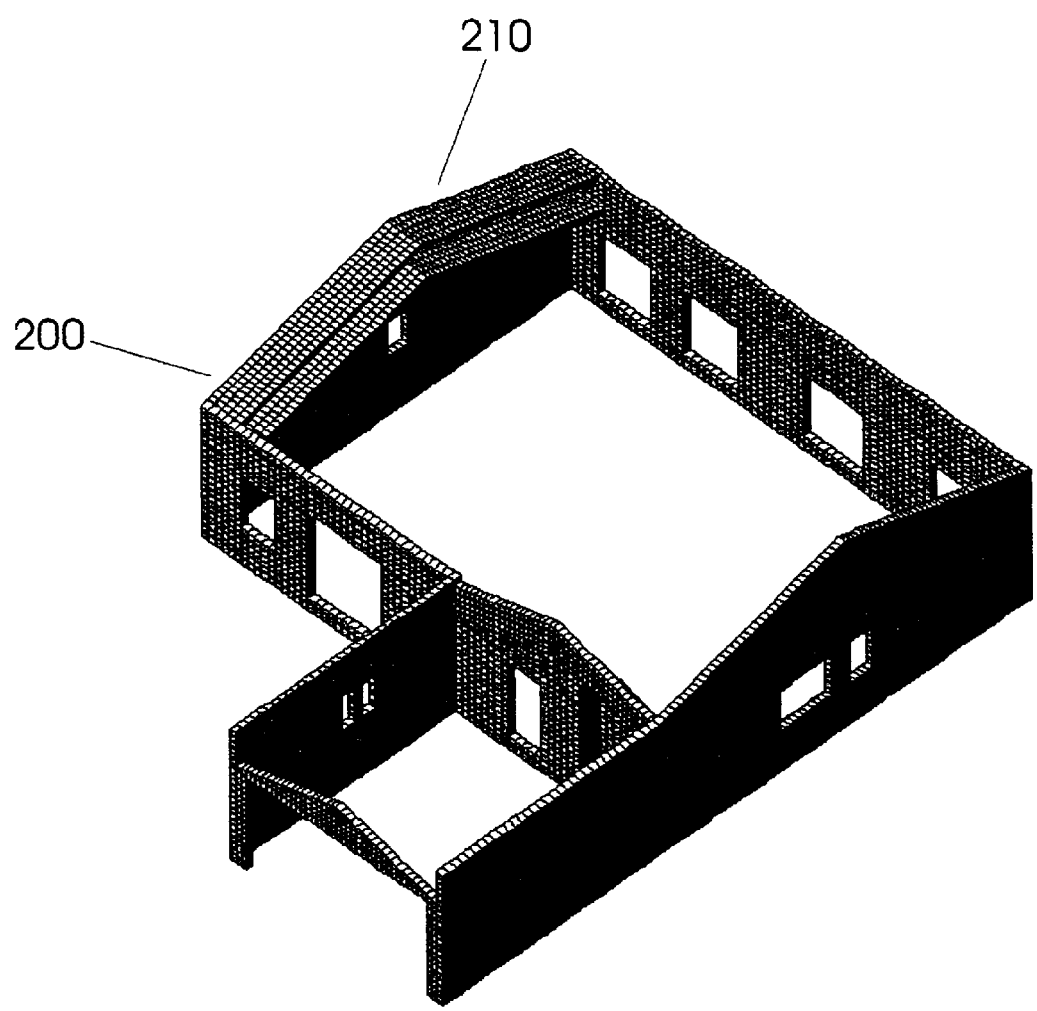
FIG. 68 is a perspective view of the mesh lines of the exterior walls and the ceiling of a building of FIG. 57.

This process is repeated until all of the brick elements of the ceiling layer 200 are constructed (FIG. 66). The same process is repeated similarly until the roof layer 210 (FIG. 71) of the entire house (FIG. 67) is completed. The Garage area ceiling 230 is made the same way by highlighting the wall nodes that are common with the Garage ceiling and the coping them to make an extrusion using the North wall of the garage as a guide template. The guide points are the common nodes between neighboring Groups. In this example, the bricks which make up the left half of the garage are designated as Group 36 and the right half is the Group 37 and the Garage North wall 150 is the Group 28 (FIG. 67). The upper part of the roof is similarly formed (see FIG. 68).

Figure 69:
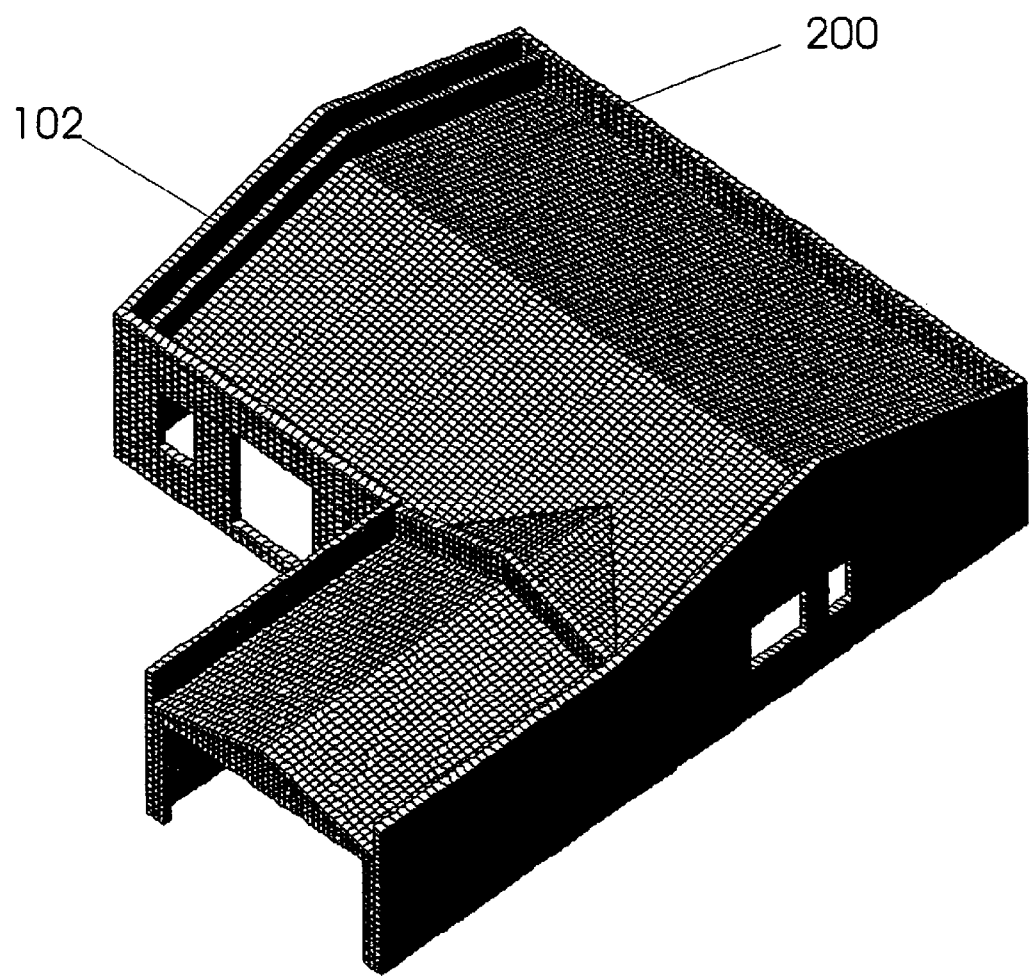
FIG. 69 is a perspective view of the mesh lines of the exterior walls, the ceiling and one roof rib of the building of FIG. 57.
Figure 70:
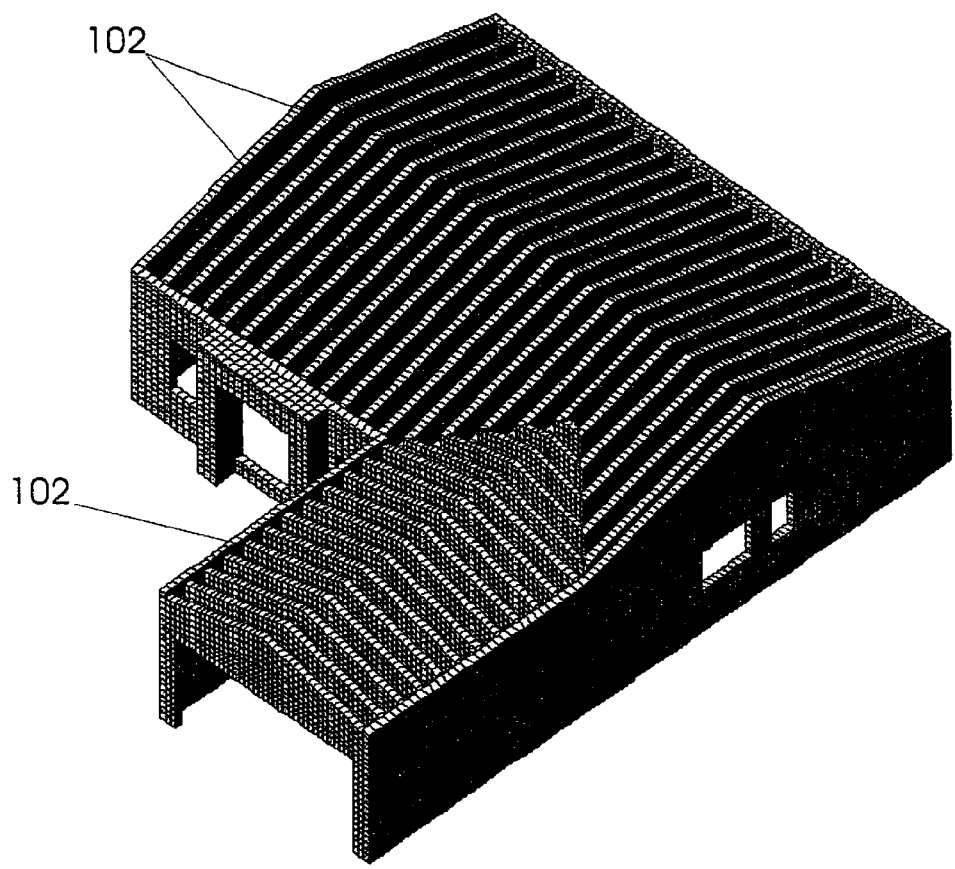
FIG. 70 is a perspective view of the mesh lines of the exterior walls and the roof ribs of the building of FIG. 57.
Figure 71:
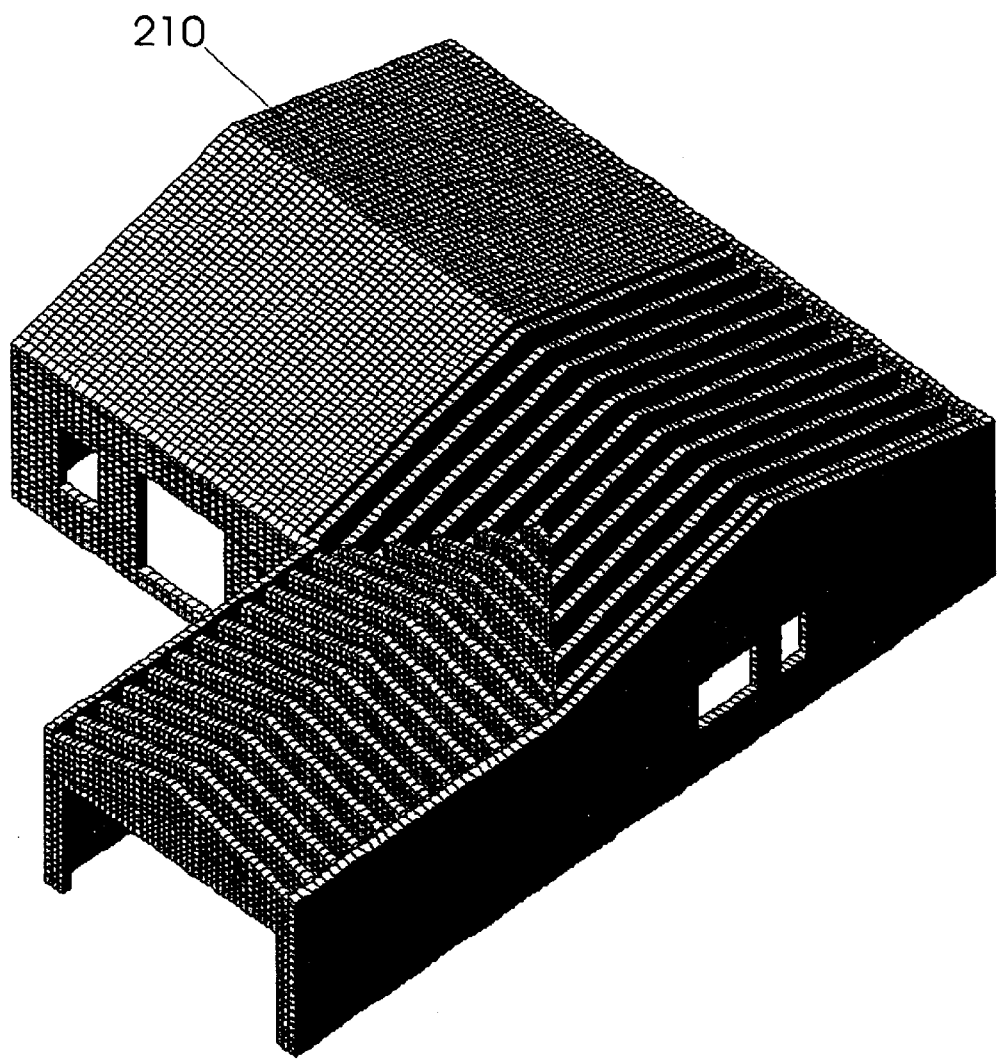
FIG. 71 is a perspective view of the mesh lines of the exterior walls, the ribs and partial roof of the building of FIG. 57.

The Ribs which extend between the Ceiling layer and the Roof layer 200,210 are made by locating the common nodes between the ceiling and the connecting ribs 102. The mesh lines between the common nodes of the Ribs and the Ceiling layer are highlighted and selected and then copied upward with the Algor software feature of Join All Copies turned ON to construct rib brick elements between the North wall and the south walls (see FIG. 69). FIG. 70 shows the ribs for the Main and the Garage roofs. FIG. 71 shows the construction of the upper component of the roof.

Figure 72:
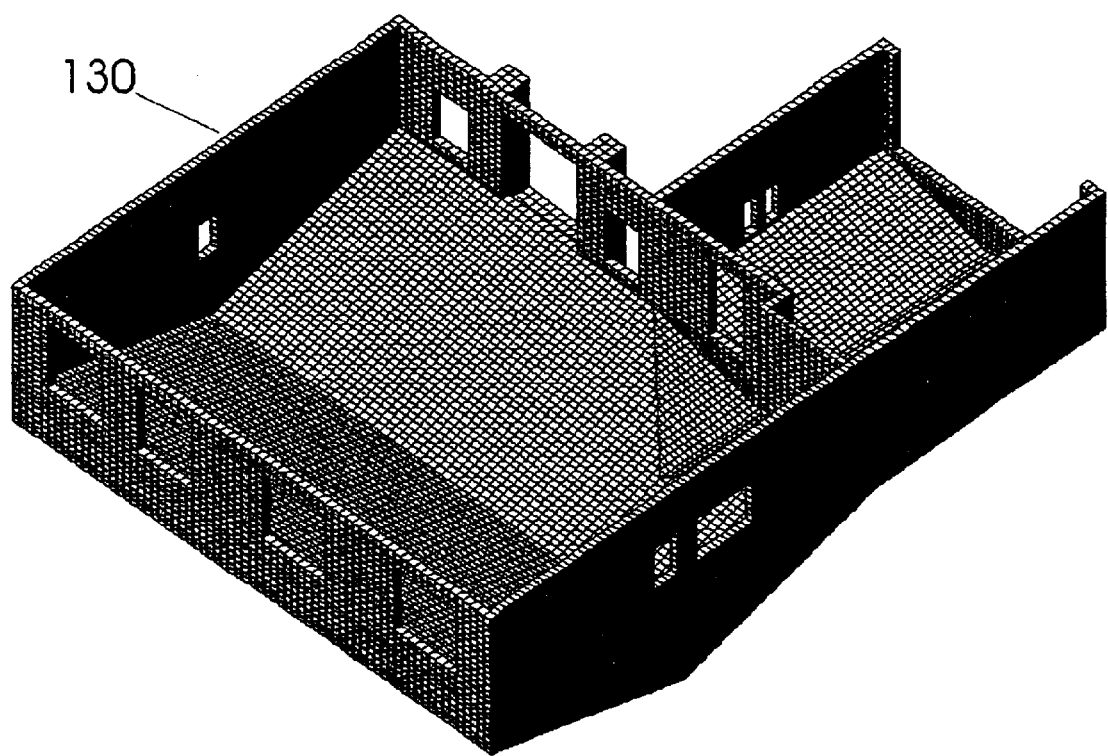
FIG. 72 is an inverted perspective view of the mesh lines of the building of FIG. 57 without the interior walls.
Figure 73:
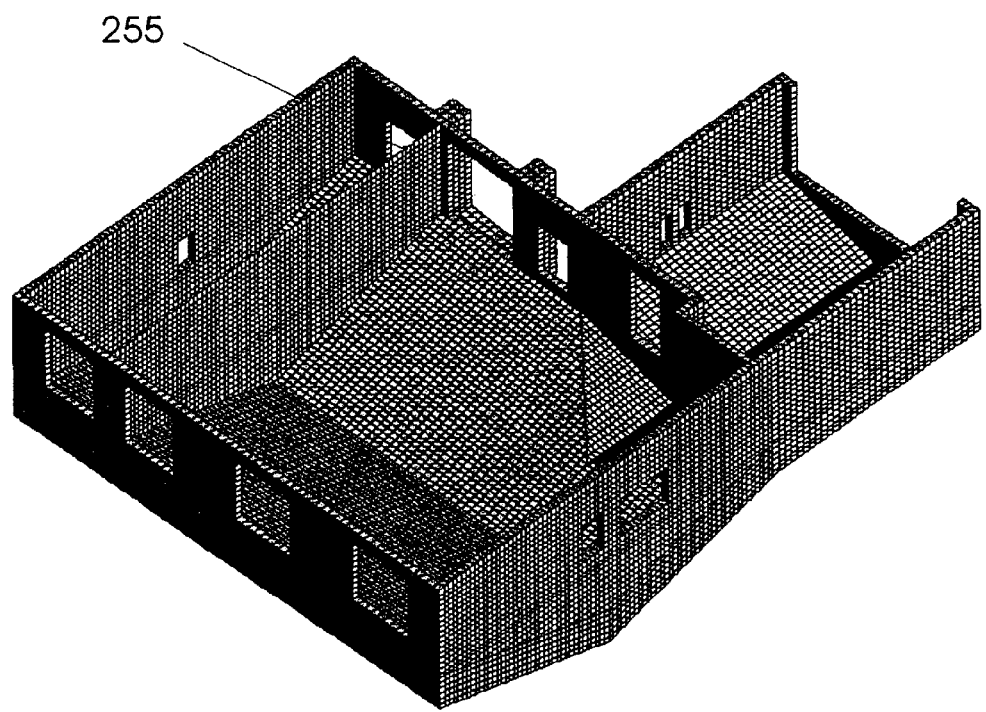
FIG. 73 is an inverted perspective view of the mesh lines of the building of FIG. 57 showing the base template for construction of the first partition wall.
Figure 74:
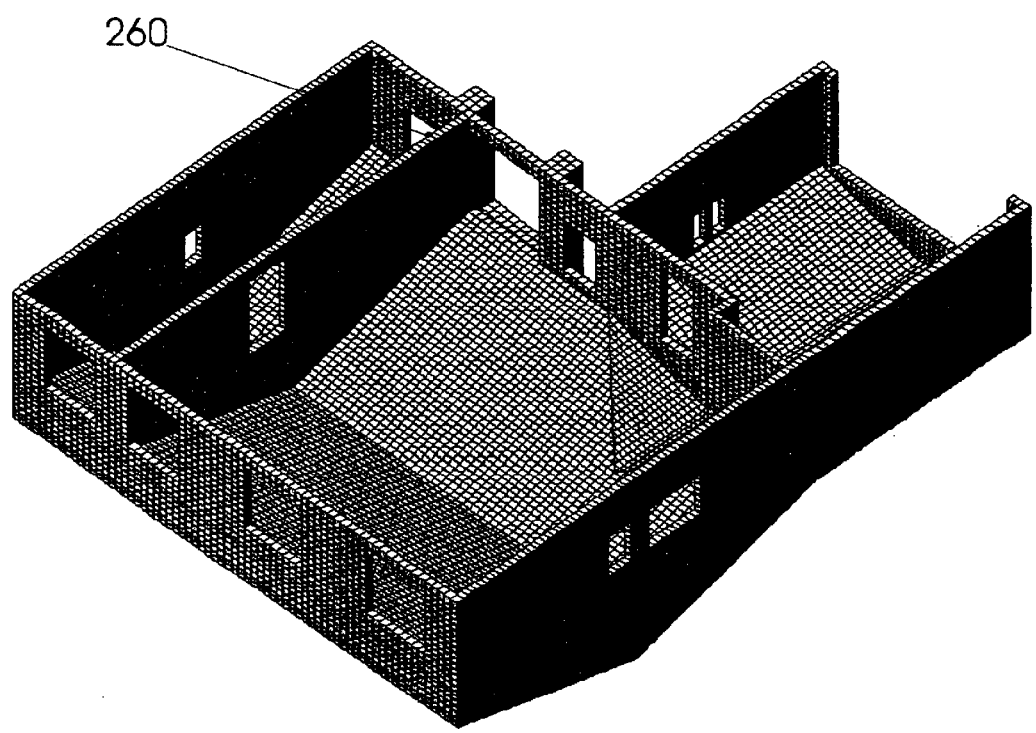
FIG. 74 is an inverted perspective view of the building of FIG. 57 FEA model with the first interior partition.
Figure 75:
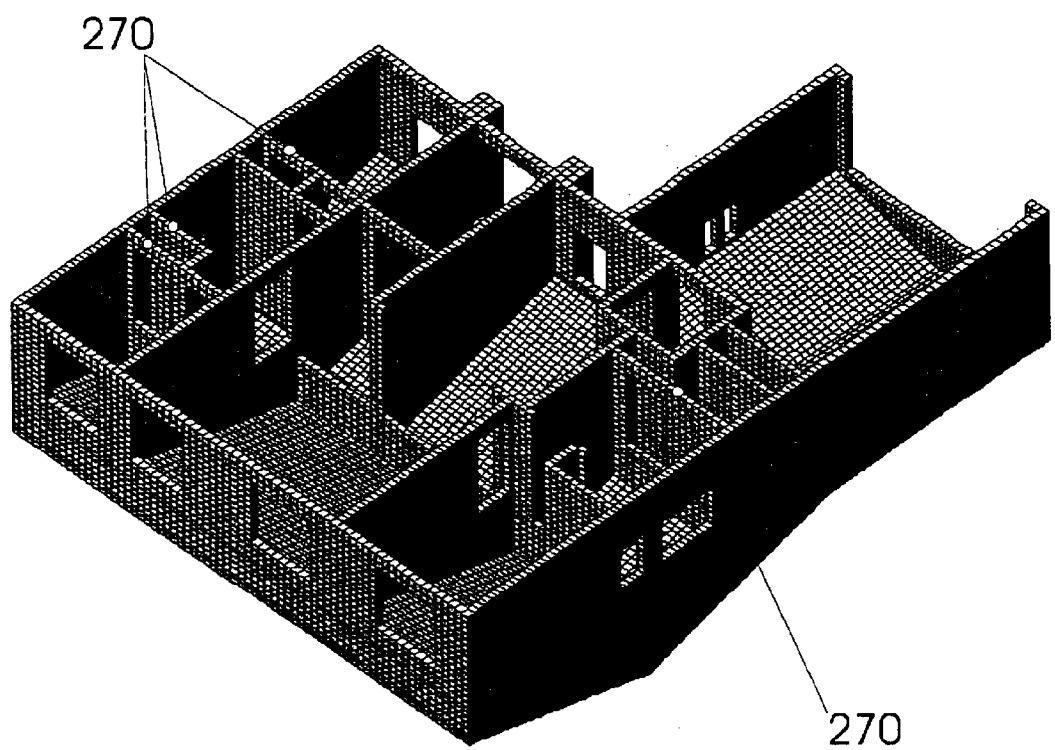
FIG. 75 is a perspective view of the building of FIG. 57 with all interior partitions.

Next is the modeling of the partitions. Looking at FIG. 72, the left wall or the inside face of the house's West wall makes a good template for the North/South partitions. All that needs to be done is highlighting the interior face of the West wall and moving it to the East West face location of the first interior North-South partition and filling the hole of the West wall window (see FIG. 73). This 2-D wall 255 is then selected and extruded to make the partition 260 in (FIG. 74). The next step is to select and remove the elements, which are located in the place of any opening on such a partition. To construct East/West partitions 270, we must start with the bottom nodes on the ceiling layer, selecting them and coping them downward with Join All Copies feature turned ON (FIG. 75).

Figure 76:
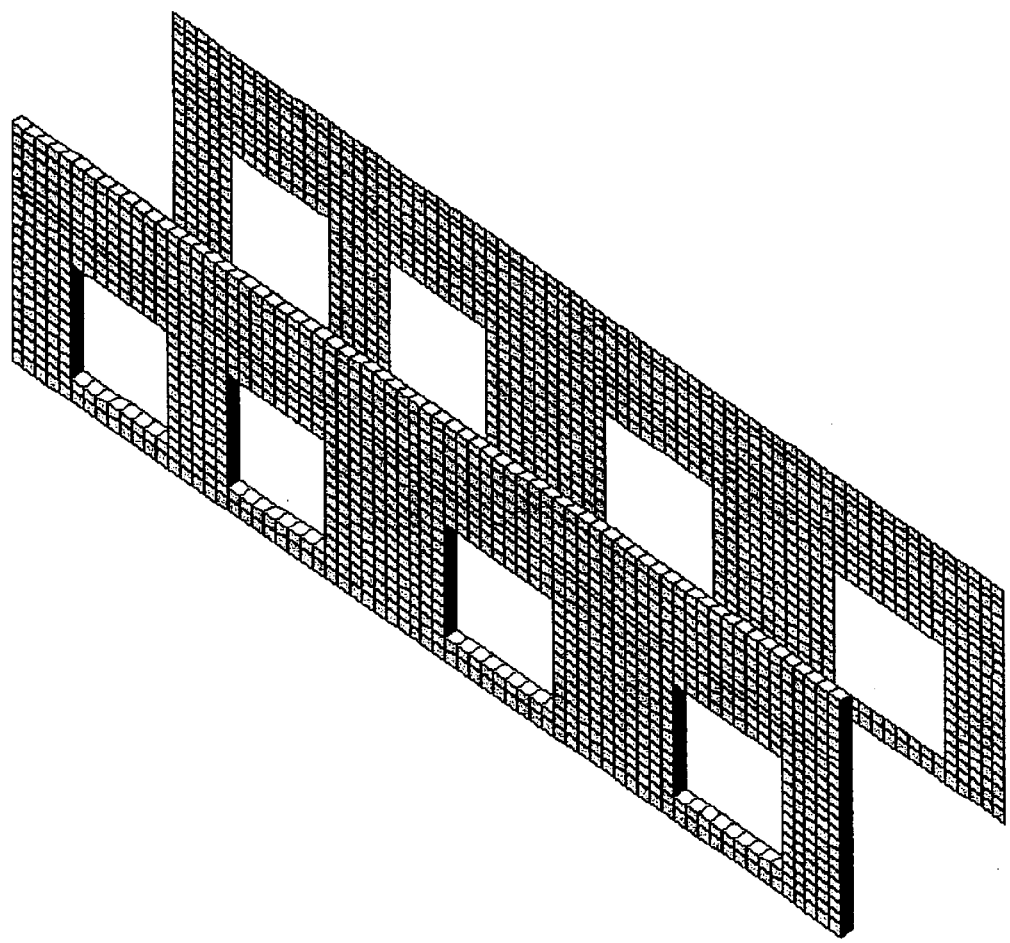
FIG. 76 is a perspective view of the building of FIG. 57 North wall with the GFRC Plate element cover shown at a distance.
Figure 77:
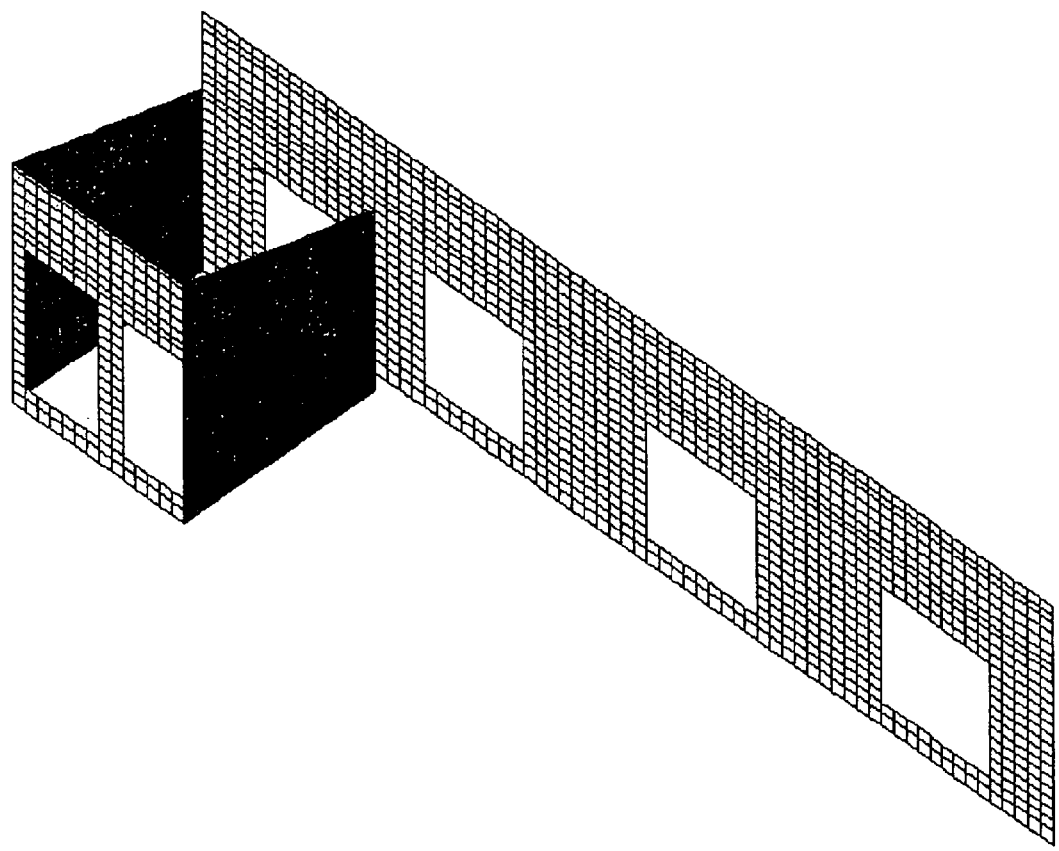
FIG. 77 is a perspective view of partial GFRC coating of some of the walls of the building of FIG. 57.
Figure 78:
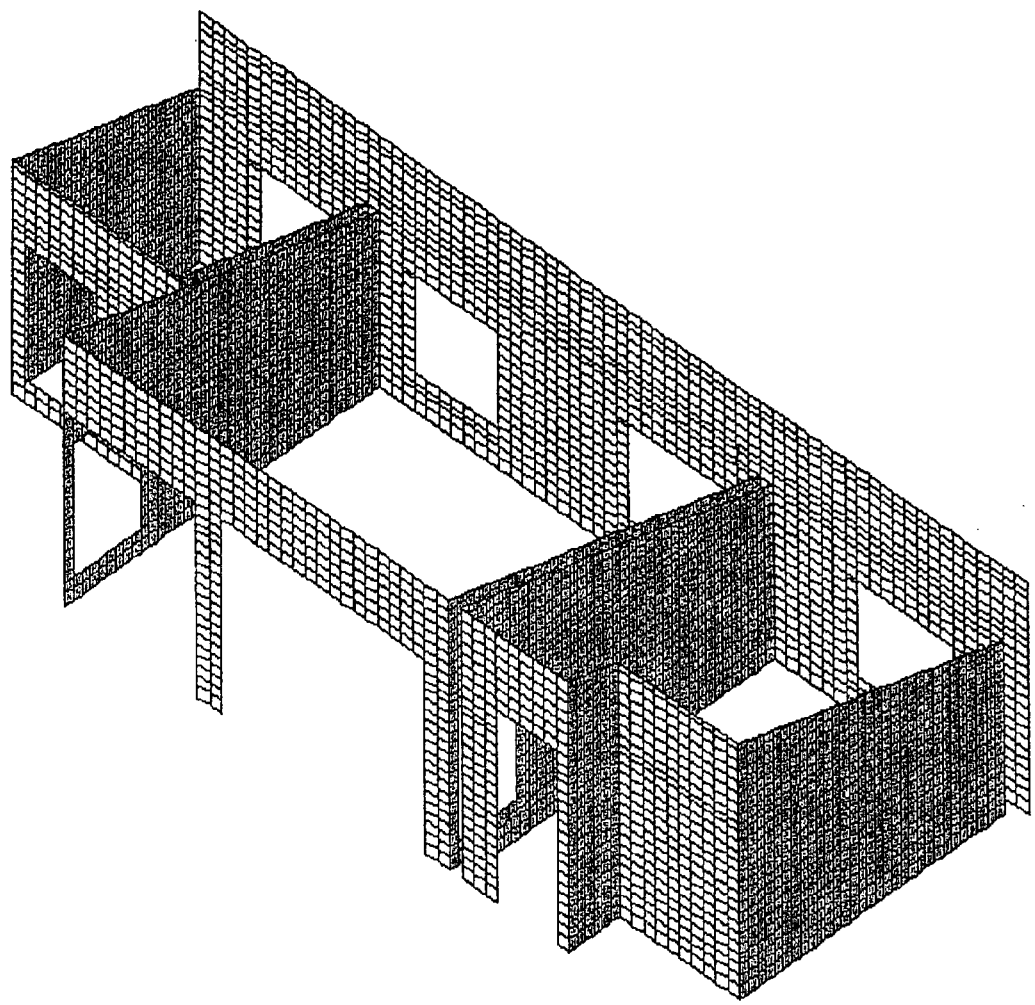
FIG. 78 is a perspective view of partial GFRC coating similar to FIG. 77.
Figure 79:
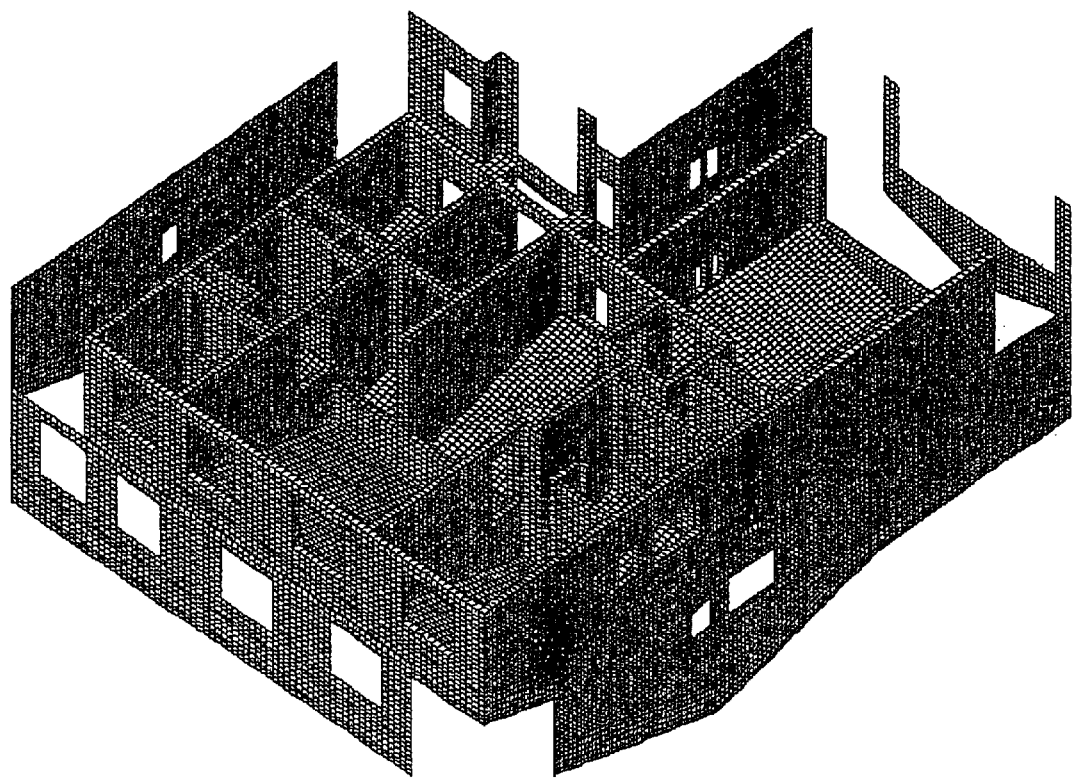
FIG. 79 is perspective view of the inverted building of FIG. 57 with the GFRC coating model of its exterior walls shown at a distance from the EPS walls.
Figure 80:
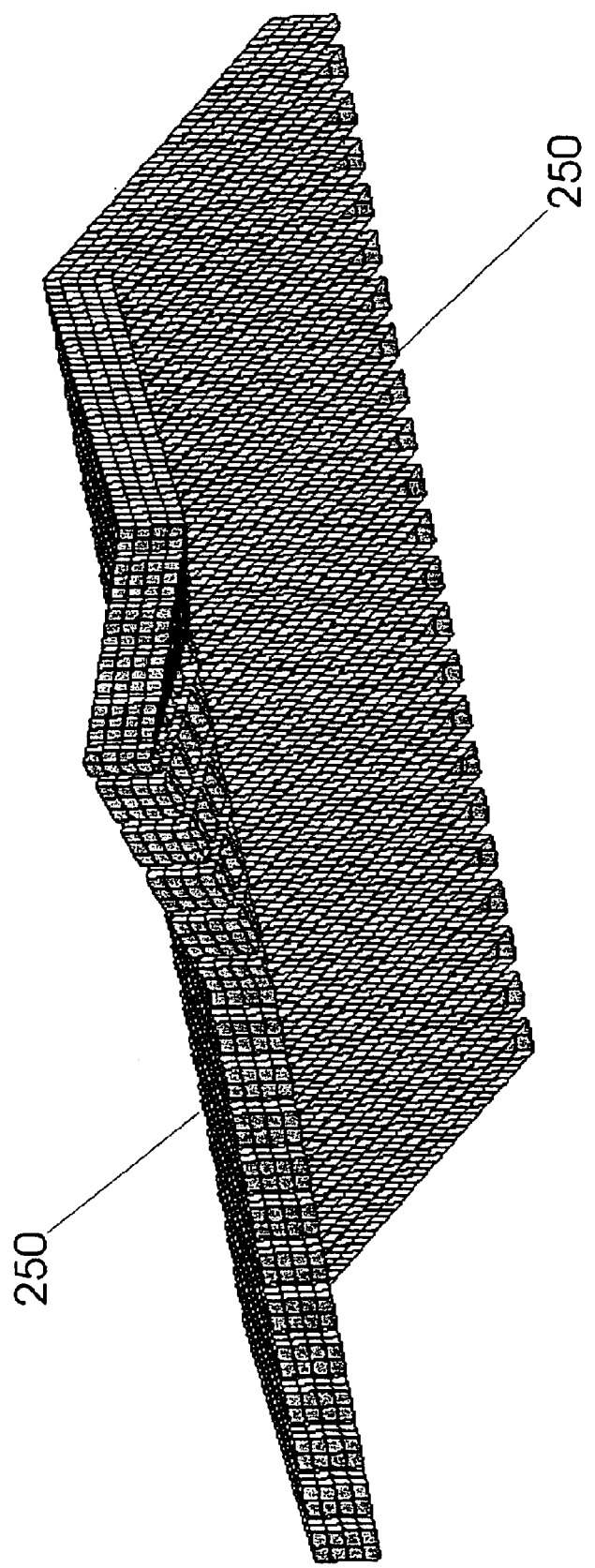
FIG. 80 is perspective view of the building of FIG. 57 Roof Ribs GFRC FEA coating model.

At this point, the whole structure of EPS foam or the core part of the composite material has been constructed. Next, we must construct the outside coating of the composite structure. For this purpose we isolate each component group and select the exterior nodes of these components and copy them and assign them to a new group. We start with Group 1, or the North wall 100 as shown on FIG. 76. For a coating material, which is very thin in comparison to the EPS component, we use FEA plate elements. Plate elements are shown as having zero thickness, but within the program the actual thickness of the coating material, such as one quarter inch, is assigned to the Group. Similarly, FIG. 77, FIG. 78, and FIG. 79 show other Groups of coatings of the structure. FIG. 80 shows the plate elements, which depict the coating of the main part of the house roof ribs 250, which are made of glass reinforced concrete.

Figure 81:
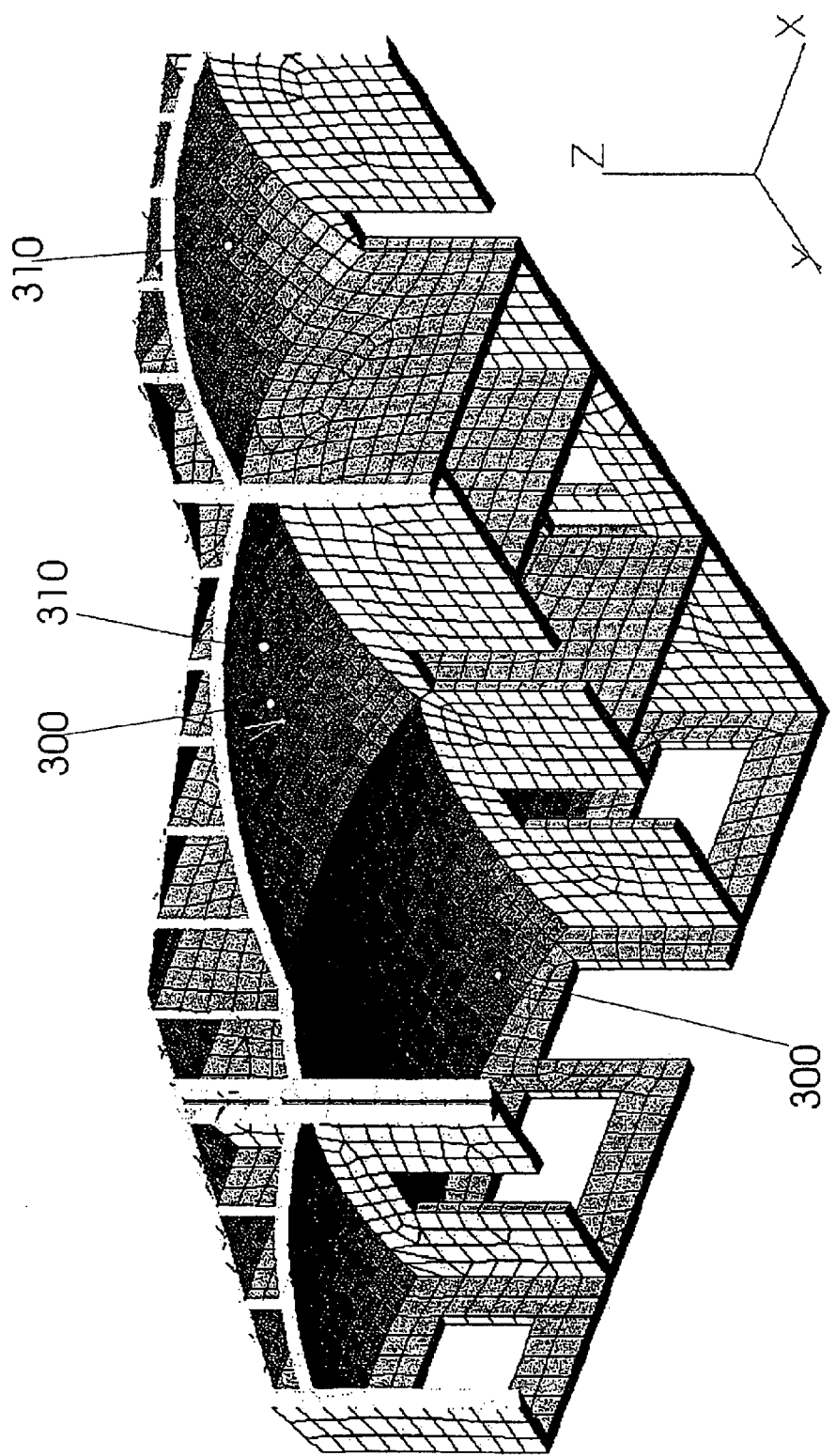
FIG. 81 is FEA model perspective view of the embodiment of another EPS composite building with curved ceiling system.
Figure 82:
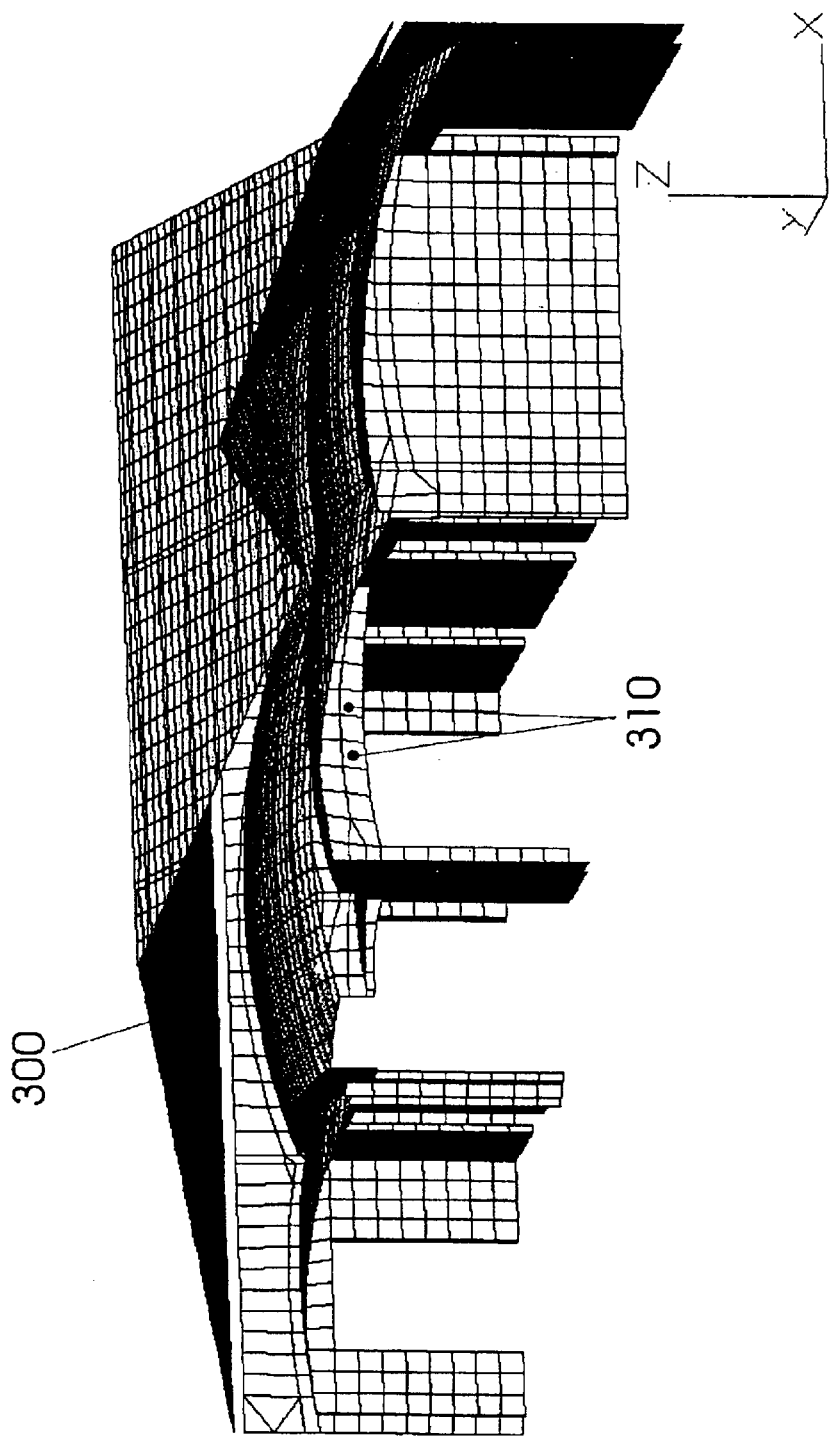
FIG. 82 is another perspective view of the FEA model of the building of building of FIG. 81.

In situations where the structure has curved components such as curved roof or ceiling or walls (FIG. 81 and 82), a similar process is used as described above to create meshing for the curved structure. The curved components may have single, double or arbitrary curvatures. These types of curved components can not be easily modeled within the FEA software unless template configuration from the CAD program depicting their segmented shapes is imported into the FEA program. For this reason, it is necessary to slice the curved components of the structure within the CAD package before importing the CAD Wireframe Model of the building into the FEA Program. By slicing the curved structure in the CAD package we create, tessellation lines 300 (see FIG. 81 and 82). The tessellation lines 300 are imported into the FEA software along with the model of the building. The tessellation lines 300 are used to create brick elements 310 (FIG. 81). The brick elements 310 accurately model the curved components of the structure. Curved components such as ceiling in (FIG. 81 and 82) offer superior strength over flat components buildings. However, flat components can be wire cut EPS foam and as such are less costly to cut in comparison to curved 3-D components, which are cut by hot knife or CNC robotic cutters. Curved shapes also have more cutting waste, but they are more attractive.

Material Properties

Figure 83:
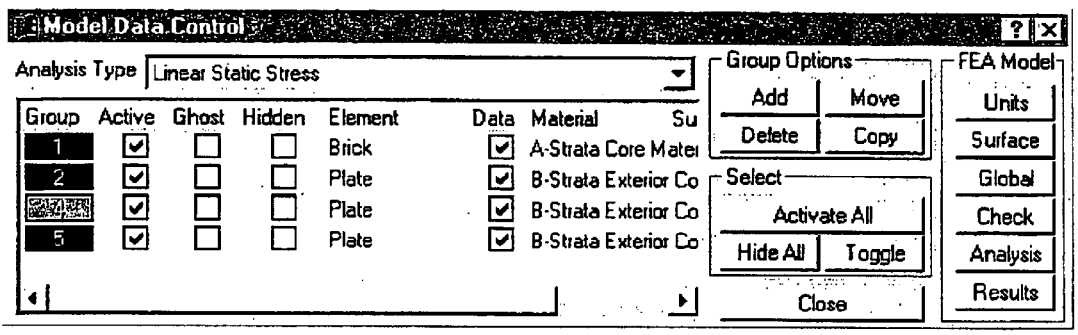
FIG. 83 shows the Model data dialogue menu of the Algor FEA software.
Figure 84:
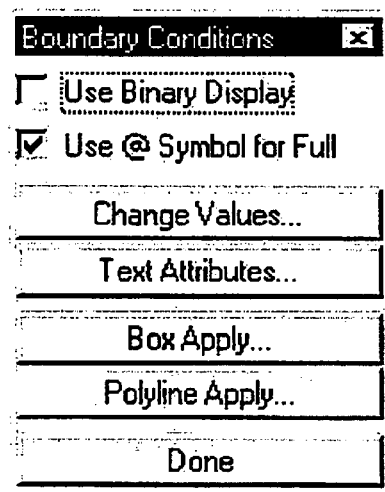
FIG. 84 shows the Boundary Condition dialogue Box of the Algor FEA software.
Figure 87:
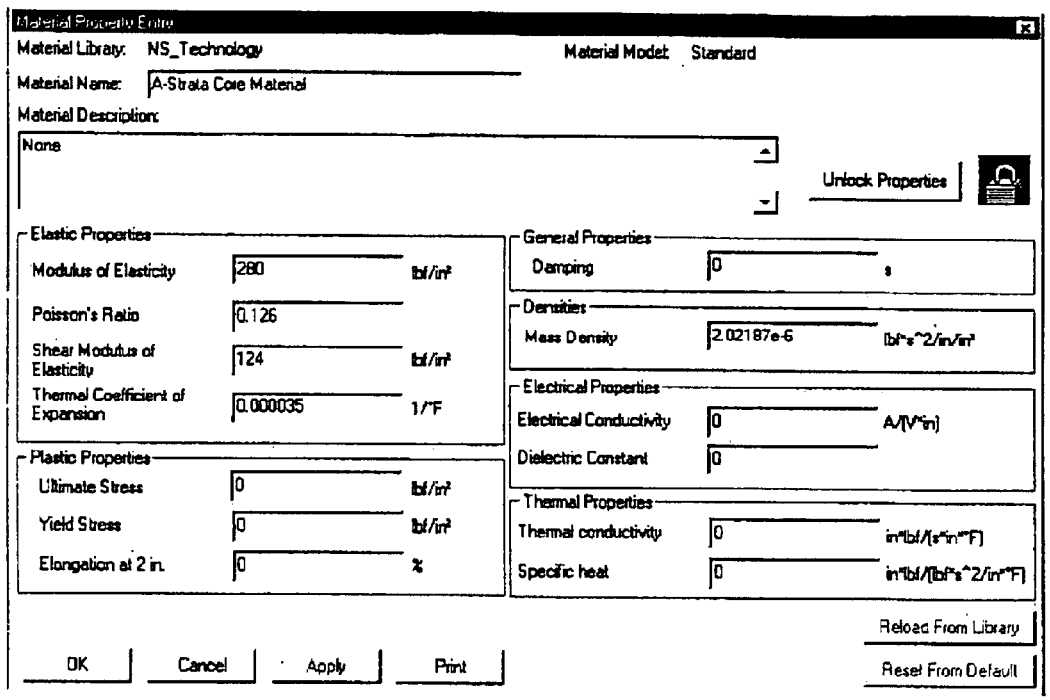
FIG. 87 shows the Material Property data dialogue box of the Algor FEA software showing the properties of Expanded Polystyrene.
Figure 88:
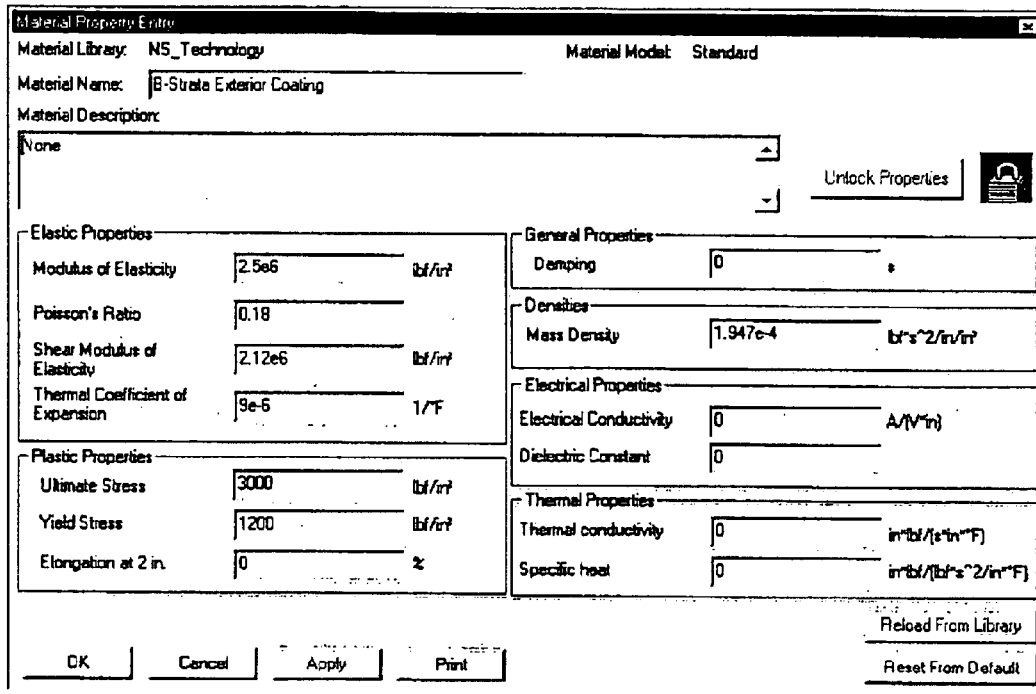
FIG. 88 shows the Material Property data dialogue box of the Algor FEA software showing the properties for GFRC.
Figure 89:
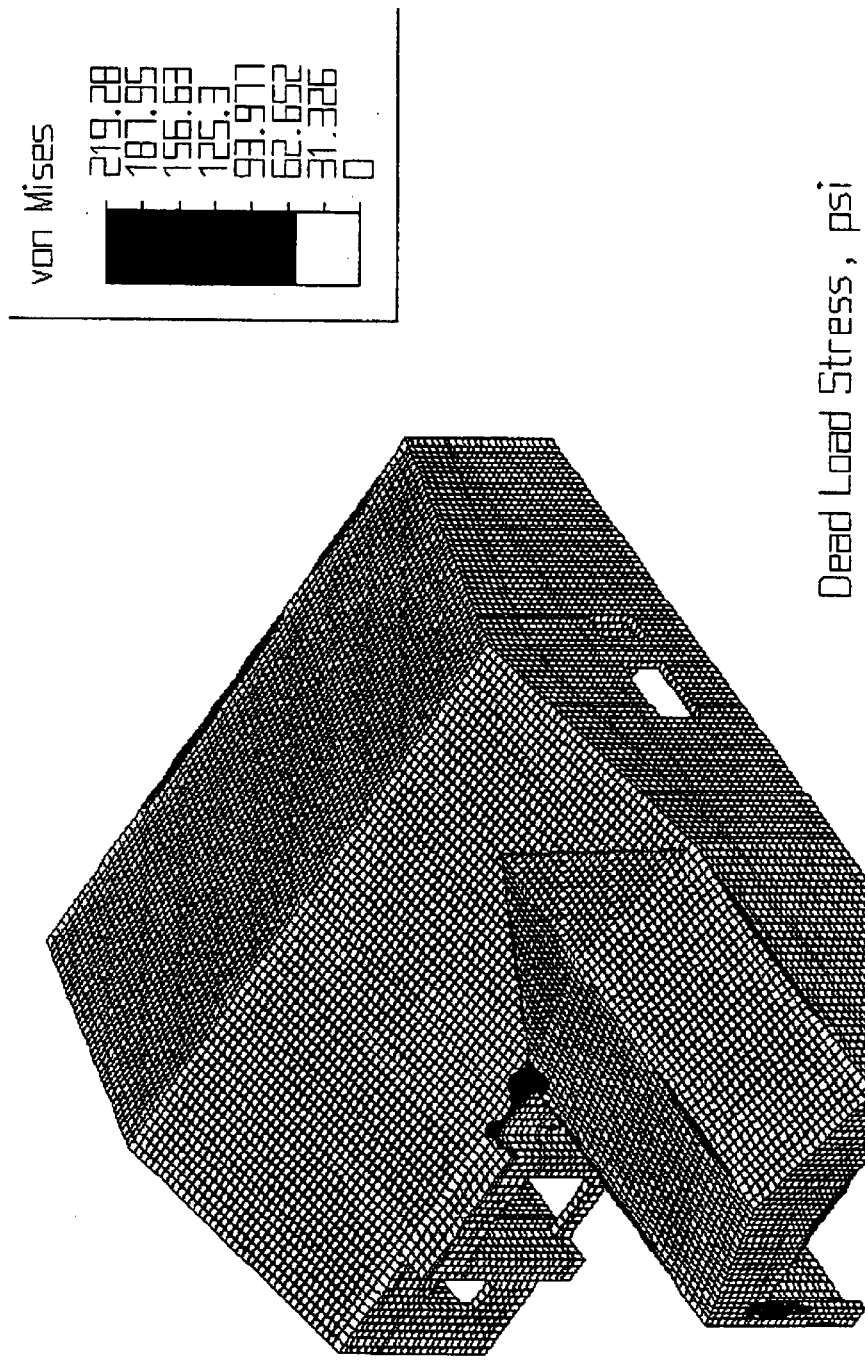
FIG. 89 shows the GFRC Dead Load stresses of the building of FIG. 57.
Figure 90:
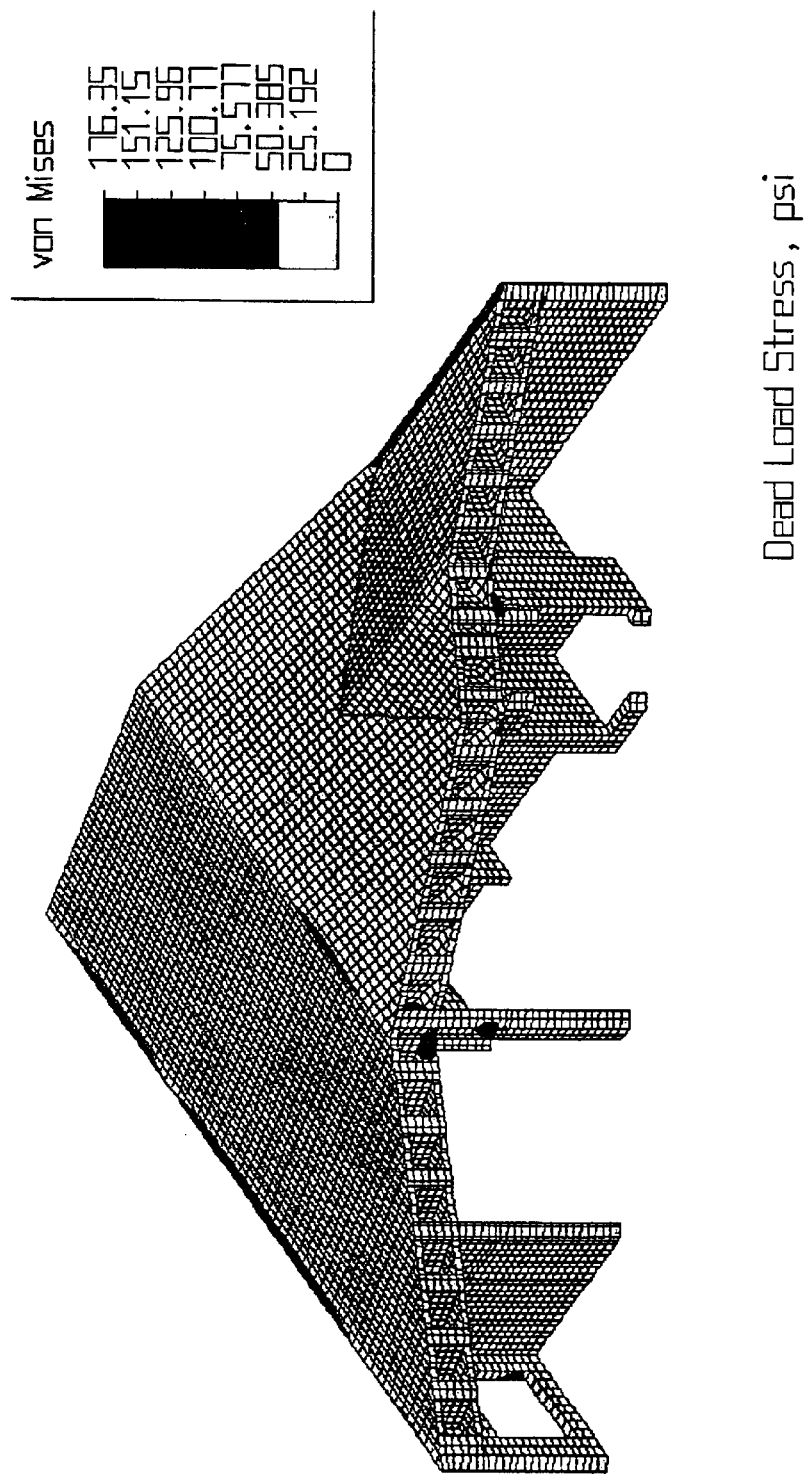
FIG. 90 is another view of GFRC Dead Load stresses of the building of FIG. 57.
Figure 91:
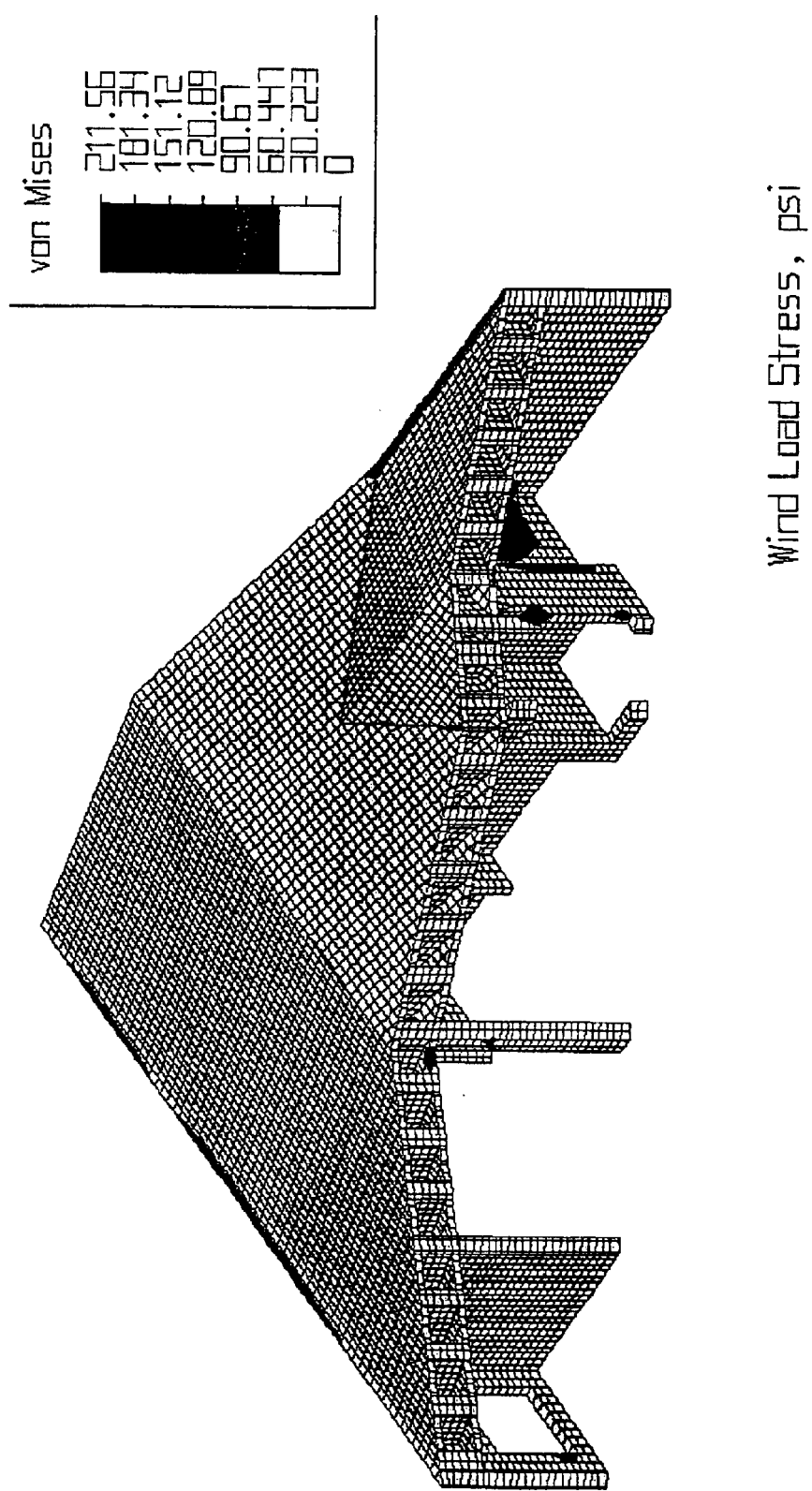
FIG. 91 is the GFRC Wind Load (100 mph) stress contour of the building of FIG. 57.

Before FEA Analysis is made the type of element for each group must be identified. The mechanical properties of the material for each Group also must be specified (FIG. 83). Algor and other FEA software have Material Libraries for most structural construction material. However, Expanded Polystyrene and the Glass Reinforced Concrete are not so common structural material and therefore, the properties of these materials have to be added and in the user of FEA program personal library (FIG. 87 and FIG. 88).

Assemble the Element Stiffness Matrices

The stiffness matrix of an element consists of coefficient relating to force and strain and mechanical character of that particular element. In $17^{th}$ century Robert Hooke defined the basis for modern finite element stress analysis as Hooke's Law. Hooke proved that an elastic body stretches in proportion to the force applied on it. Mathematically:

$$F=kx$$

Where F, K and x relate to force, spring constant and distance of stretching of the elastic body. In finite element analysis of all structures and in our case structures 2 FIG. 58 and other examples used the structures are broken to thousands of very small "brick" elements. Each element has 8 corners, or nodes. All nodes on the fixed points where the structure is tied down are fixed and can not move. If a point or a node on the structure other than the fixed points is forced to move, the node will move a little because all materials have some elasticity. That movement would be described by F=kx for that element except that other elements are in the way or are tending to hold it back. Fundamentally as the force is exerted on the first element, it spreads out to other nodes, and so on. Without a computer, it would be impossible to track the events of movement of all connecting elements. In the finite element method, the overall behavior of the structure is defined by the process called "element stiffness formulation". What happens is that a "k" is created for the relationship between every node on each element. Thus, every node is connected to every other node on each element by a hypothetical spring, which will behave like F=kx. By so doing, we reduce the structure to a large system of springs connecting the nodes. When the "analysis" is done, a step known as "processing", a value for each "x" and "F" is determined for each node by the formula F=kx. "F" and "x" are vectors as each has a value and a direction. When using a FEA program, the user will go as far as doing the modeling and entering the mechanical properties of the elements. The computer program will establish and assemble the overall element stiffness matrices for the structure.

Define the Boundary Conditions

Typically all our examples and our composite structure 2 are fixed at the ground base. This fixity is set with global boundary conditions 125 (FIG. 95), in which the fixity is totally rigid. Boundary points are used to simulate the constraints that actually occur at the ground line. In Algor software it is possible to have 6 constrains in x, y and x axis and rotational movement constrains about x, y and z axis.

With Algor software, we can also use boundary elements have an additional capability of imposing and enforced displacement upon our model. The force created by this imposed displacement would be calculated automatically. This comes particularly handy in case of varying soil conditions for application of earthquake foundation movement. Additionally, the forces generated at a boundary by forces on the model can be obtained as output using boundary elements.

Application of Forces:

The data involved in structural analysis relate to the following items:

Dead Load of the Structure
Snow Load
Wind Load
Earthquake
Thermal Changes
Live Loads 1) Dead Load In most, FEA programs the Dead Load effect is treated by entering the material mass density of the components of the structure (FIG. 87 and 88). In case of the invention's structure, there are only two materials EPS and the GFRC. The mass density and the mechanical properties of these materials are shown in FIG. 87,88 as they were entered into the analysis.

2) Snow Load

Snow load is handled by calculating the projected area of roof snow coverage and it is multiplied by the snow intensity recommended by the Building Codes to get the total Snow Load. The total snow is the divided by the number of nodes in the structure where the snow force is applied.

3) Wind Load

The Wind load is similarly treated as in case of snow load except it is applied horizontally. Table of FIG. 94 shows the wind and snow nodal loads, the loaded projected area and the total number of nodes in the area of loading. In the stress displacement analysis of the examples, it is assumed that all elements have equal projected area normal to the wind or the snow direction. This is an approximation for the nodal forces. If more accurate results were needed. The areas subject to wind and snow can be broken into smaller segment and the nodal forces for the smaller segments maybe calculated to have better accuracy.

1) Earthquake

Earthquake is applied as movement of the base of the structure with respect to time. The movement is applied to the nodes that are connected to the foundation.

Nodal Thermal Temperatures

The thermal temperature change is applied as nodal temperature change. The program analyzes the effect of expansion or contraction of the house due to temperature changes.

The Analysis:

We are now ready to perform the FEA analysis cover the following categories and result in useful information in predicting the structural limits of the structure:

Linear Static Strength Analysis
Natural Frequency of the Structure under Linear Mode
MES with Nonlinear material model
Heat transfer Thermal Stress Analysis
Dynamic analysis under earthquake situation.

Several example problems were solved using the invention's technology to predict behavior of composite structure. FIGS. 89–93, 96 and 97 show Stress/Displacement for both Curved and Flat component composite building for various loading including earthquake dynamic loading of the structures.

FEA software vary in terms of how they accept the force input data. Some program accept pressure normal or at an angle to the surfaces. In other cases, the pressure has to be broken into nodal normal and or tangential forces. In case of Algor the software used for the ensuing example, wind and snow forces are applied as nodal force applied to nodes (wind horizontally and snow vertically).

The distinct volumes are treated as "bricks" in the FEA program. The bricks have properties assigned to them that correspond to the properties of the foam material. There is a library of materials and their properties in the FEA program. The properties include Elasticity Properties: Modulus of Elasticity, Poisson's Ratio, Shear Modulus of Elasticity; Plastic Properties: Ultimate Sresss, Yield Stress, Elongation at 2 in.; General Properties: Damping; Densities: Mass Density; and Thermal Properties: Thermal Conductivity, Specific Heat. Then "plates" of zero thickness are created on the surfaces of the "bricks" that form the surface of the building model. The "plates" have properties assigned to them that correspond to the properties of the GFRC coating. The model is then analyzed for stress levels under various loads both static and dynamic, such as wind, gravity, snow, earthquake, etc.

Because the building is solely built from a composite material, foam coated on both sides with reinforced concrete (GFRC), it is possible to analyze the structure accurately. Because of the accuracy of the analysis of the inventive building, it is possible to reduce the amount of material needed to meet the predicted loading of the building. Further, because this building is constructed of inner and outer shells with foam therebetween, it is a very strong structure for its mass. Conversely, stick built buildings have a vast array of elements which make them very difficult to impossible to analyze. Therefore, to meet their loading requirements they have to be over designed. Further, their angles create high stresses at their joints during loading.

The composite building material formed from GFRC coated foam has many advantages. The foam thickness can be increased easily to increase the thermal insulation value of the composite. The GFRC coating is highly resistant to vapor and moisture penetration as also is the EPS foam core. The strength of the composite is greatly increased by the foam core since the strength is a function of the thickness of the foam core. The foam core acts as a moment arm between the coatings on its opposite sides. Thus, increasing the thickness of the foam increases the insulation value and the strength of the composite. The composite building material can be used to create flat walls since the composite exhibits enough strength to be used in that design. The composite material can be used to create a building without curved ceilings.

Solve the System of Linear Algebraic Equations

The user of the software program does not have to do anything for this section. The Software program performs this part.

Calculation of the Stresses and Displacements

The Software performs this function. The results of the solution for various examples are shown in FIGS. 89–93, 96 and 97. The results show that the inventive composite buildings are very strong and efficiently resist natural forces of wind, snow and earthquake.

Natural frequency (modal) analysis was performed to determine the various modal frequencies inherent in the structure, in preparation for the static, and later the dynamic earthquake calculations and analysis. This analysis required two full days of processing time, and then, the first ten modes did not include the vibration of the entire structure, but rather, only its components. Yet, it was established that the natural frequency must be greater than the tenth frequency reported.

Figure 92:
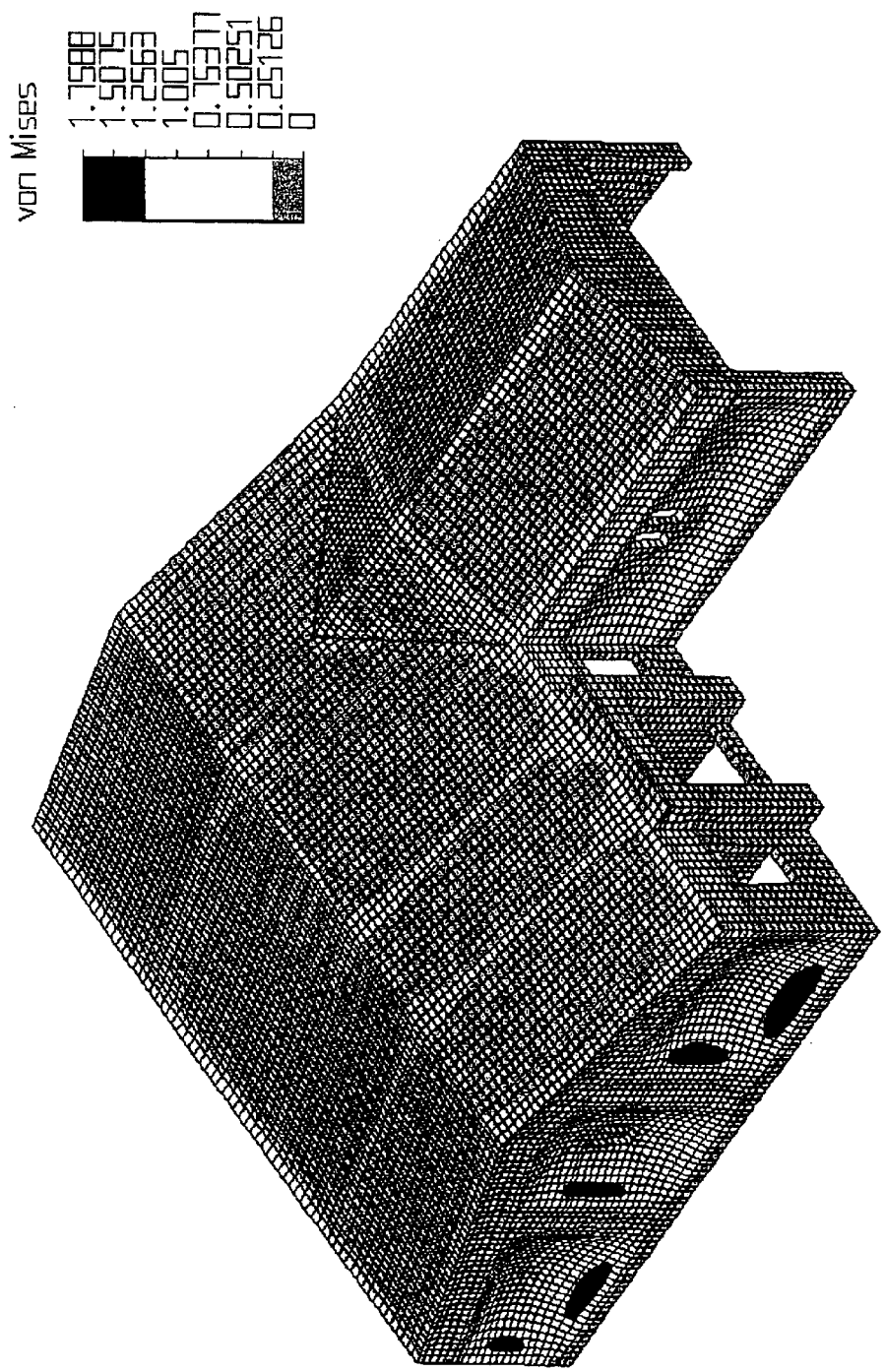
FIG. 92 is the EPS Foam Stress Contour for combination of 100 mph wind with a 30 psf snow loading on building of FIG. 57.

Von Mises stresses for the EPS core were maximum at ~1.7588 psi (FIG. 92). This represents an extremely insignificant loading. In essence, the EPS core is simply stabilizing the GFRC skins from buckling as they take all of the load. Such results strongly suggest the core integrity can be compromised substantially before any effect is seen in the load bearing GFRC material in the skins.

Von Mises stresses for the 0.25 inch GFRC skins were maximum at ~500 psi. These values for the 3/16" skins only rose to ~641 psi. This value generates a factor of safety of ~3.1 based on a tensile strength limit of ~2,000 psi. Some of the maximum von mises stress values occur in areas where the predominant stress state is compressive. As such the safety factor would increase even more, as the compressive strength is much greater than the tensile strength.

A nonlinear, transient dynamic, finite element (FE) analysis simulating the ground motions of the 1994 Northridge earthquake was performed on a portion of the structure of Example design, in order to verify the structural integrity and behavior of their new, composite building system. The results of this analysis indicate that the structure's stress levels were acceptable even for this severe dynamic excitation. It is also very, stiff and of light weight, and thus has a characteristically high natural frequency, which in itself tends to reduce the response to ground motions, except possibly where the soil stiffness might be very low. The results also verified that the entire structure, based on this system, is capable of being entirely modeled with a great degree of accuracy for advanced computer FE simulations with either static or dynamic loading.

Figure 93:
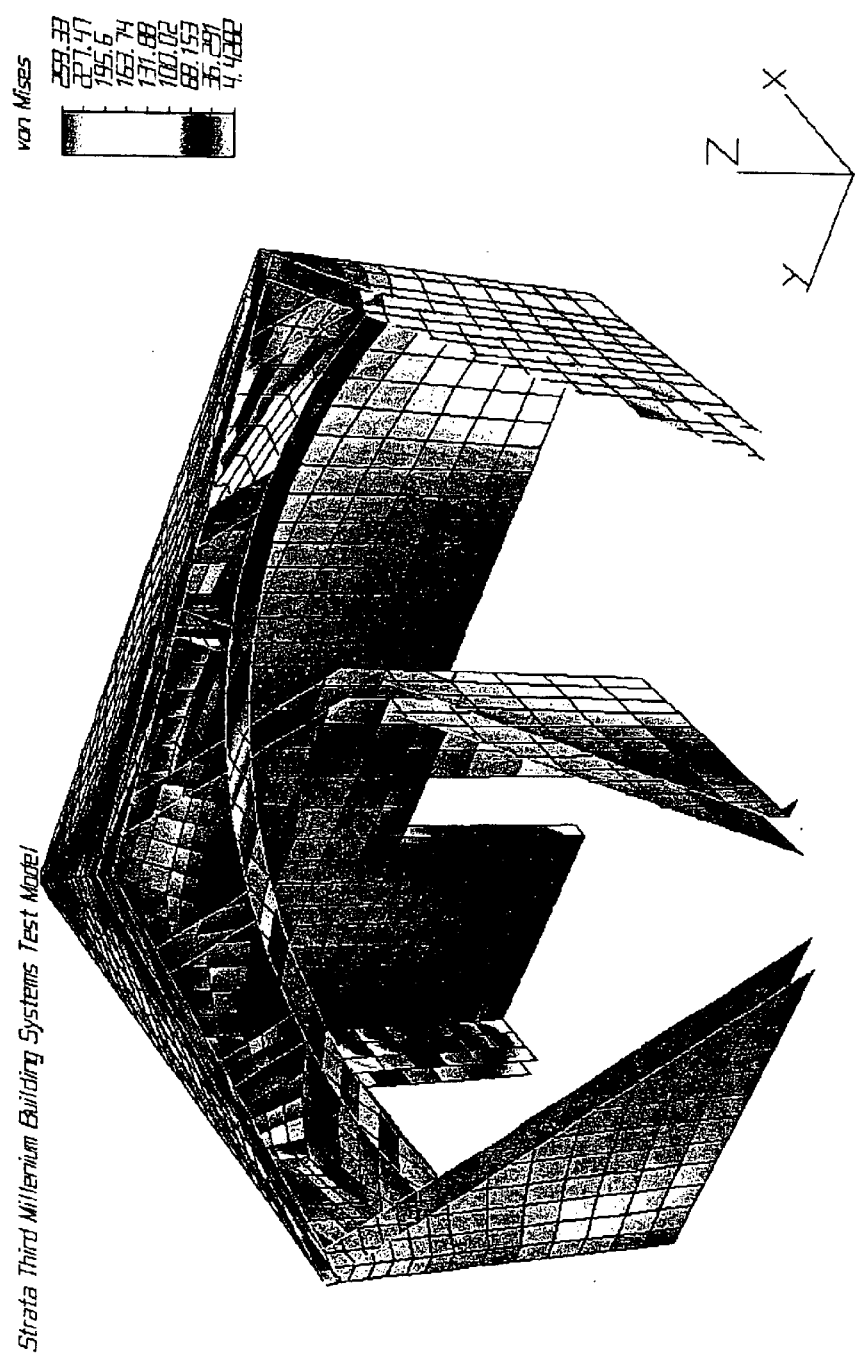
FIG. 93 is the GFRC Stress Contour of embodiment of another EPS composite building induced by an earthquake with 1994 California Northridge Earthquake spectrum.

A nonlinear time history direct integration was the type of analysis performed in this simulation. Such analysis is identified in the UBC as acceptable. Obviously, this approach together with the use of the severe ground motion accelerogram, is rather extreme for the Strata residential building analyzed. However, such an approach verifies the superior behavior of this lightweight, stiff building design for use in earthquake regions, and helps to clarify the structural load capacity available with this system (FIG. 93).

Special Short Cut FEA Analysis

Figure 85:
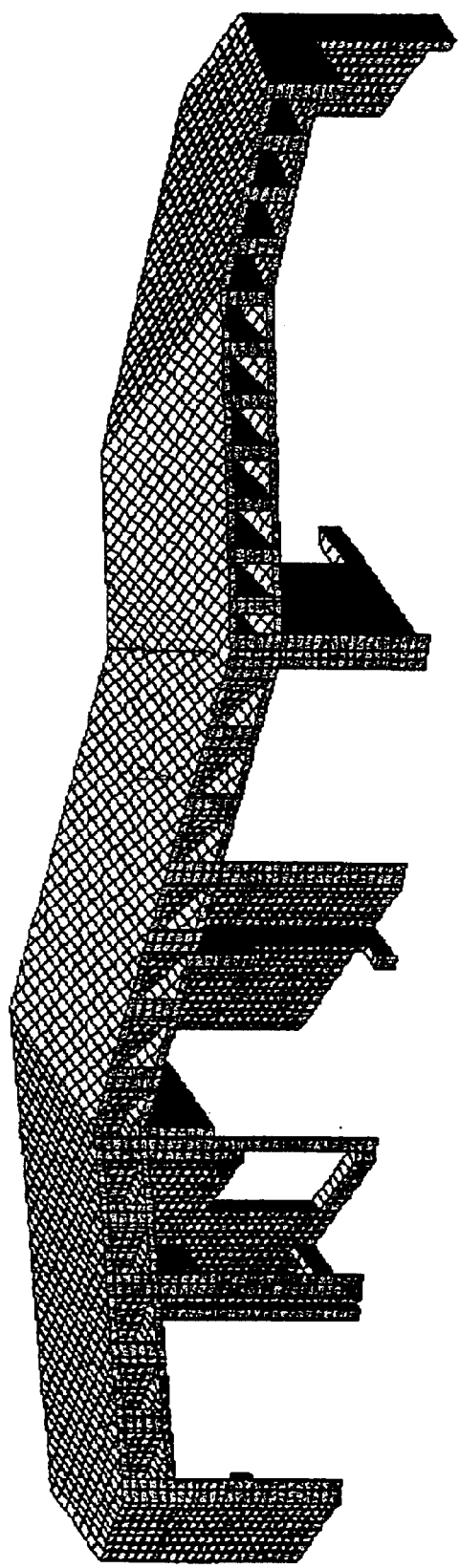
FIG. 85 shows the perspective view of a Diagonal slice cut from the FEA model of the building of FIG. 57.
Figure 86:
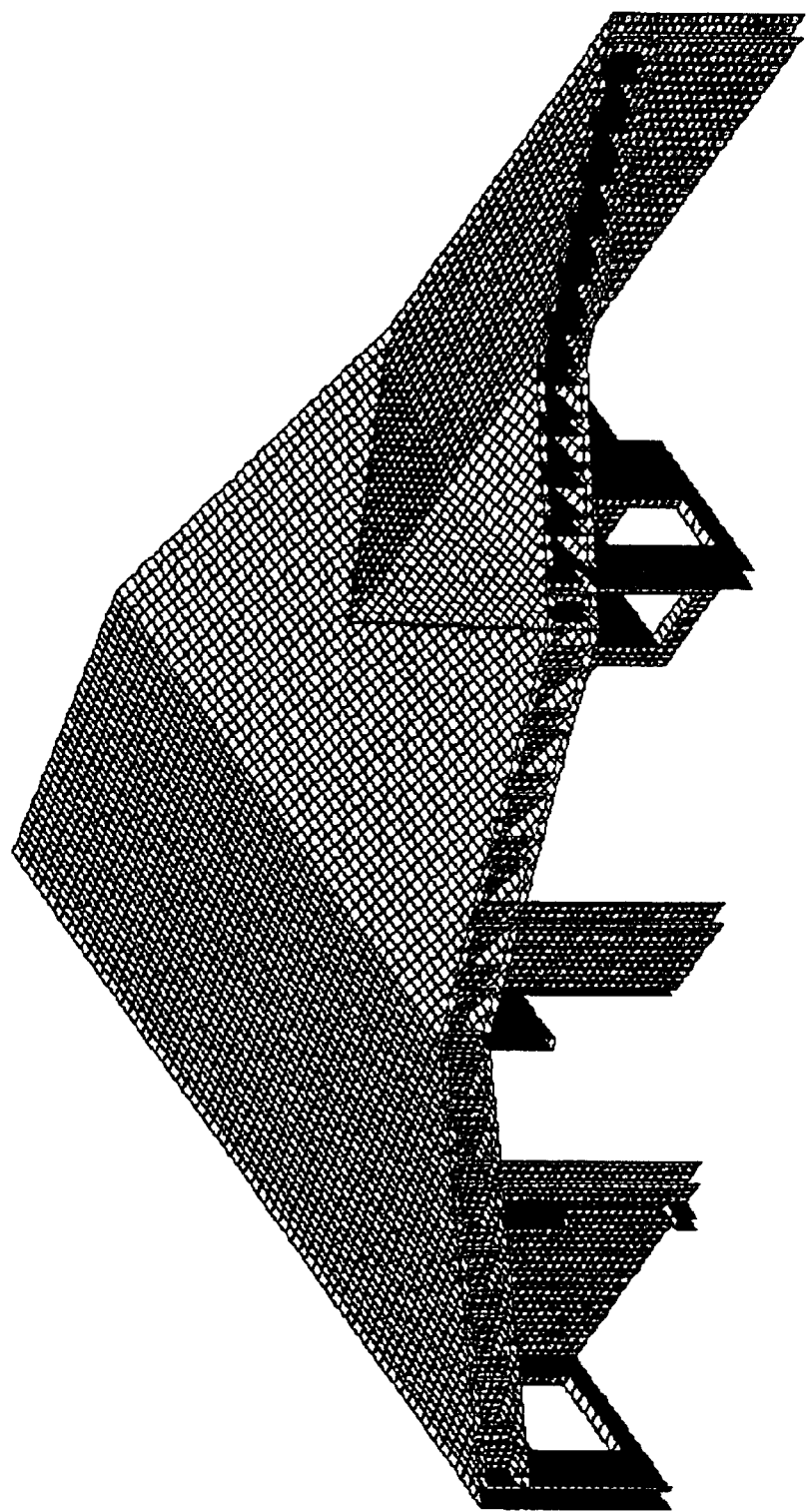
FIG. 86 shows the perspective view of a diagonal cut slice of the FEA model of the building of FIG. 57.

Please note FIG. 85 and FIG. 86 which show cross sectional cuts of the composite structure. It can be seen that at any point in the structure a slice segment of the structure resembles a traditional structural framing. The same sectional property is repeated through out the building. For this reason it is possible to select a slice section where the structure is weakest. If we preform an FEA structural analysis for this weak section and find it to have adwquate strength, then the structure will pass saftey requirement as a whole. FIG. 96 and FIG. 97 show FEA results for a slice of the building under such a condition. This type of analysis can be used for the first pass at a design trial or in some cases maybe sufficient to prove the building is structurally safe.

What is claimed is:

1. A method of analyzing a building constructed from a composite material, the composite material being formed from a selected plastic foam coated on both sides with concrete, the method comprising the following steps, creating a drawing of the building in a computer assisted drawing (CAD) program or finite element analysis (FEA) program, dividing portions of the building into a multitude of discrete volumes by lines, providing a plating of the thickness of the concrete coating on the inner and outer surface of the building, the plating and the volumes being constructed of lines and nodes, the lines having nodes at each end, the nodes of the plating having nodes in common with the nodes of the volumes where the nodes of the plating and the volumes would otherwise be adjacent, correcting discrepancies in the volumes and the nodes, assigning the properties of the selected plastic foam to the discrete volumes, assigning the properties of the coating to the plating on the inner and outer surface of the building, and using the FEA program to run analyses of the effect of various loads on the building.

2. The method of claim 1 including the step of, running analyses of static loads to be designed for.

3. The method of claim 1 including the step of, running analyses of dynamic loads to be designed for.

4. The method of claim 1 including the step of, running analyses of the thermal loads to be designed for.

* * * * *